United States Patent [19]

Langdon, Jr. et al.

[11] Patent Number: 4,905,297

[45] Date of Patent: Feb. 27, 1990

[54] ARITHMETIC CODING ENCODER AND DECODER SYSTEM

[75] Inventors: Glen G. Langdon, Jr., San Jose, Calif.; Joan L. Mitchell, Ossining; William B. Pennebaker, Carmel, both of N.Y.; Jorma J. Rissanen, Los Gatos, Calif.

[73] Assignee: International Business Machines Corporation, Armonk, N.Y.

[21] Appl. No.: 274,711

[22] Filed: Nov. 18, 1988

[51] Int. Cl.⁴ .............................................. G06K 9/36
[52] U.S. Cl. ................................. 382/56; 358/261.2; 341/95
[58] Field of Search ............... 382/56; 358/260, 261.1, 358/261.2, 261.3, 261.4; 375/122; 340/347 DD

[56] References Cited

U.S. PATENT DOCUMENTS

| | | |
|---|---|---|
| 4,028,731 | 6/1977 | Arps et al. |
| 4,122,440 | 10/1978 | Landgon, Jr. et al. |
| 4,168,513 | 9/1979 | Hains et al. |
| 4,259,693 | 3/1981 | Aaron et al. |
| 4,285,049 | 8/1981 | Bird et al. |
| 4,286,256 | 8/1981 | Langdon, Jr. et al. |
| 4,295,125 | 10/1981 | Langdon, Jr. .............. 340/347 DD |
| 4,363,036 | 12/1982 | Subramaniam |
| 4,369,463 | 1/1983 | Anastassiou et al. |
| 4,386,373 | 5/1983 | Kondo et al. ................. 358/261 |
| 4,426,731 | 1/1984 | Edlund et al. |
| 4,435,726 | 3/1984 | Liao .......................... 358/260 |
| 4,462,081 | 7/1984 | Lehan |
| 4,463,342 | 7/1984 | Langdon, Jr. et al. |
| 4,467,317 | 8/1984 | Langdon, Jr. et al. ..... 340/347 DD |
| 4,488,143 | 12/1984 | Martin |
| 4,503,420 | 3/1985 | Rub et al. |
| 4,510,567 | 4/1985 | Chang et al. |
| 4,516,241 | 5/1985 | Farah et al. |
| 4,540,973 | 9/1985 | Grallert |
| 4,558,302 | 12/1985 | Welch |
| 4,577,314 | 3/1986 | Chu et al. |
| 4,584,561 | 4/1986 | Bernardson |
| 4,596,024 | 6/1986 | Thomson |
| 4,633,490 | 12/1986 | Goertzel et al. ............ 358/260 |
| 4,652,856 | 3/1987 | Mohiuddin et al. ........ 340/347 DD |

OTHER PUBLICATIONS

J. Rissanen, Combinatorial Coding, Conditional Entropy, and Distance For Sequences, RJ1538, Computer Science 2/75.

(List continued on next page.)

Primary Examiner—Leo H. Boudreau
Assistant Examiner—Joseph Mancuso
Attorney, Agent, or Firm—Thomas P. Dowd

[57] ABSTRACT

Apparatus and method for compressing and de-compressing binary decision data by arithmetic coding and decoding wherein the estimated probability Qe of the less probable of the two decision events, or outcomes, adapts as decisions are successively encoded. To facilitate coding computations, an augend value A for the current number line interval is held to approximate one by renormalizing A whenever it becomes less than a prescribed minimum AMIN. When A is renormalized, the value of Qe is up-dated. The renormalization of A and up-dating of Qe are preferably based on a single-bit test. Also, each Qe value is preferably specified as a 12-bit value having the least significant bit set to 1 and having no more than four other bits set to 1. The number of Qe values in the $\frac{1}{4}$ to $\frac{1}{2}$ probability range is enhanced to improve coding efficiency. A decision coding parameter of preferably six bits indicates the sense of the more probable symbol (MPS) in one bit and identifies a corresponding Qe value with the remaining five bits. In addition to probability adaptation, the present invention discloses an allocation of bits in a code stream register in which preferably two spacer bits are inserted between a next byte portion (which contains a byte of data en route to a buffer) and a fractional portion which may be involved in further computation. With the two spacer bits, any code greater than or equal to Hex 'C0' which follows a Hex 'FF' byte is illegal for data and therefore provides for an escape from the code stream. The two spacer bits also reduce the number of stuff bits inserted to account for carry or borrow propagation. Encoding and decoding can be performed interchangeably by hardware or software which feature differing coding conventions.

15 Claims, 40 Drawing Sheets

OTHER PUBLICATIONS

G. N. N. Martin, Range Encoding: An Algorithm For Removing Redundancy from a Digitised Message, 7 24–27, 1979, Video & Data Recording Conference.

J. Rissanen, Arithmetic Coding of Strings, Computer Science 6/75 RJ1591.

J. Rissanen, G. G. Langdon, Jr., Arithmetic Coding, RJ2174 1/30/78 Computer Science.

F. Barsi, P. Maestrini, Arithmetic Codes In Residue Number Systems, Digital Processes, 1978 pp. 121–135.

M. Boyarinov, G. A. Kibatyanskii, Iterative Arithmetic Independent-Error-Correcting Codes, Translated From Problemy Peredachi Informatsii, vol. 15, No. 1. pp. 38–49, Jan.–Mar. 1979.

J. Rissanen, G. G. Langdon, Jr., Arithmetic Coding, IBM Journal of Res. & Devel. vol. 23, No. 2, 3/79.

F. Rubin, Arithmetic Stream Coding Using Fixed Precision Registers, IEEE, vol. IT25, No. 6, 11/79.

G. G. Langdon, Jr., J. J. Rissanen, Method For Converting Counts to Coding Parameters, IBM TDB, vol. 22, No. 7, 12/79.

G. G. Langdon, Jr., J. J. Rissanen, Integer-Length Arithmetic Code For Conditional Binary Sources, IBM TDB, vol. 22, No. 10, 3/80.

G. G. Langdon, Jr., Method For Carry-Over Control in a FIFO Arithmetic Code String, IBM TDB, vol. 23, No. 1, 6/80.

D. G. Abraham, Parallel Compression By Table Look-Up, IBM TDB, vol. 23, No. 7A, 12/80.

D. R. Helman, G. G. Langdon, Jr. J. J. Rissanen, Arithmetic Compression Code Control Parameter Approximation, IBM TDB, vol. 23, No. 11, 4/81.

G. G. Langdon, Jr., Apparatus Supporting Half-Duplexed Encoding/Decoding Action, IBM TDB, vol. 23, No. 11, 4/81.

R. B. Arps, G. G. Langdon, Jr., LIFO Arithmetic Compression Coding Method For Conditional Sources, IBM TDB, vol. 23, No. 11, 4/81.

C. B. Jones, An Efficient Coding System for Long Source Sequences, IEEE, vol. IT27, No. 3, May 1981.

G. G. Langdon, Jr., Table-Driven Decoder Involving Prefix Codes, IBM TDB, vol. 23, No. 12, 5/81.

G. G. Langdon, Jr., J. Rissanen, Compression of Black-White Images with Arithmetic Coding, IEEE, vol. 29, No. 6, 6/81.

G. G. Langdon, Jr., J. J. Rissanen, Computational Speed Enhancement by Selective Precision in Arithmetic Code Operations, IBM TDB, vol. 24, No. 2, 7/81.

G. G. Langdon, Jr., Constrained Channel Coding Using a Reduced Number of Arithmetic String Coding Steps Per Cycle, IBM TDB, vol. 24, No. 8, Jan. 1982.

D. R. Helman, G. G. Langdon, Jr., N. Martin, S. J. P. Todd, Statistics Collection for Compression Coding With Randomizing Feature, IBM TDB, vol. 24, No. 10, 3/82.

G. G. Langdon, Jr., J. J. Rissanen, An Adaptive File Compression Algorithm, RJ3460, 4/23/82, Computer Science.

G. G. Langdon, Jr., S. J. P. Todd, General Unit-Time Arithmetic Codes for Constrained Channels, IBM TDB, vol. 25, No. 3A, 8/82.

G. G. Langdon, Jr., S. J. P. Todd, Augend Computation for Arithmetic Channel Codes, IBM TDB, vol. 25, No. 3A, 8/82.

G. G. Langdon, Jr., S. J. P. Todd, Method for Application of ECC to Constrained Channels, IBM TDB, vol. 25, No. 3A, 8/82.

R. B. Arps, J. M. Cheng, G. G. Langdon, Jr., Control Character Insertion Into Arithmetically Encoded Strings, IBM TDB, vol. 25, No. 4, 9/82.

G. G. Langdon, Jr., J. Rissanen, A Simple General Binary Source Code, IEEE, vol. IT28, No. 5, 9/1982.

G. N. N. Martin, G. G. Langdon, Jr., S. J. P. Todd, Arithmetic Codes for Constrained Channels, IBM J. Res. Devel., vol. 27, No. 2, 3/83.

S. J. P. Todd, G. G. Langdon, Jr., G. N. N. Martin, A General Fixed Rate Arithmetic Coding Method for Constrained Channels, IBM J. Res. Devel., vol. 27, No. 2, 3/83.

G. G. Langdon, Jr., A Note on the Ziv-Lempel Model for Compressing Individual Sequences, IEEE, vol. 29, No. 2, 3/83.

G. G. Langdon, P. H. Siegel, S. Todd, Constrained Channel Coding With Spectral Null, IBM TDB, vol. 26, No. 5, 10/83.

G. Langdon, Jr., Adaptive Run-Length Coding Algorithm, IBM TDB, vol. 26, No. 7B, 12/83.

G. G. Langdon, Jr., An Introduction to Arithmetic Coding, IBM J. Res. Devel., vol. 28, No. 2, 3/84.

(List continued on next page.)

OTHER PUBLICATIONS

P. K. Chakraborty, J. C. Biswas, Definition of Unspecified Flag Bits of the Z80 Microprocessor, J. Microprocessor and Microsystems, vol. 9, Issue 1.

D. Mahlab, Compression of Data Compression Algorithms, IEEE, Mar. 26–28, 1985, Tel Aviv, Israel.

S. Todd, G. G. Langdon, Jr., J. Rissanen, Parameter Reduction and Context Selection for Compression of Gray-scale Images, IBM J. Res. Dev., 29, 2, 3/83.

T. R. Rao, K. Vathanvit, A Class of A(N+C) Codes and Its Properties, Proceedings of 7th Symposium on Computer Arithmetic, IEEE, 1985.

R. Shimada, Y. Ohkura, J. Aoe, Nonbinary Arithmetic AN Codes Using Odd Radix Expressions, IEEE, vol. C-34, No. 11, Nov. 1985.

H. Morita, K. Fujimoto, S. Kitada, S. Arimoto, On Efficiency of Binary Arithmetic Codes, Trans Inf. Process. Soc. Jpn., vol. 25, No. 4, 1984.

G. G. Langdon, Jr., J. J. Rissanen–"Method of Converting Counts to Coding Parameters", Dec. 1979, pp. 2880–2882.

D. R. Helman, G. G. Langdon, Jr., J. J. Rissanen, "Arithmetic Compression Code Control Parameter Approximation", Apr. 1981, pp. 5112–5114.

G. G. Langdon, Jr., J. Rissanen–"Compression of Black–White Images with Arithmetic Coding", Jun. 1981, IEEE, pp. 858–867.

G. G. Langdon, Jr.,–"An Introduction to Arithmetic Coding", Mar. 1984, pp. 135–149.

HARDWARE (-H) ENCODER/DECODER

SOFTWARE (-S) ENCODER/DECODER

FIG.5 ffffffc/f, bbbbbbbb, ss.xxxxxx xxxxxx00

FIG.6

00.xxxxxx xxxxxxmm, nnnnnnnn, ffffffff
31 – 16          15 – 8         7 – 0 (FULL WORD)
xc            ,     xnew    (HALF WORDS)
                   ,xflag (BYTE)

FIG. 9
| FIG. 9.1 | FIG. 9.2 | FIG. 9.3 |
|---|---|---|
| FIG. 9.4 | FIG. 9.5 | FIG. 9.6 |
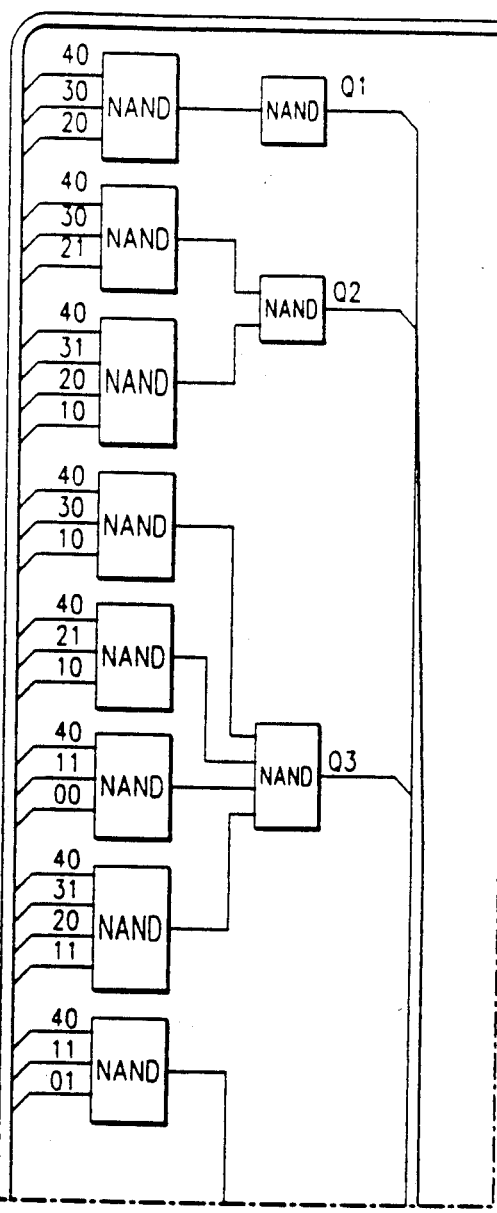
FIG. 9.1
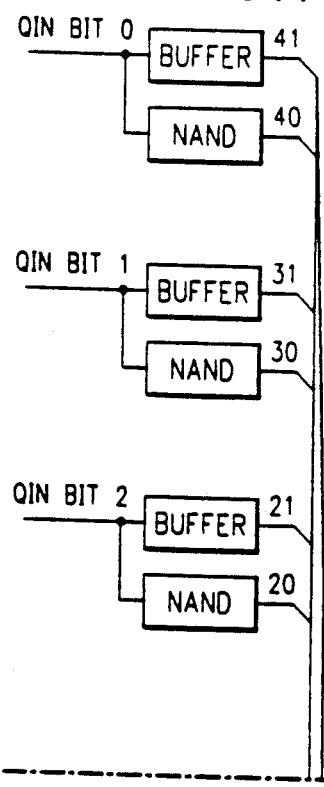

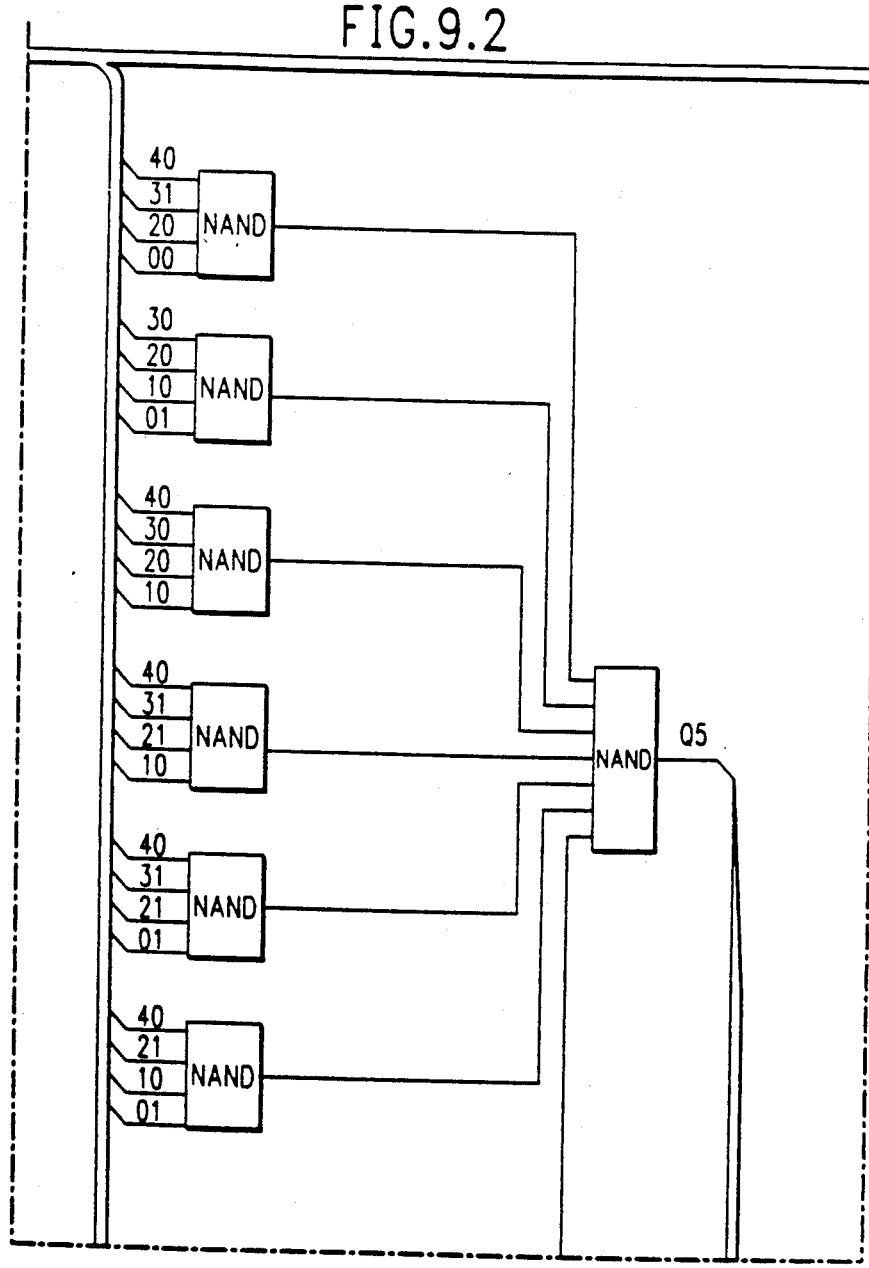
FIG.9.2

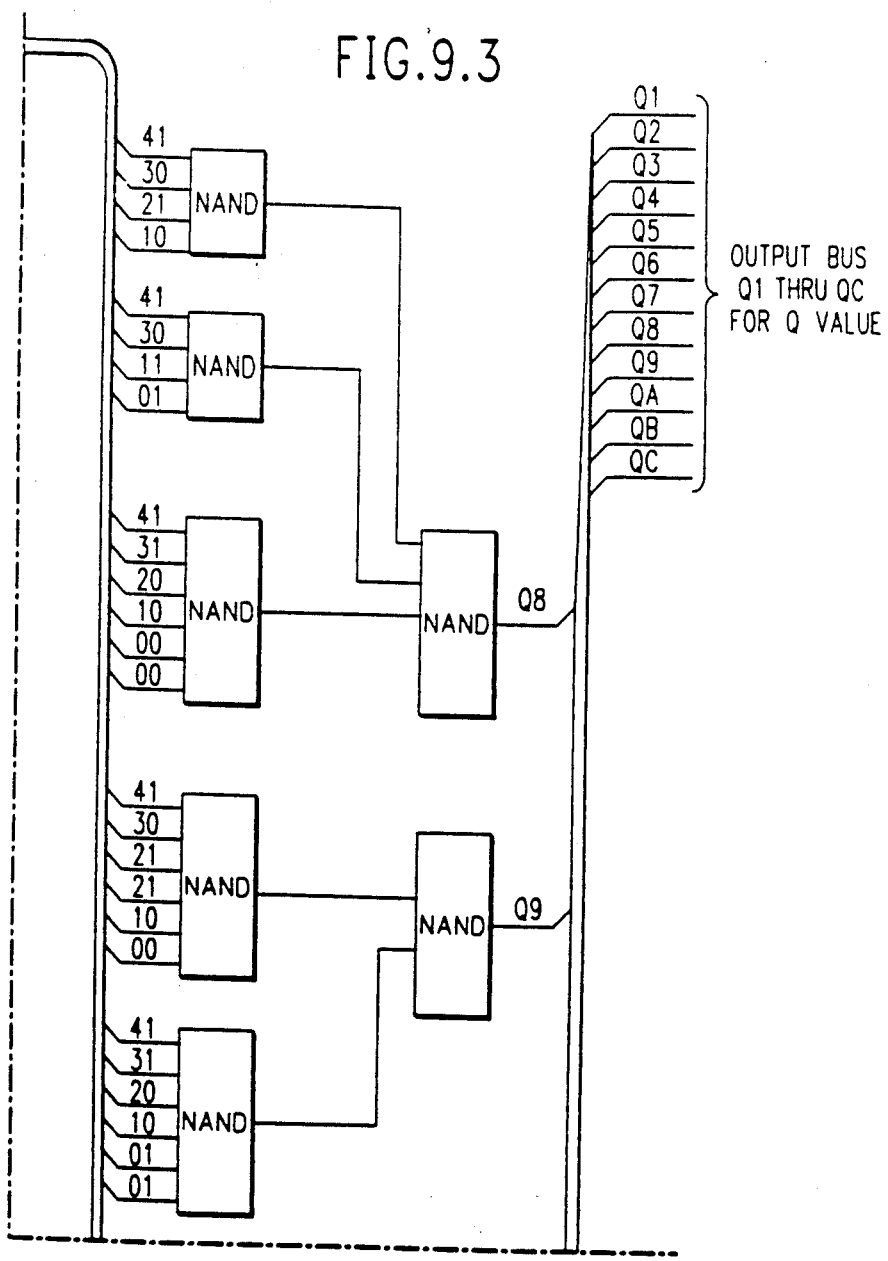
FIG.9.3

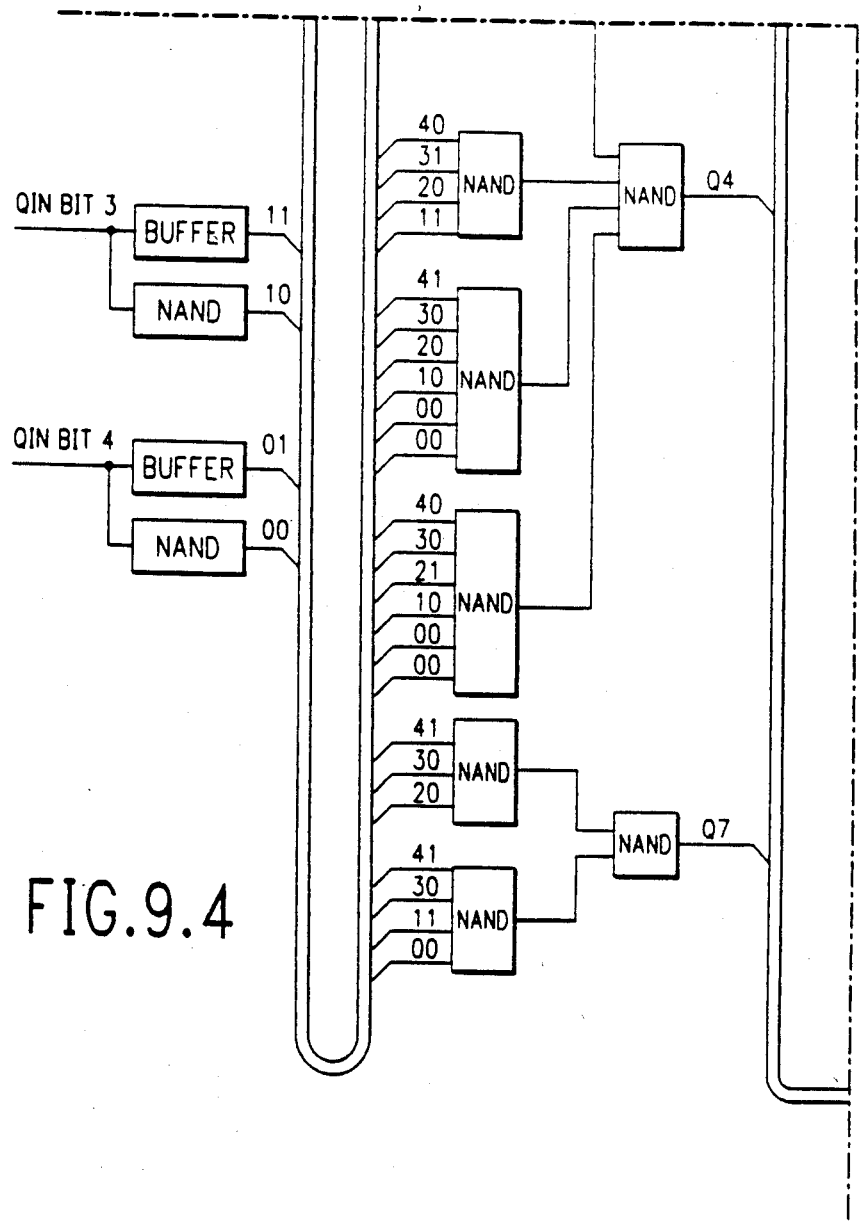
FIG. 9.4

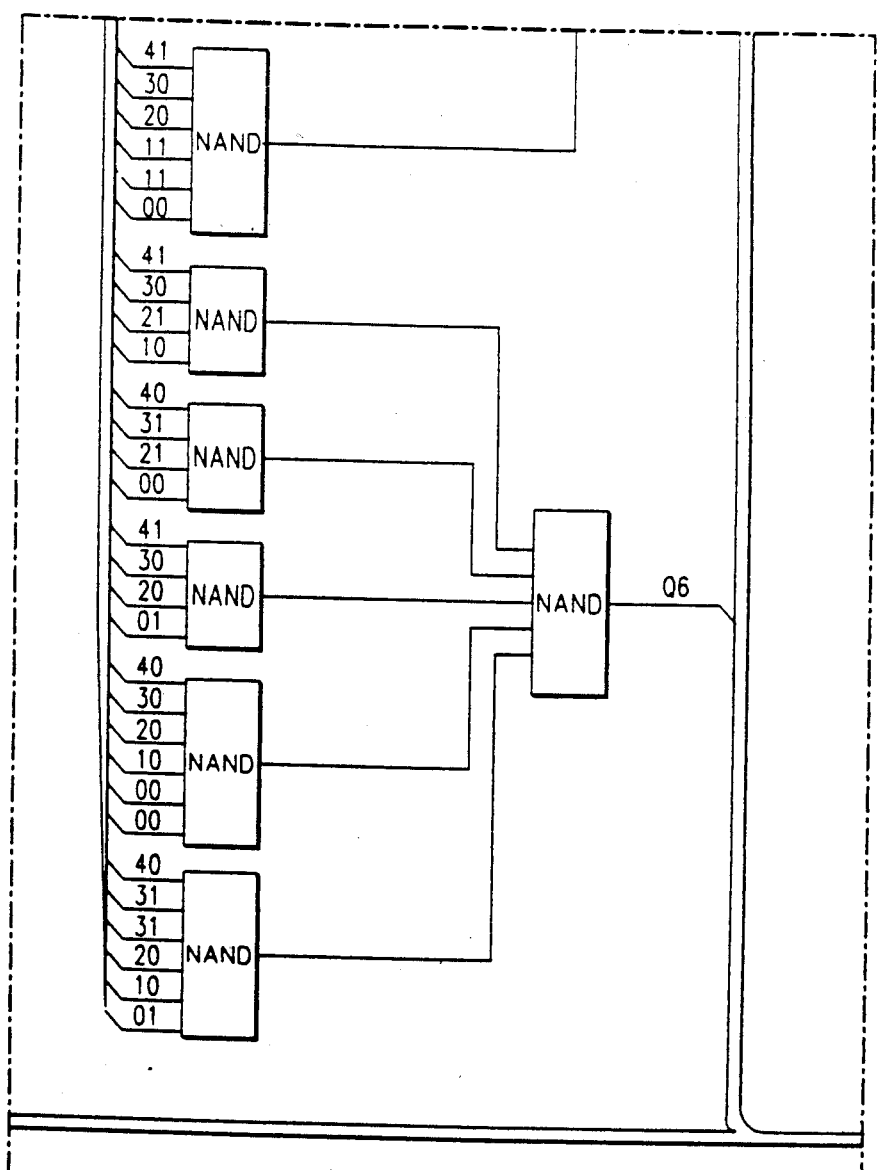
FIG.9.5

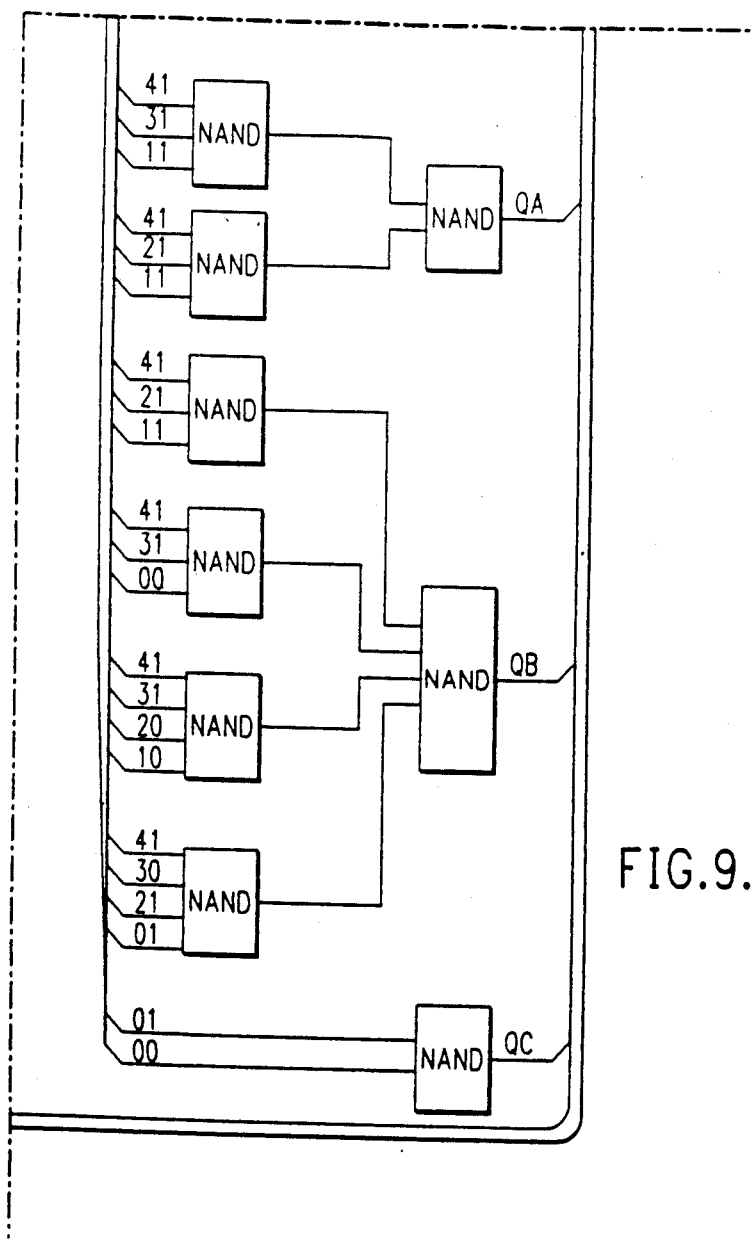
FIG.9.6

| CONTEXT | MPS | QE INDEX | QE VALUE |
|---------|-----|----------|----------|
| C0      | 0   | 0        | 0.5      |
| C1      | 1   | 12       | 0.10     |
| C2      | 0   | 29       | 0.001    |

```
C0    C1    C0    C0    C2
 ↓     ↓     ↓     ↓     ↓
 0     1     1     0     0
 ↓     ↓     ↓     ↓     ↓
MPS   MPS   LPS   MPS   MPS
```

* MPS exchange

FIG. 50 Block Diagram of Q-Coder

Encoder Unit

FIG.52 A-Logic

FIG.53 Encoder C-Logic

Block Diagram of Q-Decoder

Decoder Unit

Decoder CD-Logic

ARITHMETIC CODING ENCODER AND DECODER SYSTEM

BACKGROUND OF THE INVENTION

I. Field of the Invention

The present invention relates to compressing incoming data by arithmetic coding encoding and retrieving the original data by arithmetic coding decoding.

II. Description of the Problem

In order to achieve a desired rate of data transfer or to store data in a limited memory space, it is often necessary or desirable to compress data into fewer bits. Some time after the data is compressed, the original data is to be retrieved—the latter step being referred to as de-compressing the data.

One application of data compression/de-compression involves optical imaging. In optical imaging, there are typically numerous pieces of information—such as darkness or shade of picture elements (pels)—which must be transferred at high rates or which must be stored for future use.

Arithmetic coding is one technique for achieving data compression and de-compression. In arithmetic coding, one decision after another is encoded to define successively smaller, lesser-included intervals along a number line. Arithmetic coding is described in various articles written by the present inventors: "An Introduction to Arithmetic Coding", by G. G. Langdon, Jr. *IBM Journal of Research and Development*, vol. 28, n. 2, March 1984, 135-149; and "Arithmetic Compression Code Control Parameters Approximation" (by D. R. Helman, G. G. Langdon, Jr., and J. J. Rissanen), in volume 23, No. 11, April 1981, pp. 5112-5114. The cited references are incorporated herein by reference to provide background.

As noted in the above articles, arithmetic coding provides that each decision has a plurality of possible exclusive outcomes (or events). Each outcome or event is represented in data by a symbol. In the optical imaging environment, for example, each decision may correspond to whether or not a given pel is black—the decision outcome being represented by a Y (or YES) symbol if the pel is black or an N (or NO) symbol if the pel is not black. A plurality of decisions may then be represented by a sequence of symbols, e.g. YNYYN . . .

In accordance with prior arithmetic coding teachings, a probability line has a current interval defined therealong. The first current interval is 0 to 1. The current interval is divided into segments in which each segment corresponds to one possible outcome for the next decision. Where there are only two possible outcomes for each decision, the current interval is divided into two segments. The length of each segment is based on its respective associated probability. The respective probabilities may remain fixed or may adapt as decision data is entered.

It is the correlating of larger segments to symbols which occur with greater frequency which leads to the compression effect. In the former cited article ("An Introduction to Arithmetic Encoding"), a 4-symbol arithmetic coding example is set forth in which each decision can result in an "a" event (having a 50% probability), a "b" event (having a 25% probability), a "c" event (having a 12.5% probability), or a "d" event (having a 12.5% probability). Representing the four events in binary form would require two bits for each decision where the events would be represented respectively by 00, 01, 10, and 11. For three decisions, such as aab which is highly likely, the straightforward uncoded data would be 00 00 01; requiring six bits. However, as observed in the article at page 137, the arithmetic coding approach permits the sequence aab to be represented by the value 0.001. Instead of six bits, the information can be represented in three bits. This conservation of bits results as successive events having relatively high associated probabilities occur.

The conservation deteriorates if numerous events occur for which there are low probabilities and relatively short line segments. With the above-noted probabilities, a sequence of events dd would be represented with uncoded data as 11 11 whereas, by arithmetic coding, the dd events would be represented by 111111. Provided that the larger segments in fact correspond to events which occur with correspondingly greater frequency, the additional bits needed for less probable symbols are outweighed by the conservation achieved when more probable symbols occur.

Hence, it is important to ensure that the associated probability (and segment length corresponding thereto) reasonably track the actual probabilities of the respective events.

Various techniques have been proposed for estimating event probabilities as more decision data history is gathered. In an article entitled "Method for Converting Counts to Coding Parameters" (by G. G. Langdon, Jr. and J. J. Rissanen), IBM Technical Disclosure Bulletin in volume 22, No. 7, December 1979, pp. 2880-2882, counters are used to detect changes in the symbol probabilities from observed symbol occurrences, and to modify the probability q of a less probable symbol (LPS). In particular, q is changed to reflect the number of counts of one symbol divided by the total number of symbols counted during a symbol string. That is, if k is the counts for one symbol and n is the number of counts for both symbols, symbol probability is changed based on k/n.

Another article by Langdon and Rissanen, "Compression of Black-White Images with Arithmetic Coding", IEEE Transactions on Communications, volume COM-29, No. 6, pp. 858-867, June 1981, also discusses adapting probabilities in an arithmetic coding environment. In discussing adaptation to nonstationary statistics, the IEEE article proceeds on page 865 as follows: "Suppose that we have received r [consecutive] 0's at state z, and our current estimate of the probability of [symbol] s(i) being 0 is $p = c0/c$ [where c0 is a count defined as $c(0|z,s(0) \ldots s(t))$ and c is a count defined as $c(z,s(0) \ldots s(t))$]. We receive the symbol s(i). If s(i) is 0, we test: Is $p'(r+1) \geq 0.2$? If yes, we regard the observation as being . . . consistent with our estimate of p, and we update c0 and c by 1 to form a new estimate . . . If, however, $p'(r+1) < 0.2$, the observation is likely an indication of changed statistics, and we ought to be prepared to change our estimates to a larger value of p. We do this by halving the counts c0 and c before updating them by 1. If the received symbol s(i) is 1, we do the same confidence test using the probability $p(r) \ldots$ In reality, for the sake of easier implementation, we put suitable upper and lower bounds on the count of the less probable symbol for each skew value Q [Q(s)] to indicate when to halve or not the counts." In describing the Q(s) value, it is noted that the IEEE article discusses the approximating of the less probable symbol probability to the nearest value of $2^{-Q(s)}$ where Q(s) is an integer referred to as the "skew number".

A particular approach to probability adaptation is included in a co-pending patent application entitled "Probability Adaptation for Arithmetic Coders", invented by W. B. Pennebaker and J. L. Mitchell, U.S. Ser. No. 06/805,163, filed on Dec. 4, 1985 which is incorporated herein by reference. Another probability estimator is also set forth in a patent of G. Goertzel and J. L. Mitchell entitled "Symmetrical Adaptive Data Compression/Decompression System", U.S. Pat. No. 4,633,490.

A general novel approach to adapting a probability estimator is also set forth in a co-pending application of W. B. Pennebaker and J. L. Mitchell filed on even date herewith and entitled "Probability Estimation Based on Decision History". which is incorporated herein by reference to the extent required to set forth the environment of the present invention. In the co-pending application, a plurality of possible probability values Qe for an event are prescribed—as in a table. Based on the invention disclosed in the co-pending application, an augend value A is defined and, with each decision, the augend value is reduced. The amount by which the augend value is reduced is event dependent. That is, in a binary application in which each decision may result in a less probable symbol (LPS) having a current estimated probability Qe being entered or a more probable symbol (MPS) being entered, the entering of an LPS results in the augend value being reduced to the current Qe value; whereas the entering of an MPS results in the augend value A being computed as A−Qe. If the up-dated value of A is less than a pre-defined minimum AMIN (which is greater than highest value of Qe), the up-dated value is renormalized (preferably by doubling) until A again is at least AMIN. A fundamental concept of the invention in the co-pending application is that the value of Qe is up-dated each time A is renormalized. If renormalization follows an LPS event, the Qe value (representing the estimated probability of the LPS event) is increased. If renormalization follows an MPS event, the Qe value diminishes. By linking Qe changes to augend value renormalization, the time for Qe change is readily determined without the need for counters and, contrary to prior techniques, provides close tracking of actual Qe probability over the range of Qe values.

In addition, the novel approach in the co-pending application has recognized that, at certain values of Qe, the up-dating procedure could be trapped at certain "bad" values. By way of example, values which—when doubled one or more times-are equal or nearly equal to AMIN can result in the following troublesome sequence. A is set equal to Qe(bad) after an LPS event; the up-dated A is doubled (and redoubled as required) until A is no longer less than AMIN and a higher Qe value is selected; because the up-dated A is equal or nearly equal to AMIN, a single MPS event results in A falling below AMIN thereby requiring a renormalization and a reduction in the Qe value to Qe(bad); if the LPS probability is actually much greater than the estimated Qe value, an LPS event may likely occur again thereby returning Qe to the higher value; again a single MPS event will cause a renormalization and a movement of the Qe value back to the Qe(bad) value; and so on. According to the teachings of the co-pending application, the "trapping" problem is addressed by disallowing the "bad" values. A shortcoming of that solution, however, is that certain values which are "bad" from a "trapping" standpoint are good values from an overall efficiency standpoint.

In addition to adapting probabilities based on an up-dated decision history, the implementation of arithmetic coding involves other problematic issues—such as "carry propagation" and "borrow propagation". The "carry propagation" problem is noted with reference to a first type of arithmetic coding encoder which up-dates a code stream C with successive decision inputs in accordance with the following conventions: (1) if the symbol being encoded is an LPS, C remains the same in value and the current interval becomes A(new)=Qe, and (2) if the symbol being encoded is an MPS, C is up-dated to C+Qe and the current interval becomes A(new)=A(previous)−Qe. As the interval A becomes smaller and such smaller intervals are added to C, the precision of C (i.e., the length of the code stream) increases. The precision may extend without any fixed limit as long as decision data is entered for encoding. Because C can be of indeterminate length (and precision) but only limited memory is available for containing code stream information, there may be a problem if a carry occurs. In particular, if the code stream value is a sequence of several hundred 1's but only the most recent bits of C are contained in a shift register, a problem results if some A is to be added to C. The carry will not be able to propagate through the several hundred 1 bits because only the most recent bits are accessible. One solution to carry propagation is referred to as bit-stuffing and has been outlined in the literature. The bit-stuffing of the prior technology suggests the insertion of at least one carry-receiving bit after a prescribed number of 1 bits in a row.

In an arithmetic coding encoder set forth in a co-pending patent application filed on even date herewith, entitled "Arithmetic Coding Data Compression/Decompression By Selectively Employed, Diverse Arithmetic Encoders and Decoders," invented by J. L. Mitchell and W. B. Pennebaker, an "optimum" software encoder is described in which the code point remains fixed in value or decrements with each encoded decision. Accordingly, when the code stream $C_s$ includes a string of 0 bits and a subtraction is required, a borrow may propagate beyond the length of a shift register which contains the most recent portion of the code stream. Such "borrow propagation" is accounted for in the above-identified co-pending application by converting some or all Hex '00' bytes in the encoded code stream to Hex 'FF' with a carry bit. In this way, the borrow propagation becomes a carry propagation situation. Accounting for carry and borrow without sacrificing coding efficiency and requiring numerous additional bits is a desired end.

As a further aspect of arithmetic encoding, it is desirable to enter control words in the code stream. That is, it is desirable to enable an external controller to break into the code stream and insert a control word. At the decoder end, another controller should be able to detect and strip the control word from the received string of data. With regard to control word insertion, it is desirable to (a) provide for a large number of possible control words and (b) identify the presence of a control word without substantially reducing coding efficiency. In the aforementioned patent application relating to arithmetic coding data compression/decompression, a thirty-two bit register is provided for containing portions of the code stream en route to a buffer. The least significant twelve bits (0 through 11) represents a "fractional" portion of the code stream which is aligned with the current value of A. Bit 12 corresponds to a spacer bit. Bits 13 through 20 represent an 8-bit byte of code stream data that is next to be shipped to the buffer. Bit 21 is a carry receiver bit. Of the two bits which precede bit 21, bit 22 is used for identifying whether a control word is inserted. Bits 31 through 24 provide a flag bit which shifts left as data bits enter at bit 0. (After eight shifts, the flag bit is at a bit position which indicates that a byte of data is ready to be shipped to the buffer.) With the single spacer bit, two stuffed bits may be required under certain conditions.

SUMMARY OF INVENTION

In accordance with the present invention, an arithmetic coding encoder and decoder features probability adaptation as set forth in the aforementioned co-pending patent application, "Probability Estimation Based on Decision History", especially where the probability adaptation is enhanced by selecting possible Qe values which improve encoder and decoder performance.

In this regard, it is noted that the present invention relates to a binary arithmetic coder which has a probability estimator integrated into the arithmetic coding process. That is, the augend value in the present invention corresponds to the current interval along the number line and the value of Qe is up-dated in response to a renormalization of A, i.e. the value of the current interval. In determining when the augend value (i.e., current interval value) A has fallen below a minimum AMIN and hence an up-date of Qe is required, the present invention represents AMIN by a value which includes a first set bit followed by unset bits. For example, AMIN may be represented by Hex '1000', or 1 0000 0000 0000 (in binary). In this way, renormalization and Qe up-dating are indicated when the leading bit changes to 0—the renormalization test thus being a single-bit test. The invention thus achieves the object of providing a simple test for determining when Qe should be changed as well as when renormalization is required. It is noted that U.S. Pat. No. 4,467,317 suggests a one-bit test for augend renormalization; however the integration of probability adaptation and a single-bit test for renormalization results in notable benefits over the earlier teachings.

Moreover, the present invention enhances the probability adaptation approach disclosed in the above-cited co-pending patent application in several ways. First, the Qe values are included in a table wherein the table has the following characteristics:

1. each entry in the Qe table has a 6-bit coding parameter in which one bit indicates the sense of the MPS value and 5 bits Q-index which identifies a corresponding Qe value; and
2. for each entry, the Qe value is preferably 12 bits in length with no more than 5 bits of any Qe value being set, the least significant bit of each Qe value always being set (which facilitates hardware implementation). The selection of which bits are set for the various Qe values is, in part, determined to limit the number of gates that must be traversed as one derives a Qe value from the Q-index thereof.

The use of a six-bit coding parameter is significant in that it conforms to existing macros and predefined hardware cells. Moreover, if less bits were used for the coding parameter, table granularity would become too coarse and results for stationary statistics would degrade. With more than six bits, additional chip area would be required and expense would increase. By properly selecting Qe values, the number of Qe entries required is held to a relatively low number (e.g., thirty) while achieving coding efficiency and fairly simple implementation.

Furthermore, in order to avoid the problem of "trapping" the Qe value, the present invention provides the following enhancement. As in the aforementioned co-pending patent application relating to probability estimation, some "bad" Qe values of the form $AMIN/2^n$ are disallowed. However, for "bad" Qe values which—except for promoting "trapping"—contribute to performance, the invention permits inclusion in the table. To avoid the "trapping" effect for such retained "bad" values, the invention provides that—in response to an LPS renormalization at a "bad" Qe value—the Qe value is incremented to a prescribed table value which requires more than one MPS renormalization to return to the bad Qe value. The present invention thus achieves the object of retaining Qe values which would otherwise result in "trapping".

Furthermore, to facilitate the software implementation of an encoder and decoder according to the present invention, a negative Qe representation indicates when the sense of MPS is 1; a positive Qe representation indicating when MPS=0. In particular, with this approach, a sign bit need not be masked and processing cycles are saved.

A further object of the invention is to improve the allocation of bits in a shift register which contains code stream data en route to a buffer memory. In this regard, more than one spacer bit is provided to separate the fractional portion of the code stream from the "byte" to be shipped. By including more than one spacer bit, the possibility of a Hex 'FF' sequence following another Hex 'FF' sequence is obviated. Moreover, with multiple spacer bits, a single stuffed bit can serve to either receive a carry or to provide escape codes for control words. According to one embodiment of the invention, an X shift register containing code stream data initially allocates its bits as follows:

X=0000000f 00000000 ss.xxxxxx xxxxxx00

When a byte is ready to be shipped to the buffer, the X register is configured as follows:

X=f←0000000c bbbbbbbb ss.xxxxxx xxxxxx00

By using two spacer bits (illustrated as "ss") rather than one, any possible need for more than one stuffed bit is eliminated. Accordingly, the use of two spacer bits enhances coding efficiency by eliminating the possible need for an extra bit to be transmitted. Moreover, the present invention achieves the additional object of providing an efficient escape in which a control word may be inserted, by an external controller, into the code stream before encoding and transmission, and may be withdrawn from the transmitted stream before decoding.

The present invention further provides that the first two bits of a code stream are 00. This achieves the object of facilitating decoding.

Finally, the present invention features the above objects in an arithmetic coding system in which encoding and/or decoding may be performed interchangeably with either hardware or software which follow differing conventions.

BRIEF DESCRIPTION OF THE DRAWINGS

FIG. 5 is an illustration depicting the allocation of bit positions in a 32-bit code Register (X Register) used in encoding a compressed data stream.

FIG. 6 is an illustration depicting the allocation of bit positions in a 32-bit Register used in decoding a compressed data stream.

FIG. 9 (depicted as parts 9.1 through 9.6) is an illustration of a gating circuit used in deriving a Qe value output from a q-index which is input.

DESCRIPTION OF THE INVENTION

I. Generating Identical and Compatible Code Streams with Encoders Having Differing Encoding Conventions Referring to FIG. 1, a general apparatus 100 for compressing and de-compressing data is shown including an arithmetic encoder 102 and a corresponding arithmetic decoder 104. In compressing data, the apparatus 100 takes incoming data (DATAIN) which may be expressed as a series of binary decisions BITIN (YN)—wherein each outcome or event has a respective probability—and characterizes the series by an encoded sequence of bits. By encoding the series of decisions with probability information imbedded therein, the compressed sequence of bits may be transferred more quickly than the original incoming data. Moreover, the compressed data may be stored in less space than the original information being transferred.

In applications where large portions of data are to be transferred by some transfer device or medium (e.g., element 105) at high rates or where large portions of data are to be stored in limited memory (or where large portions of data are to be stored and thereafter transferred at a low baud rate), the use of compressed data is of tremendous value. One particular environment in which such compression is of notable value is in the field of video data processing and, more particularly, in teleconferencing. In teleconferencing, vast amounts of information must be rapidly communicated from one location to another to convey picture and other information.

After encoded data is transferred to its desired destination, it is de-compressed. That is, the original data or some related representation thereof is retrieved by means of the decoder 104. The decoder 104, in effect, undoes the procedure of the encoder 102 by examining an encoded code stream one byte at a time.

Figure 1:
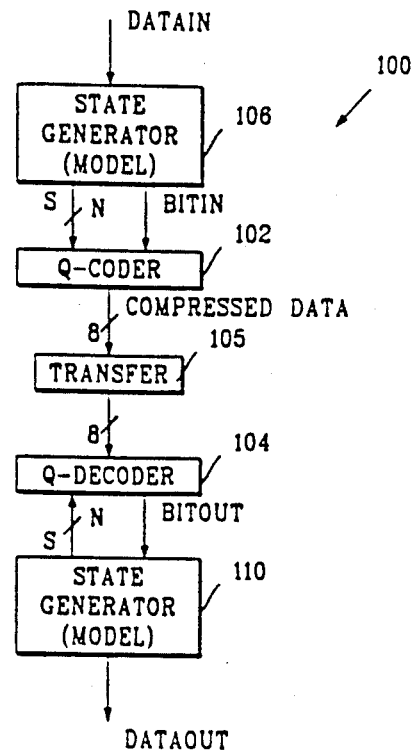
FIG. 1 is a block diagram showing a general arithmetic coding system including a Q-Coder and Q-Decoder of the present invention.

In FIG. 1, the incoming data DATAIN is initially processed by a model 106. Various types of models are discussed in the prior technology. The model generates a context state S and a binary decision BITIN for the Q-Coder 102 to encode. From past BITIN decisions for the particular context state S, the Q-Coder has already generated an estimate of the probability of the BITIN decision being 1 or 0; that estimate is used in coding BITIN. For example, in facsimile, pieces of incoming data may correspond to whether a given pixel is black or not-black. An estimate of whether a given pixel is expected to be black or white can generally be obtained from the neighboring pixel values which have already been encoded. These neighboring pixel values are used to construct the state S. The Q-Coder and Q-Decoder make estimates of the probability of the given pixel being black or not-black, based on prior pixel values for the same neighborhood pixel values. As successive pieces of data are processed, the relative probabilities between the more probable condition (labelled the "MPS" or non-Qe event) and the less likely condition (labelled the "LPS" or Qe event) may change in value or even switch for any given context state. That is, if the more probable condition is black and numerous instances of not-black occur, the not-black condition may become more probable. The MPS would then change from the black condition to the not-black condition.

Figure 2:
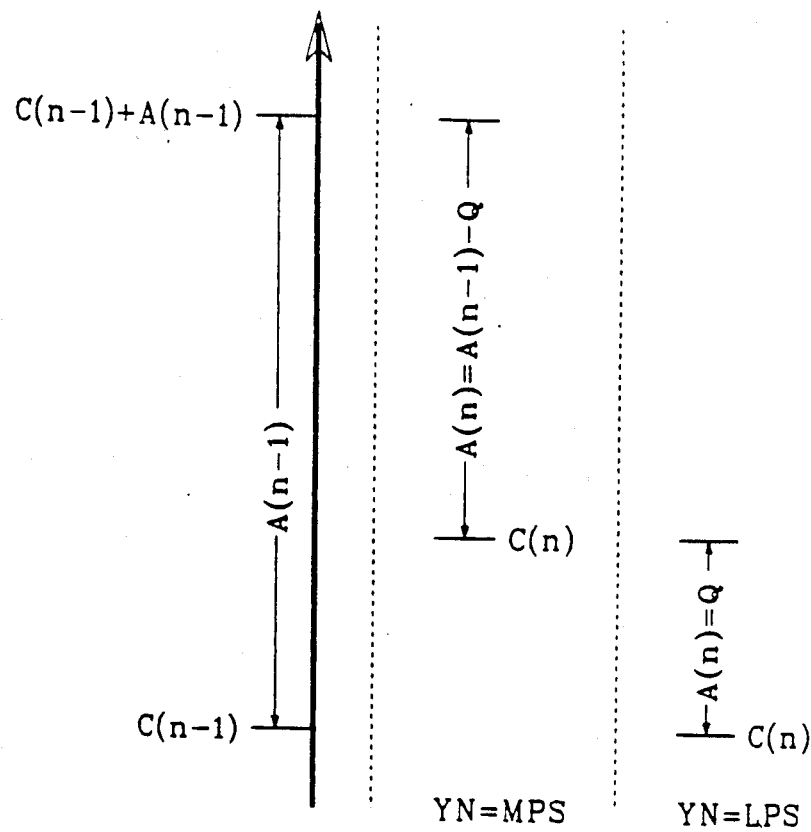
FIG. 2 is an illustration of a probability number line with an interval divided into two segments, according to a preferable hardware encoding and decoding embodiment.
Figure 3:
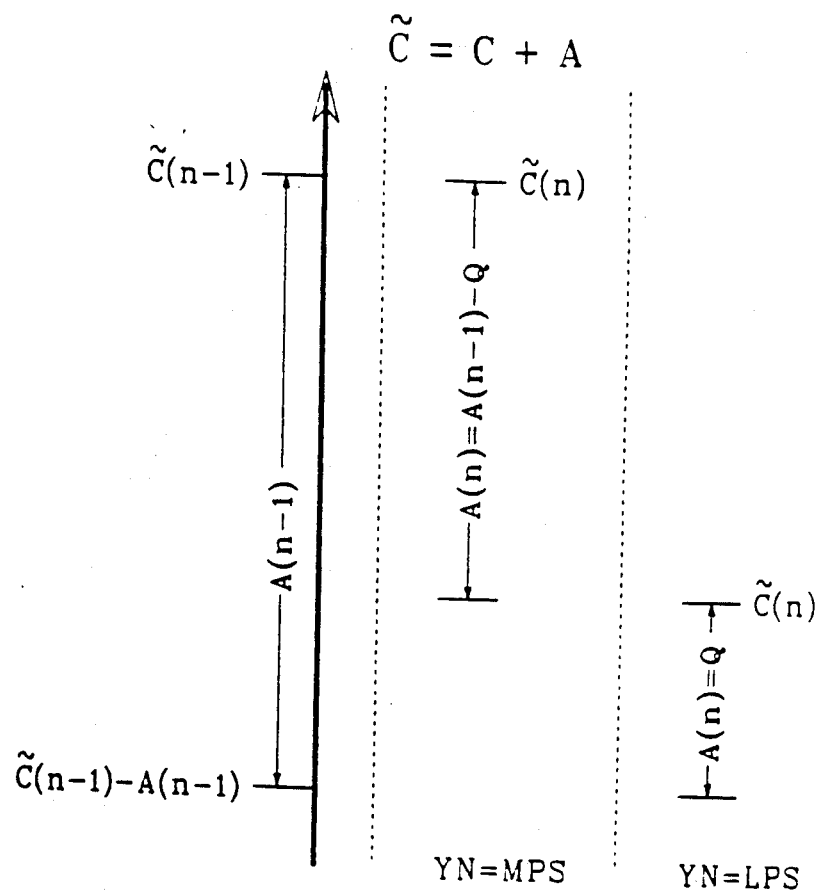
FIG. 3 is an illustration of a probability number line with an interval divided into two segments, according to a preferable software encoding and decoding embodiment.

The Q-coder 102 converts the state S and BITIN information from the model 106 into compressed data by means of arithmetic coding. In the arithmetic coding an estimate of the probability is used that the Q-Coder has already generated and stored in a suitable form following past BITIN decisions for the state S. FIG. 2 and FIG. 3 each represent an encoding scheme. FIG. 2 represents an optional hardware encoder. FIG. 3 represents an optional software encoder.

In FIG. 2, the code point is initially positioned at the "lower" (in value) boundary of a given interval. The Q segment associated with the occurrence of an LPS event is also at the lower end of the interval. The P segment associated with an MPS event is at the upper end of the interval. C(n) corresponds to a code stream value at a time n. A(n) corresponds to the value of the current interval at time n. For each decision, an optimal hardware encoder—illustrated in FIG. 2—follows the conventions:

When the decision event (illustrated in the figures as YN) is an MPS event—

(a) $C(n) \leftarrow C(n-1) + Q$ (b) $A(n) \leftarrow [A(n-1) - Q]$

When the event is an LPS event—

(a) $C(n) \leftarrow C(n-1)$ (b) $A(n) \leftarrow Q$

Whether there is an MPS event or an LPS event, the hardware spends a processing cycle re-specifying the value of A, the interval (or range). Moreover, when there is an MPS, the code point is incremented (i.e., moved) by the value of Q. Because the hardware can process the up-dating of A and C in parallel, such hardware need expend only one processing cycle for any decision. On the other hand, if the hardware were configured to move the code point on each LPS event, two processing cycles—in determining $C \leftarrow C + (A - Q)$—would be required each time the code point was to be moved. In that limiting the number of processing cycles is critical in hardware operation and in that code point movement on LPS events results in the use of more cycle times, code point movement on MPS events has been found optimal for hardware.

The encoding process of FIG. 3 represents a preferred "software" scheme with the same ordering of the P and Q segments as in FIG. 2. The code point, however, moves downward (i.e., to a lesser value) in response to an LPS event. The code stream is represented by $\bar{C}$ in this scheme. $C(n) + A(n)$ is the same as $\bar{C}(n)$.

A single decoder can decode $C(n)$ or $\bar{C}(n)$ to retrieve the same set of input decision events, provided that some portion of the final interval is subtracted from Ci. That is, given a first input to a decoder (see decoder 104 of FIG. 1) indicating which condition corresponds to an MPS event and a second input indicating the current value of Q for the piece of the code stream being decoded, the decoder can process $C(n)$ or $\bar{C}(n)$ minus some portion of the final interval to produce a sequence of YN outputs which correspond to the sequence of YN inputs to the encoder 102. The YN decisions enter a model 110—which matches the model 106—and provides the original data or a replica thereof as a DATA-OUT output.

In that the scheme of FIG. 3 provides for code point movement on an LPS event, the number of cycles required for software processing is kept low.

Figure 4:
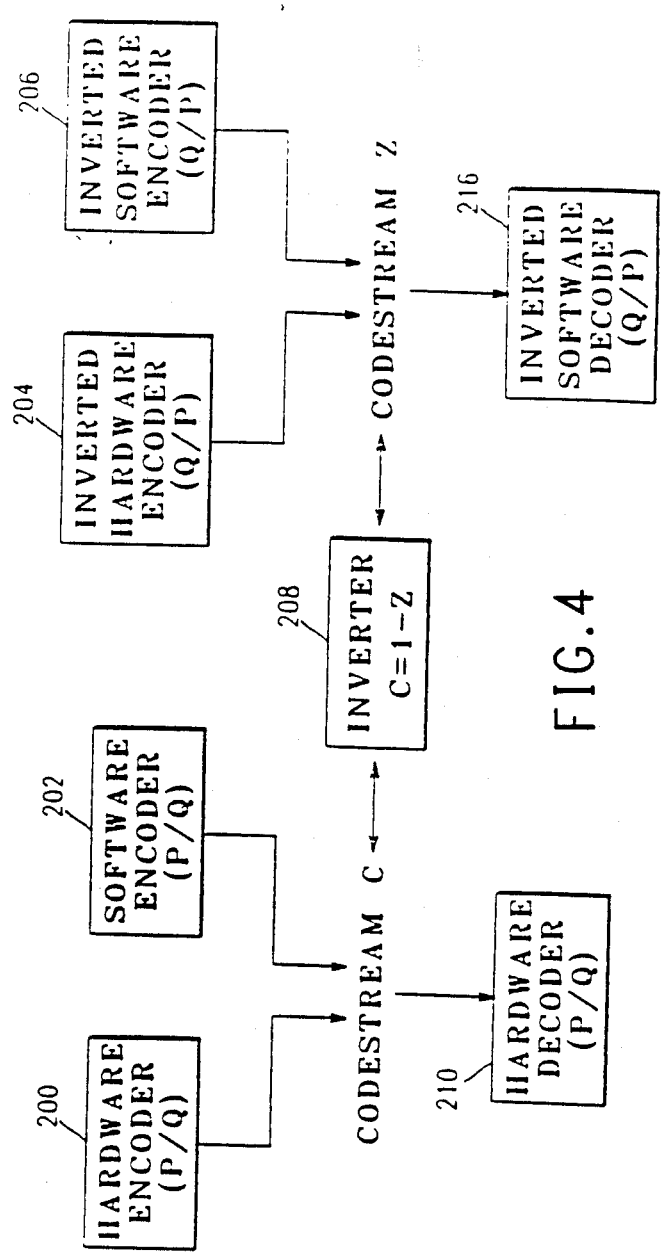
FIG. 4 is a diagram illustrating a plurality of diverse encoders any of which which can be used interchangeably with any of a plurality of decoders.

Referring to FIG. 4, four encoders 200 through 206 are shown. Encoders 200 and 204 encode according to the optimal hardware rule that the code point moves on each MPS event, the former being implemented with P/Q symbol ordering and the latter being implemented with Q/P (inverted) symbol ordering. Encoders 202 and 206 encode according to the optimal software rule that the code point moves on each LPS event, the former being implemented with P/Q symbol ordering and the latter being implemented with Q/P (inverted) symbol ordering. The code streams generated by the encoders 200 and 202 can be made the same (or at least compatible) and are represented as C. The code streams generated by the encoders 204 and 206 can be made the same (or at least compatible) and are represented as Z. Z and C can be derived from each other in accordance with the expression: $C = A(0) - Z$, which calculation is illustrated in inverter 208 with A(0) having a value of one. Code stream C is directly decodable by a decoder 210 which is based on optimal hardware considerations (e.g., unawkward calculations). Code stream Z is directly decodable by a decoder 212 which is based on optimal software considerations. It is observed that either decoder 210 or 212 may be used in decoding a code stream generated by any of the four encoders 200 through 206, some of the code streams being processed en route to the decoder by the inverter 208.

For completeness, it is noted that two other decoders—a Q/P hardware decoder and a P/Q software decoder can also be implemented. These various embodiments are discussed in the co-pending patent application relating to arithmetic coding with diverse encoders and decoders.

II. Encoding and Decoding Successive Events with Finite Precision

To facilitate the description in this section, the following definitions are provided. Variable names, for the most part, have the same meaning.

Definitions

C = code stream; the pointer (i.e., code point) to the current interval.

$C_d$ = decoder code stream with base line adjusted.

X = the part of the code stream in the register and not shipped out.

Qe(i) = estimated probability for an LPS event for the ith symbol coded.

Pe(i) = estimated probability for an MPS event for the ith symbol coded.

A(i) = augend (or interval) for ith symbol.

$S_i$ = ith symbol n(i) = cumulative renormalization count up to the coding of symbol $S_i$.

R(i) = renormalization factor for ith symbol.

$\delta_{condition}$ = equivalent of Kronecker delta function. (1 if condition true, 0 if false)

$\epsilon$ = smallest change possible for the current value of Q

Given the above definitions, the following relationships apply:

Pe(i) = 1 Qe(i)

R(i) = 1

$\epsilon = R(i)2^{-12}$ for 12 bit precision.

A. P/Q Hardware Encoder and Decoder

For P/Q symbol ordering, an optimal hardware encoder points to the bottom of the current interval and the code stream C is represented by the equation:

$$C = \sum_i R(i)A(i)Qe(i)\delta_{s_i = M}$$

In words, the value of C is determined by examining each successive decision event (or symbol). If a subject symbol corresponds to an LPS event, the Qe value at the time of the subject symbol is multiplied by a renormalization factor. The renormalization factor relates to the fact that the interval size is maintained between prescribed limits, for example 0.75 and 1.5. That is, the interval size is represented by an "augend" (referred to as "A") which is adjusted in value to remain between the pre-defined limits. When the augend value at an ith symbol—i.e., A(i)—falls below 0.75, it is doubled (or altered in some other way) as often as necessary to bring it back into the prescribed limits. By keeping A at or near one in value, the computations for A and C simplify—where multiplicative factors A*Q are approximated as Q.

Each time a symbol is encoded, a renormalization is possible. To be sure, each time the interval size is set equal to $A \times Qe \cong Qe$ (which by definition is less than or equal to $A*Pe$ and hence less than or equal to 0.75), the value of $A(i)$ is renormalized (e.g., multiplied by 2 at least once) to bring it within the limits.

In response to an MPS event, the size for the current interval $A(i)$ is approximated as $[A(i-1)Qe]$ which may or may not be less than 0.75; thus renormalization may or may not be required in the event of an MPS. The total number of times the current interval is renormalized is tallied and represented as $R(i)$, or as noted above $R(i)=1/2^{n(i)}$. The renormalization factor ensures that C is changed in value (e.g., is doubled the same number of times) as is the interval. The value of C when symbol $S_i$ is coded is thus incremented for the P/Q hardware in the event of an MPS event, and the increment is determined by Qe values and the renormalization factors for all previous symbols.

The P/Q hardware decoder undoes the above process according to the equation:

$$C_d = C - \sum_i R(i)A(i)Qe(i)\delta_{S_i=M}$$

$C_d$ is the code stream value after the effect of an event is removed. The P/Q hardware decoder decodes an LPS if $C_d < A(i)Qe(i)$.

B. P/Q Software Encoder and Decoder

The P/Q software encoder points to the top of each current interval. The software code stream $\tilde{C}$ is determined by the equation:

$$\tilde{C} = A(0) - \sum_i R(i)A(i)Pe(i)\delta_{S_i=L}$$

The evaluation of $\tilde{C}$ starts with an $A(0)$ value from which a sum is subtracted. Each addend of the sum corresponds to the product of A times the current P value times a renormalization factor for a previous LPS event.

Subtracting the final interval value $A(f)$ from $\tilde{C}$ results in the value C derived as the P/Q hardware code stream.

A P/Q software decoder would follow the equation:

$$C_d = C + \sum_i R(i)A(i)Pe(i)\delta_{S_i=L}$$

However, the comparison needed to decode the LPS symbol is awkward:

$$C_d < A(0) - A(i) + A(i) \times Qe(i)$$

Or, subtracting $A(0)$ from both sides of the relationship $$C_d - A(0) < -A(i) + A(i) \times Qe(i)$$

Letting $C'_d = C_d - A(0)$, it is observed that:

$$C'_d < [-A(i) \times (1 - Qe(i))]$$

Both $C'_d$ and $A(i) \times (1-Qe(i))$ are negative, but are always within $|A(i)|$ of 0. Therefore, the arithmetic for the decoder is fixed precision arithmetic. The software decoder is thus:

$$T \leftarrow A \times Qe$$

-continued $A \leftarrow A-T$
If $C'_d < A$
(LPS decoded)
$C'_d \leftarrow C'_d - A$
$A \leftarrow T$
renormalize A and $C'_d$
else
(MPS decoded)
renormalize A and $C'_d$ if needed.
endif The above computations are simplified as appropriate by setting the $A(i)$ values to approximate one.

III. Encoder and Decoder Registers

Referring to FIG. 5, a preferred X memory register 300 for storing code stream information is shown. The register 300 includes 32 bits which are allocated as follows. Bits 31-24 represent 8 flag bits, the 31st bit representing a "sign" bit. Bit 24 also receives a "carry" if one is generated in the process of preparing the next byte to be shipped. Normally every 8 shifts, bits 23 through 16 (identified as bbbbbbbb) represent the byte that is to be shipped to a buffer memory. In the event of the previous byte being an 'FF', only seven shifts are required and bits 24 through 17 are shipped out. In bit positions 14 and 15 are spacer bits which provide a delay between the bit positions for the byte to be shipped and the bit positions of data which is involved in further computations with the augend. Bits 13 through 2 represent the most recent portion of code stream data to which may be added (or subtracted) the value in a register containing the current interval (augend) value. Bits 13 through 2 are referred to as the "fractional portion" of the code stream and bits 24 through 14 correspond to the "integer portion" of the code stream. The register 300 is referred to as the X register, and contains the latest coded portion of the code stream. Before the bits in the X register were encoded, thousands of bits may have previously been encoded. Those earlier bits moved through the fractional portion of the X register into the integer portion of the register, and from there into a buffer memory which stores up to a finite number of previous bytes. As desired, bytes from the buffer memory may be transferred to storage or may be transferred to another location at which decoding is performed.

As suggested above, data is structured as bytes and is shipped as bytes. This is achieved by means of the flag bits. By initializing the 8 flag bits to 00000001 it is noted that the 1 bit shifts left as successive b bits shift into the integer portion of the register 300. When the leftmost flag bit becomes 1, the contents of the X register are considered "negative". On the next shift, the integer portion of the X register 300 is entered into buffer memory.

Preferably, buffer memory (not shown) is a memory which stores, for example, 256 bytes. A buffer pointer BP identifies the byte most recently entered into the buffer memory.

In addition to the X register, there is also an A register for storing the value of the current interval. As noted hereinabove, the current interval is maintained between prescribed limits, for example 0.75 and 1.5. The A register includes a twelve-bit "fractional" portion (with two 0 bits tagged thereon) which is aligned with the fractional portion of the X register (with two 0 bits tagged thereon) and also includes an integer portion.

The alignment of the fractional portions of the X register and the A register facilitates the various computations performed in up-dating the code stream. It is also again noted that each time the interval is renormalized to bring it back into limits, the code stream is similarly renormalized to retain the relative values thereof. The renormalization, it is recalled, simply involves some left shifts (i.e., multiplies by 2) if the interval size limits are set at 0.75 and 1.5.

After a code byte is set (and absent a CARRY), the contents of the X register 300 are ANDed with an appropriate Hex value to remove code byte bits. Also, the X register is set to X OR '1 00 00 00' (Hexadecimal notation), ensuring that bit 24 (of the flag bits) is set to 1.

In FIG. 6, a 32-bit decoder register 400 used with a P/Q hardware implementation is shown. The bit allocations include: two leading zero bits followed by 12 "fraction" bits which are in turn followed by two mm bit positions and 8 new data bit positions. The least significant 8 bits correspond to flag bits. The register 400 may be segmented in various ways as a full word, half words, and bytes. The 12 bits of the fractional portion are aligned with the fractional bits of the augend stored in a decoder A register.

After a new data byte has been shifted into XC (bits 31 through 16), the new data is entered into the higher bits of XNEW (bit 15 through bit 8) and XFLAG is reset to 1 unless a carry has occurred. That is,

XNEW = SLL B 8

XFLAG = 1

When XFLAG the low order byte, becomes zero, a new compressed data byte is needed.

D. CARRY and BORROW

In the above review of encoders and decoders, it is observed that the only place where the code streams might differ is where a CARRY or BORROW occurs for a given P,Q convention.

At this point it is noted that CARRY's and BORROW's are provided for by stuffing one or more bits (but less than a byte) as appropriate at byte boundaries. The effect of any CARRY or BORROW thus does not propagate beyond the last shipped byte. Hence, the buffer pointer need never back up to earlier bytes, but may instead advance to point at successive bytes as each enters the buffer memory.

The problem of CARRY propagation arises when the code stream is up-dated by incrementing the value thereof and when one or more successive bytes of encoded data each comprise a sequence of 1 bits. In this event, an addition will result in a CARRY propagation. To avoid this situation, the present invention provides that a bit be stuffed in a byte to receive a CARRY that might be generated. For example, let there be a sequence of bytes $\beta_{n-1}, \beta_n, \beta_{n+1}$ where $\beta_{n-1}$ is in buffer memory, with the buffer pointer identifying byte $\beta_{n-1}$. Byte $\beta_n$ is in the integer portion of the X register and $\beta_{n+1}$ is in the fractional portion of the X register.

If the value of byte $\beta_n$ is 'FF' (in Hexadecimal notation), the next byte $\beta_{n+1}$ gets a stuffed bit at its leading (most significant bit) position. If $\beta_n$ and $\beta_{n+1}$ resulted respectively in 11111111 ('FF') and 11111111 ('FF'), the present invention would stuff a bit at the most significant bit of $\beta_{n+1}$ so that the new sequence of encoded data would be 11111111, 01111111, 1 ... wherein the 0 bit is a stuffed bit for receiving a carry if required. When the decoder detects a byte of all 1 bits, it recognizes the next less significant bit as a stuffed bit and processes it accordingly to produce the proper code stream value.

The problem of BORROW propagation arises when the code stream which can be decremented includes a byte of all 0 bits. For example, suppose that there are three sequential bytes $\beta_{n-1}, \beta_n, \beta_{n+1}$ wherein the middle byte is all 0's.

One would be pre-borrowed from the $\beta_{n-1}$ byte, converting the $\beta_n$ byte to eight 1 bits. A stuffed bit would be inserted as the new leading bit of byte $\beta_{n+1}$. That new leading bit serves as a set carry bit. The data stream as transferred by the encoder is then:

($\beta_{n-1}$ − 1)11111111 1(leading 7 bits of $\beta_{n+1}$)

Any bit dropped off the $\beta_{n+1}$ byte segment is picked up in the next byte segment of data. The BORROW in effect has been changed to a CARRY by means of a (set) stuffed bit. The decoder, in any event, detects the stuffed bit as such and processes the stuffed bit as a CARRY.

Since the goal is to create a P/Q software code stream which is compatible with a P/Q hardware code stream that includes bit stuffing, the code stream must be generated subject to two constraints. First, any hexadecimal 'FF' must be followed by a stuffed bit. Otherwise, byte patterns which are illegal for the hardware decoder will be generated. Second, the code stream must be constructed such that whenever a borrow is needed from the present byte, it can—by definition—be taken. (The present byte is the byte which was transferred from the code register to the code buffer on the previous code byte cycle.) Since only one unit is borrowed, the only byte value which cannot be borrowed from is zero.

In general, the need for a borrow from the present byte is detected by setting a high order "preborrow" bit in the code register at the start of a new byte. For convenience, it is set in a bit position, P, which will become the sign bit when the next byte is ready to be written. For example, with a 32-bit Code (X) register, suppose the register contents are:

X register:

00000000,P0000000, xxxxxxxx,xxxxxxxx

A register:

000aaaaa,aaaaaaaa

When the next byte is complete, the contents become:

X register:
P0000000,nnnnnnnn,xxxxxxxx,xxxxxxxx
A register:
000aaaaa,aaaaaaaa

If the code register is positive (P=0), the preborrow has been used and a borrow is needed from the present byte. The borrow is therefore taken from the present byte before the new byte, nnnnnnnn, is transferred from the code register to the buffer. When the preborrow is used, the value in the code register is always larger than the A register and future borrows can be taken from the code register contents. If the code register is negative (P=1), no borrow is needed from the current byte and the unused preborrow, P, is removed.

The code (X) register is compared to the A register. If the code register is smaller, two things have been detected. First, the next byte to be shipped (nnnnnnnn) is zero. Second, a borrow from the current byte might be needed. A borrow is therefore taken from the current byte and propagated through the zero byte in the register. This converts the zero byte to 'FF'. After shipping this 'FF' to the code buffer and shifting the contents of the code register, two preborrows are set—one in the position which will become the sign bit, and the other in the bit position which will become the 'carry' bit position for the next byte. Thus, if the code register is smaller than the A register, X register:

00000000,P0000000,00Px,xxxx,xxxxxxxx

A register:

000aaaaa,aaaaaaaa and when the next byte is complete,

X register:

P0000000,Pnnnnnnn,xxxxxxxx,xxxxxxxx

A register:

000aaaaa,aaaaaaaa

The Hex 'FF' in the buffer triggers bit stuffing, so the preborrow bit is written into the stuff bit (carry receiver) position. An unused preborrow is thus equivalent to a hardware code stream carry.

If the code register is not smaller than the A register, the current contents of the code register are large enough to satisfy any borrow requirements. The current byte is checked, and if it is 'FF', bit stuffing is triggered. In this case, since no preborrow was required, the stuffed carry bit is always clear.

The sequence above satisfies all requirements; it creates a code stream which blocks borrow propagation, and which is compatible with hardware. If all zero bytes were simply converted to 'FF', a hardware decoder could decode the resulting code stream. However, the look-ahead to see if a borrow might be needed when the byte to be shipped is zero makes the resulting code stream identical to the hardware code stream. In effect, this look-ahead detects the existence of the 'FF' in the hardware code stream.

IV. PROBABILITY ADAPTATION

A. Probability Adaptation Integrated with Arithmetic Coding

The above-cited prior art articles by Langdon and by Landon and Rissanen discuss arithmetic coding in detail and are incorporated herein by reference for such teachings.

Arithmetic coding has been found to be a powerful technique for encoding strings of data symbols into compressed form, transferring the compressed (encoded) data, and retrieving the original data symbol string by means of a decoder which undoes the encoding. Arithmetic coding derives its power from two basic attributes: (1) the ability to approach the entropy limit in coding efficiency and (2) the ability to dynamically change the probabilities of the symbols being encoded.

As suggested hereinabove, a plurality of decisions are to be encoded to represent a point on a number line. The point is associated with a number line interval which uniquely represents a particular sequence of decisions. Such encoding is accomplished by initially defining a current interval bounded by two points on a number line. The current interval is then partitioned into segments, each segment corresponding to one of the possible events that may result from a decision. The possible events should be exclusive; no segments overlap. In a multiple symbol environment, each decision can result in one of m events (where $2 \leq m$). The length of each segment is determined by the relative probability of the decision event corresponding thereto. That is, the larger the decision event probability, the larger the segment corresponding thereto. This is significant, in that larger segments can be represented by fewer bits; hence, the events which should be encoded more frequently are represented by relatively few bits.

For binary arithmetic coding in which m=2, a less probable symbol LPS event may correspond to either a YES or a NO symbol (or event) for a given YES/NO (Y/N) decision; the other event then corresponding to a more probable symbol MPS event. The segments are conveniently referred to as the Q segment (which corresponds to the less probable event) and the P segment (which corresponds to the more probable event). The length of the Q segment corresponds to the estimated probability Qe for the LPS event and the P segment corresponds to the probability (1−Qe).

By maintaining A within the limits 0.75 to 1.5, the value of A may be approximated as 1.0. It is then noted that the above computations for determining C and A for an optimal hardware scheme simplify to:

If an MPS is encoded—

$C \leftarrow C + Qe$ $A \leftarrow A - Qe$

If an LPS is encoded—

$A \leftarrow Qe$

In the event that A<0.75 after a decision event is encoded, there is a renormalization of A and C. By renormalizing C as well as A, the code point value remains in the same proportions as the interval.

For decoding the encoded data generated according to the P/Q hardware scheme, the following operations are performed:

if $C \geq Qe$ an MPS is decoded and the following computations are made:

$C \leftarrow C - Qe$ $A \leftarrow A - Qe$

If the above condition does not hold, an LPS is decoded and $A \leftarrow Qe$

The simplified encoder (and decoder) described above are ideal for hardware implementation because the range subtraction (addition) and the code stream addition (subtraction) can be done in parallel. However, a software implementation employing the same conventions for defining and changing the code stream is not as efficient because two arithmetic operations are required on the most frequently taken path. Therefore, a more efficient software implementation of the encoder is realized by pointing the code stream, C, at the top of the current interval rather than the bottom.

For software, the encoding process is as follows:
if there is an MPS event $$A \leftarrow A - Qe$$

if there is an LPS event $$C \leftarrow C - (A - Qe)$$

$$A \leftarrow Qe$$

In either the optimal hardware scheme or software scheme, if $A < 0.75$
  renormalize A and C;
  update Qe.

In examining the above conventions, it is noted that A and C are renormalized in each embodiment when $A < 0.75$, and Qe is correspondingly up-dated.

The manner in which Qe is up-dated according to the invention is now described.

B. Up-dating the Probability Estimator

1. Up-dating Qe with Each Augend Renormalization

Figure 7:
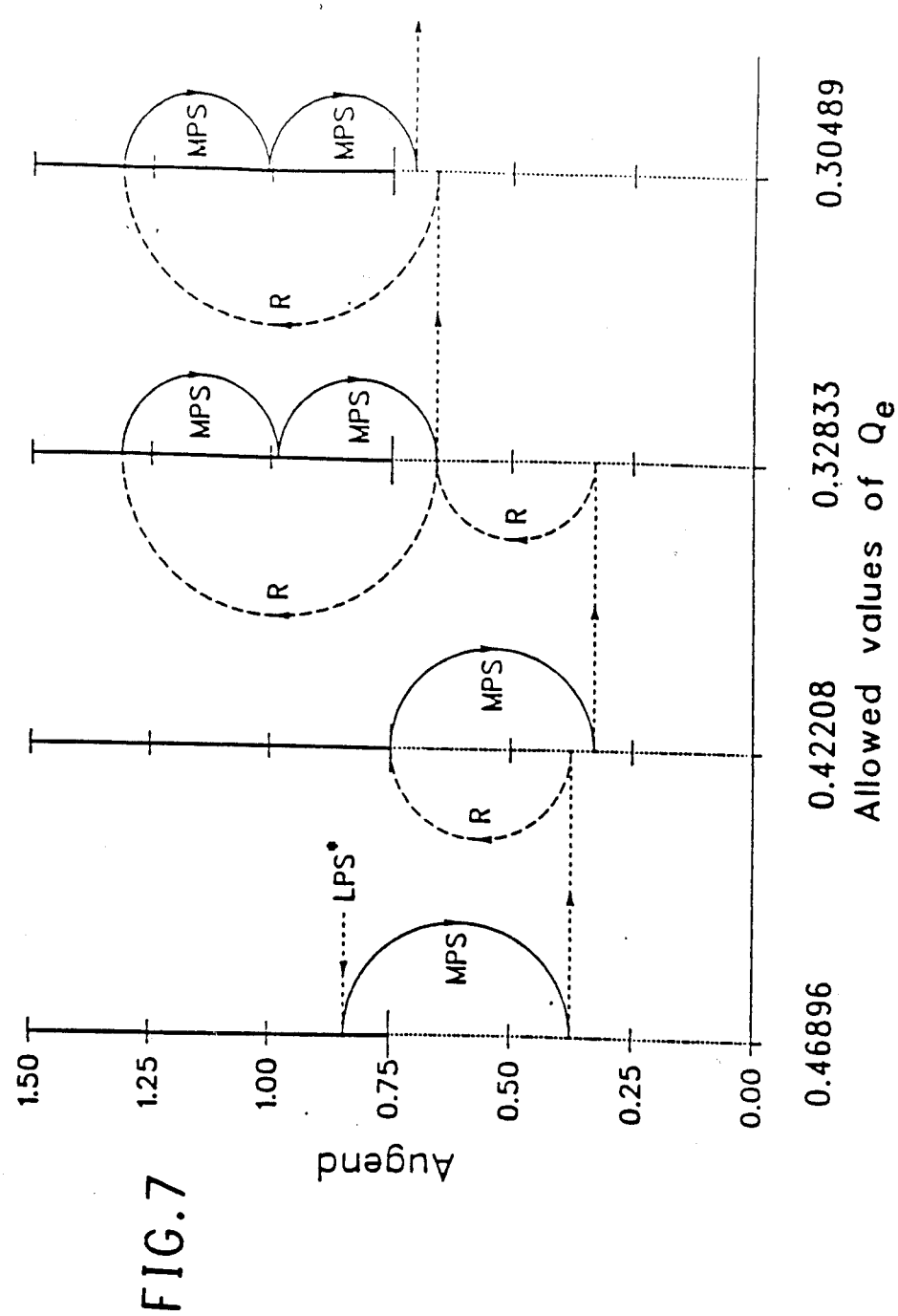
FIG. 7 is an illustration showing how the up-dating of the probability Qe is integrated with augend renormalization.

FIG. 7 illustrates the up-dating of an estimated probability value Qe as succeeding events are encoded and renormalizations occur. In FIG. 7, the ordinate represents values of the augend A and the abscissa represents allowed values of Qe as generated by, for example, a Qe table (discussed hereinbelow). Starting at the asterisk (*) in FIG. 7 at an allowed Qe value of 0.42208, an LPS event is encoded resulting in an augend value of 0.42208. The LPS event, which drives the augend to a value less than 0.75, results in an LPS renormalization (or "LPS renorm") which results in an incrementing of the Qe value to 0.46896 and a renormalization of A to a value of 0.84416 which is shown by the dashed line extending from LPS* leftward. It is noted that renormalizing A and C in the present embodiment involves a multiplication by two. This operation is not only simple—being performed with simply a register shift—but also makes it easy to keep count of the number of renormalizations performed. A subsequent MPS event results in A taking on the value 0.37520 according to the simplified expression:

$$A \leftarrow A - Qe$$

That is, $$A = (0.84416 - 0.46896) = 0.37520$$

Because A is less than 0.75, an MPS renormalization (or "MPS renorm") takes place. Qe takes on the lower value of 0.42208 and A is renormalized to a value of 0.75040. (A further renormalization is not required because the value of A is no longer less than 0.75.) On the next MPS event, A decreases to 0.32833 which is less than 0.75. A lower Qe value is chosen at 0.32833. The value of A is doubled to equal 0.65666 which is still less than 0.75. The value of A is doubled again so that A becomes 1.31332. A subsequent MPS event reduces the augend to 0.98499 which exceeds 0.75 so that no renormalization occurs. Another MPS event causes A to drop to 0.65666 which results in an MPS renorm. A lower value of Qe is chosen, namely 0.30489, and the augend A is multiplied by two to become 1.3133. On the second MPS event thereafter, an MPS renorm is required.

2. The Qe Tables(s)

In accordance with the invention, Qe values such as those shown in FIG. 7 are stored in table form. In Table 1 a plurality of allowed Qe values are shown in hexadecimal notation in the left column. Each Qe value in the table is preferably a 12-bit value and is defined to occupy two bytes. The Qe values are divided by 5461 (hexadecimal 1555) to convert to N-decimal fractional representation. A 5 bit index is sufficient to uniquely identify each Qe value. To move to an adjacent entry in the table, a shift of two bytes is required In Table 1, the second column indicates how many bytes are to be shifted for each listed probability value following an LPS renorm. It is observed that, in some instances, an LPS renorm results in the probability value incrementing by one, two, or three index positions in the table.

In examining Table 1, it is observed that entries therein correspond to the Qe values set forth in FIG. 7. That is, 0.46896 in decimal corresponds within the decimal precision used to the 0a81 hexadecimal value in Table 1. The three entries listed thereafter—namely 0a01, 0901, and 0701—correspond respectively to the 0.42208, 0.32833, and 0.30489 values of FIG. 7. The negative of Qe is used where MPS is 1.

An alternative to Table 1 is shown in Table 2. Table 2 shows qiO values for allowed Qe values which are associated with LPS renormalization. The qO values are derived from Table 1 by multiplying the Qe values in Table 1 by 4. In addition, if the MPS is 1, the qO value is negated.

The qiO term in Table 2 is referred to as qilps(iO) indicating that the index contains information relating to the next Qe value (qO) for both MPS of 0, i.e., positive Qe, and MPS of 1, i.e., negative Qe, and the index (iO) therefor which apply when an LPS renorm occurs. In Table 2, both the next Qe value and its associated iO value are found at the previous index. In Table 1, however, a next index is first determined and then the next Qe value is determined therefrom. Table 2 provides a simpler look-up procedure.

Table 3 is similar to Table 2, except that it is intended for use with MPS renorms. In particular, in the event of an MPS renorm, Table 3 shows the next probability value qO and next index iO for each Qe value in the table. In Table 2, higher values are chosen whereas in Table 3 lower values are chosen.

It should be recognized that the tables only include Qe values in the range from 0 to 0.5. At 0.5, the binary event representing the LPS becomes the MPS and vice versa. The event which corresponds to Qe thus changes. For example, if a white pel event represents an LPS event, Qe values represent the probability estimated for the white pel event; however, when the Qe value reaches and exceeds 0.5, the black pel event now becomes the LPS event identified by Qe. The Qe table may be viewed as symmetric about the exchange point where the definitions of the LPS and MPS change.

The selection of allowed Qe values is determined based on a number of factors. First, certain values are recognized as "bad" values. In particular, those values which can result in "trapping" the Qe value are not permitted. Probability values that are at or near the values AMIN/2, AMIN/4, ... AMIN/$2^n$—where n is some positive integer—are considered "bad" values. At such values, a cycle of (1) LPS renormalization, (2) movement to a first Qe value, (3) MPS renorm after a single likely MPS, with a corresponding movement to a second (lower) Qe value, (4) another LPS and LPS renorm, and (5) a return to the first Qe value could trap the estimation process. Accordingly, the values of Qe are preferably selected to exceed AMIN/$2^n$ by a prescribed value δ, so that the probability of an MPS renorm after an LPS renorm is not excessively high. One method of accomplishing this end is to space all smaller Qe values far enough away from a renormalized hex value '1000' to require a plurality of MPS events to invoke an MPS renorm following an LPS renorm. For Qe values near 0.5 this condition is relaxed. For very small Qe the interval between the renormalized Qe and AMIN must be large enough that the MPS renorm probability is of the same order of magnitude as the LPS probability.

In addition to the above approach of avoiding Qe values which, when renormalized, are near or equal to AMIN, the present invention teaches the inclusion of a "bad" Qe values provided that the jump of index positions in response to an LPS renorm is relatively greater than the drop of index positions in response to an MPS renorm. For example, the smallest value of Qe in Table 1 is a "bad" value. However, the index to the Qe value is shifted by 2 entries (4 bytes) when an LPS renorm occurs. Therefore, two MPS renorms must occur in sequence to return to the smallest value, and the estimator is not trapped by the high probability of the first MPS renorm.

Figure 8:
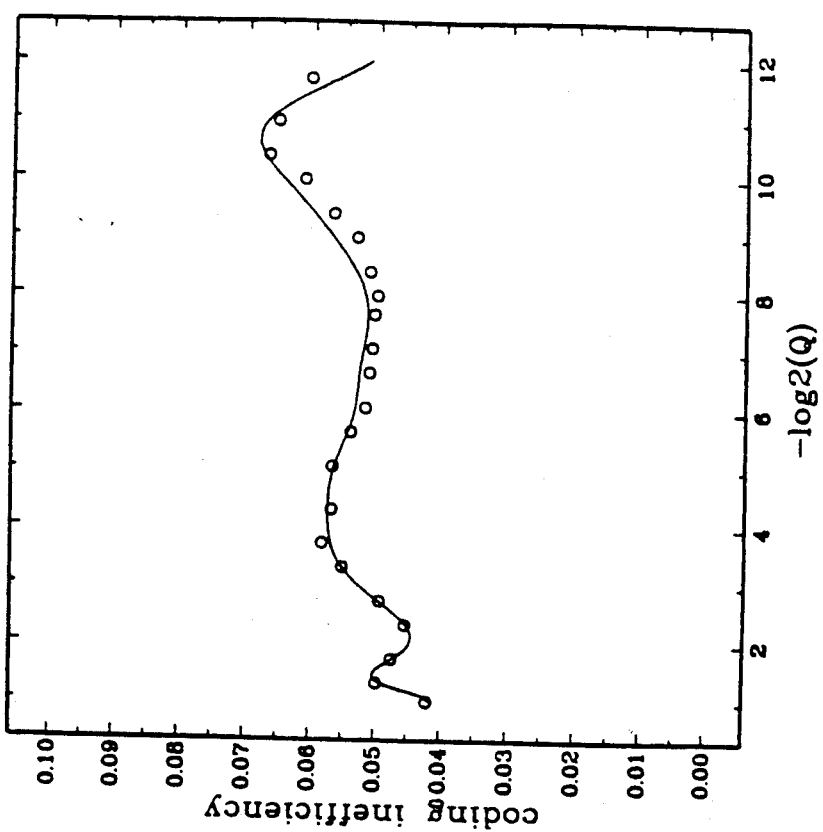
FIG. 8 is a graph depicting coding inefficiency.

A second consideration in selecting table values involves coding inefficiency. In this regard, it is desirable that minimum coding inefficiency be achieved over the range of allowed Qe values. Referring to FIG. 8, a graph of coding inefficiency vs. Qe value is shown for Qe values included in Table 1. The circles represent experimental results and the solid line represents theoretical results for a single context coding embodiment (see section 3). Coding inefficiency is based on entropy, on the bit rate/symbol for a particular state (or specific entry in the Qe table), and on the occupation probability for the particular state. Entropy, it is noted, is defined as:

$$H = -\left( \sum_i Pr(i) \log Pr(i) \right)$$

where each Pr(i) represents the probability of an ith decision event, the sum being taken over all decision events for a given decision. Preferably, but not necessarily, the most uniform curve—given table granularity and arithmetic approximations used in the coding—is desired.

In accordance with the invention, the density of index positions is enhanced at high entropy Qe value portions of the table compared to a power-of-2 set of probabilities. In a power-of-2 set, the range ¼ to ½ corresponds to a Qe value of 0.1; 1/50 to ¼ corresponds to 0.01; 1/16 to ⅛ corresponds to 0.001; and so on for successive index positions. Near the ¼ to ½ range, there is a relatively large number of entries compared, for example, to the aforementioned skew coder. At lower entropy Qe values, density is relatively sparse.

Third, system responsiveness is a consideration; namely, how long it takes to reach the proper Qe value from a value far from the mark. In furtherance of this end, larger increments and decrements are selected between adjacent Qe values, provided that such large differentials do not adversely impact stationary results. Stationary results are generated based on data provided according to a fixed probability—for example, by a pseudorandom number generator producing outputs based on a fixed probability. Nonstationary results are based on actual data wherein the probability may fluctuate over time.

Table 1 was determined in accordance with the above considerations and represents a compromise between simplicity, minimum storage requirements for each context (e.g., six bits which include one bit for the sense of the MPS symbol and five bits for the Qe value), reasonable coding efficiency for fixed (i.e., stationary) statistics, and good performance on multiple context data obtained from different data compression models (for example, a facsimile compression model and a continuous tone image compression model).

In the above description, a compromise between coding efficiency and rapid estimation of changing probabilities is noted.

Referring to FIG. 9, a gating circuit is shown. A plurality of input lines and a plurality of output lines are provided. By setting the input lines to a prescribed pattern of 0 and 1 signals, a corresponding q-index is input to the gating circuit. For each q-index the gating circuit provides a pattern of signals on the output lines which represent a corresponding Qe value. In accordance with the invention, Qe values have been selected so as to limit the number of gates and required gating in providing Qe value output for q-index input. The Qe values have been selected so that (a) the least significant bit of each Qe value is always set (to 1) and (b) no more than five of the twelve Qe value bits are set for any Qe value.

Accordingly, the above-noted objectives as well as facilitated hardware are achieved.

3. Single Context and Multiple Context Adaptation

Figures 10, 11:
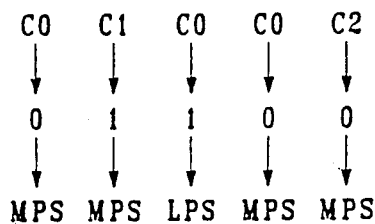
FIG. 10 is a table showing a plurality of contexts each having a respective current estimated probability.
FIG. 11 is an illustration showing how a string of bits are interpreted based on context.

Referring to FIG. 10, a context table is shown. In particular, three contexts C0, C1, and C2 are listed. Each context corresponds to a different setting in which decisions are being made. For example, the differing contexts could represent different areas in a frame of optical data. One area of the frame may be predominately black, another may be predominately white, and a third area may be fairly evenly represented by each type of event. Accordingly, for each context, there is a respective MPS identifier; that is, an indicator as to whether the black (or YES) decision is the MPS or whether the white (or NO) decision is the MPS. In binary notation this is represented in the FIG. 10 table by the MPS column in which the 0 event represents the MPS event for the C0 and C2 contexts, while the 1 event represents the MPS event for the C1 context.

The next column in the FIG. 10 table is a Qe index table which indicates the Qe entry currently being pointed to for the respective context. In context C0, the 0th entry is being pointed to; in the C1 context, the 12th entry is being pointed to; and in the C2 context the 29th entry is being pointed to. The respective current Qe values are shown in the last column to be 0.5, 0.10, and 0.001, respectively. The MPS identifier and Qe index are preferably represented by 6 bits, the Qe index preferably being represented by 5 bits in this embodiment—it being recognized that the number of bits may vary.

In accordance with one embodiment of the invention, a single augend value is stored and used regardless of which context is being considered. As decisions are entered in each context and as renormalizations are provided for each context, a common augend is processed.

By way of example, a string of 0 and 1 bits are shown, each being associated with a corresponding context. The string 01100 represents bits in the C0-C1-C0-C0-C2 contexts, respectively. From the table of FIG. 10, it is observed that the bit sequence represents an MPS (for C0), an MPS (for C1), an LPS (for C0), an MPS (for C0), and an MPS (for C2). Let the initial value of A before the first bit is encoded be 1.0 for purposes of this example. In response to the bit string 01100, then, the following operations take place given a P/Q encoding scheme as described hereinabove:

i. For the first bit, $$A \leftarrow A - Qe(C0) = 1.0 - 0.5 = 0.5$$

Because A is now less than 0.75, A is renormalized to 1.0 and the value Qe (C0) is decremented to 0.48.

ii. The second bit represents an MPS in context C1, causing the value of the augend A to drop according to the expression $A \leftarrow A - Qe(C1)$ which is equal to (1.0 $-0.1$)=0.90. No renormalization is performed.

iii. The third bit is an LPS in context C0, resulting in an LPS renorm. The augend value changes from 0.90 to Qe (C0), or 0.48. The value for A must be renormalized (doubled) to the value of 0.96 and the Qe value for the C0 context is incremented. For this example, it is assumed that the value Qe (C0) increments by one entry back to the 0th entry. As discussed hereinbelow, the invention also contemplates the Qe value being moved upward to a single value which is more than one entry away. Alternatively, the invention contemplates the possibility of moving the Qe value upward to a chosen one of several possible next Qe values depending on how far the Qe value appears to be from the actual probability. The latter methodology is discussed as a multiple rate embodiment in the co-pending probability adaptation patent application.

iv. At the fourth bit, there is an MPS for context C0. A is altered to (0.96−0.5)=0.46 which requires an MPS renorm. The value for A is doubled to 0.92 and Qe (C0) drops to 0.48.

v. The fifth bit corresponds to an MPS in context C2. The value of the augend A becomes (0.92−Qe(C2))=0.92−0.001=0.919 which is greater than 0.75. No renormalization takes place.

After the five bits, the table has the following entries. For context C0, MPS=0, the Qe (C0) index is 1, and the Qe (C0) value is 0.48. For context C1, all data remains unchanged. For context C2, all data remains unchanged. The current augend A for the next encoded decision event is 0.919 regardless of the context of the decision.

The multiple context embodiment, compared to a single context embodiment, permits a plurality of decision contexts to be processed together.

4. Single Rate Adaptation

A single rate estimator provides that, for a given Qe value, there is only one specified greater value which is to be chosen as the next probability for an LPS renorm and one specified lesser value to be chosen for an MPS renorm. An embodiment of a single rate estimator is set forth hereinbelow in section 5 as a finite state machine.

5. Finite State Machine Representation of the Qe Table

Figure 12:
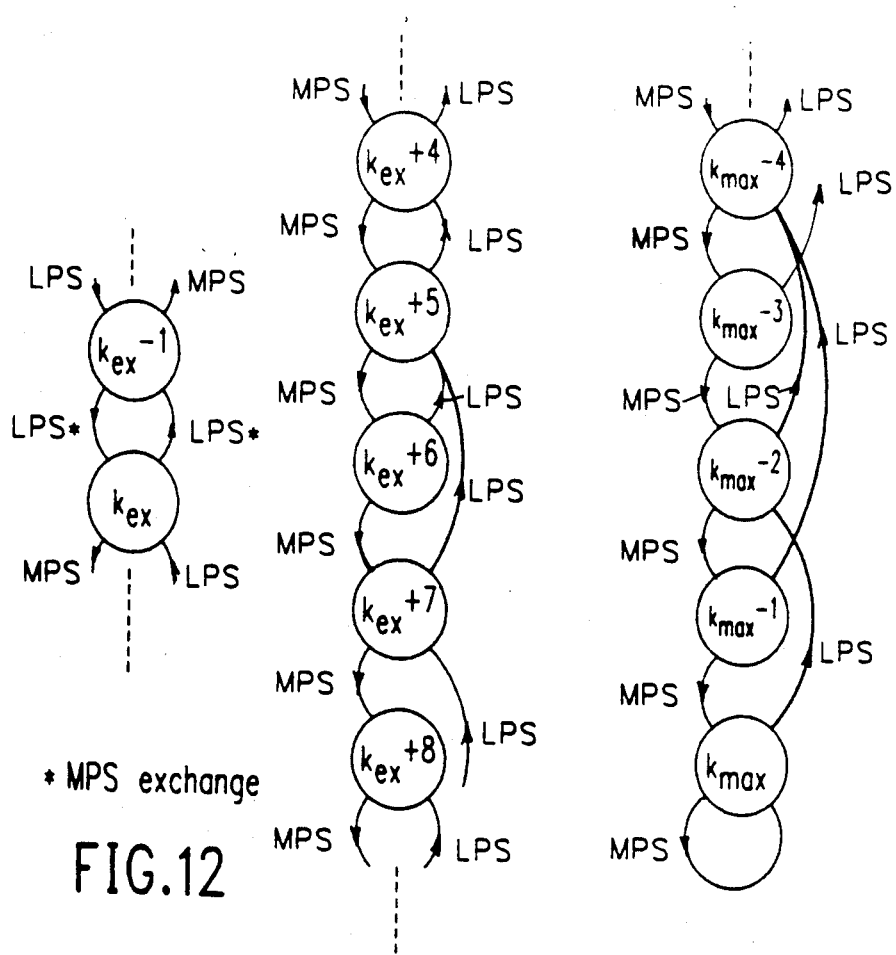
FIG. 12 is an illustration of a finite state machine representation of a single rate arithmetic coding system.

FIG. 12 shows a finite state machine implementation of a single rate, single context estimator. The value $k_{ex}$ represents a state at which an event which MPS and LPS event definitions are exchanged. In FIG. 12, each state has one outgoing path for an MPS renorm and one outgoing path for an LPS renorm. For $k_{max}$ the MPS renorm results in an up-dating which returns to the same state.

Each state may thought of as a table entry, representing a particular Qe value. Each entry is linked to two possible succeeding entries. Preferably, MPS renorms result in movement to the next state closer to $k_{max}$. On an LPS renorm, it is noted that the state may change by one, two, or more state positions on its path to a single possible next state.

V. Description of Q-Coder System Flowcharts

In the following flowcharts, the "hardware" and "software" embodiments set forth hereinabove are described in terms of flowcharts. The encoder and decoder embodiments are labeled with -H or -S where they differ.

Figure 13:
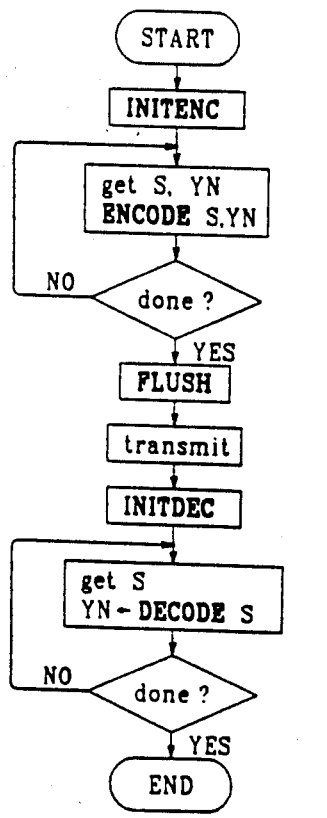
FIG. 13 through FIG. 49 are flowcharts showing the respective operations of the Q-Coder and Q-Decoder.
Figure 14:
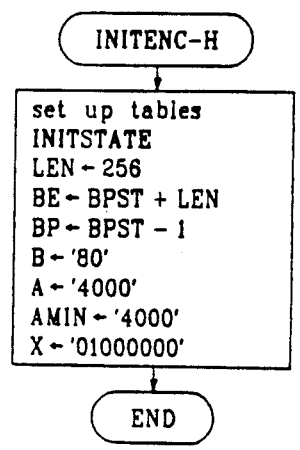
Figure 15:
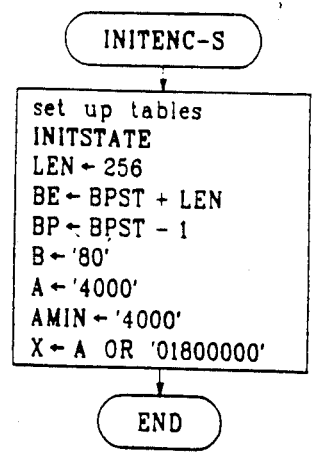
Figure 16:
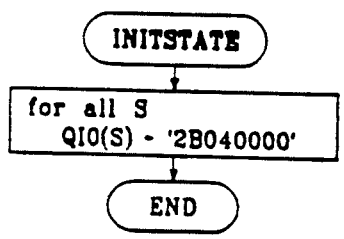
Figure 17:
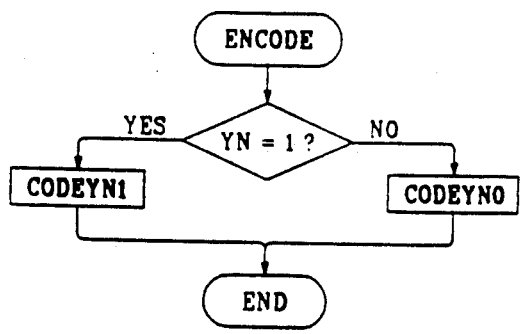

FIG. 13 is a flowchart showing a coder and decoder according to the present arithmetic coding compression/decompression system. (Compare FIG. 1) In FIG. 1 BITIN is the binary event encoded, and BITOUT is the binary event decoded. In the flowcharts the binary decisions are called YN in both encoder and decoder. By way of general description, INITENC in FIG. 14 and in FIG. 15 each initializes the compression system—one in a hardware scheme, the other in a software scheme. The model process is represented by the statement "get S, YN". INITSTATE (FIG. 16) sets the initial q-index value and $Q_e$ value for all context states S. ENCODE block (FIG. 17) uses the context state S and the YN values to generate the compressed data stream. The decision as to when all symbols have been encoded is provided by some external means. For example, for grayscale TV images there is a fixed format such as 512 pels/line by 480 lines. If there is no agreed upon convention, the encoder must supply the decoder with that information either externally or as part of the compressed data stream.

Figure 33:
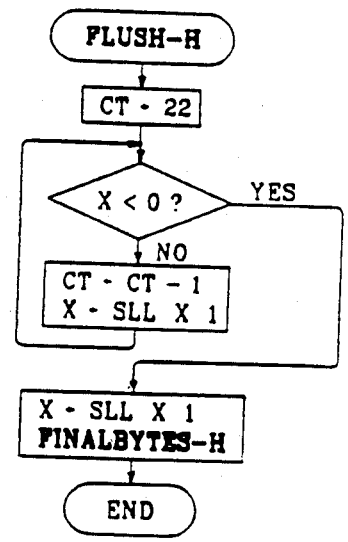
Figure 34:
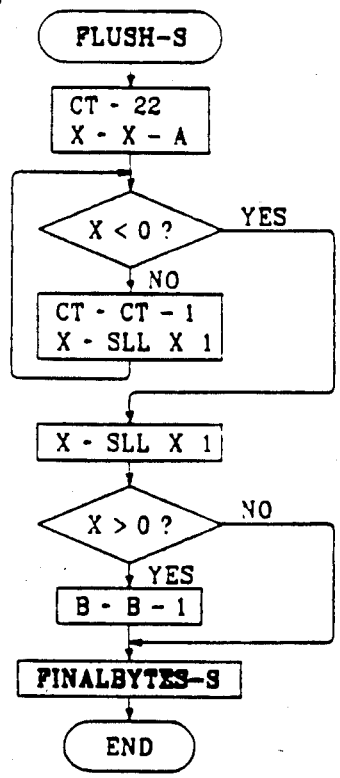
Figure 39:
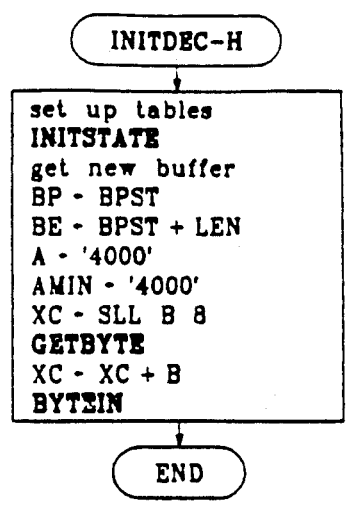
Figure 40:
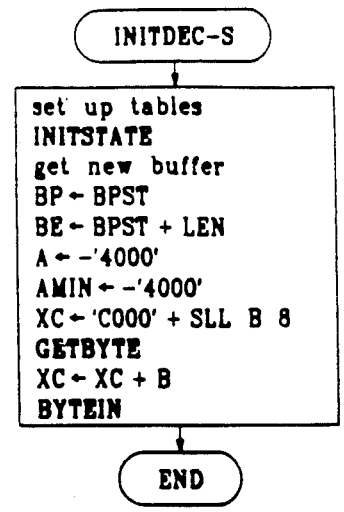
Figure 41:
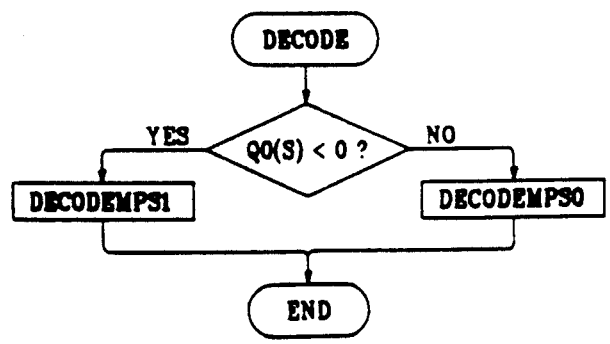

When all symbols have been encoded, the block FLUSH (FIG. 33 and FIG. 34) outputs the final bytes so that the decoder is guaranteed to have enough data to completely decode all of the symbols. The block "transmit" could represent either storage or transmission. This figure suggests that the complete compressed data stream is generated before transmission or storage. However, each byte of compressed data can be transmitted as soon as the next byte has been created. The INITDEC block (FIG. 39 and FIG. 40) is called once to initialize the decoder. In the decoder, the model supplies the context state S value. The DECODE block (FIG. 41) returns the YN decision. The decision as to when the decoding is done is supplied externally or as part of the compressed data stream.

A. Detailed Description of the Encoder Operation

The following definitions apply to the flowcharts and description thereof.

Definitions

In the programs and flowcharts QO(S) is defined as a fixed point fraction with 16 bits. It can either be a positive or negative quantity.

IO(S) is the index to the QIMPS or QILPS table for updating the Qe probability value. It is stored in the two bytes immediately following QO(S). The 4 bytes from the QIMPS or QILPS tables will be the next QO,IO pair.

A is a 16 bit integer, but can be considered a binary fraction with the binary point positioned to provide 12 fractional bits followed by two zeros and 2 leading integer bits.

X is a 32-bit number which has a structure as shown in FIG. 5 for the encoder and FIG. 6 for the decoder.

XC is the 16 most significant bits of X in the decoder.

XNEW is the 16 least significant bits of X in the decoder.

XFLAG is the 8 least significant bits of X in the decoder.

LEN is the length of the buffer for the code stream. It is set to 256 bytes (an arbitrary but convenient choice). LEN could be set to 1.

BPST points to the start of the compressed data buffer.

BE points to the first byte beyond the compressed data buffer.

BP is the pointer to the current byte of compressed data.

B is the byte of compressed data pointed to by BP.

AMIN determines when renormalization is needed. AMIN is set to Hex '4000' (which is equivalent to 0.75) for everything except the software decoder for which it is set to minus Hex '4000' (which is still equivalent to 0.75).

INITENC (FIG. 14 and FIG. 15) does the initialization for the encoder. Two versions of INITENC have been implemented according to whether the hardware version (-H) shown in FIG. 2 or the software version (-S) shown in FIG. 3 is implemented. After the tables have been set up, INITSTATE (FIG. 16) initializes the context storage area. Both versions initialize LEN to 256 bytes, point BE to the end of the compressed data buffer, and point BP to 1 byte before BPST, the actual start of the buffer to be sent. The pointer is updated before a byte is written; hence an offset of 1 is necessary. The byte B (addressed by BP) is initialized to '80' to guarantee that the special cases of B=0 or B='FF' will not be triggered for the first byte in the compressed data stream. The range A is initialized to '4000' and AMIN is initialized to the same value. The differences between the versions appear in the initialization of X. All versions have the 8th msb set to 1 to flag when 8 compressed bits are ready. In the software version a borrow bit is inserted just after the flag bit in X and A is ORed into the low order bits. This borrow bit blocks prevents borrow propagation to the flag bit.

ENCODE (FIG. 17) shows the two paths taken according to whether YN is 1 or 0.

Figure 22:
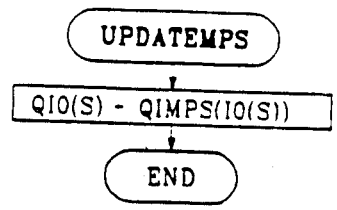
Figure 23:
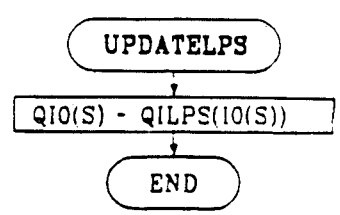
Figure 24:
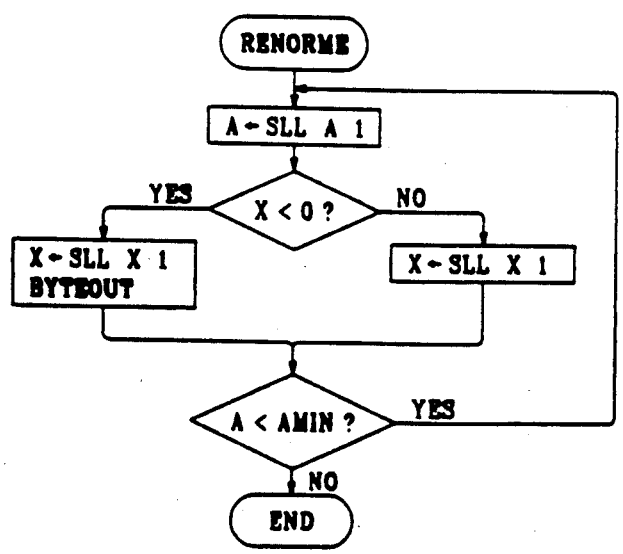

CODEYN1 (FIG. 18 and FIG. 19) encodes YN=1. If QO(S)<0, then MPS=1 and an MPS symbol must be coded. A is decreased by adding the negative QO. The hardware version moves X up by subtracting negative QO. On the MPS path if A is less than AMIN, then QO can be decreased by UPDATEMPS (FIG. 22) The RENORME block (FIG. 24) renormalizes both A and X. If QO is positive (zero is not allowed), then MPS=0 and an LPS symbol must be coded. For the software version the MPS range must be calculated and X moved down by the new A. In both cases, A is set to QO and the update of the probability for an LPS case is then done in UPDATELPS (FIG. 23). Since QO is always less than AMIN, renormalization is required.

Figure 18:
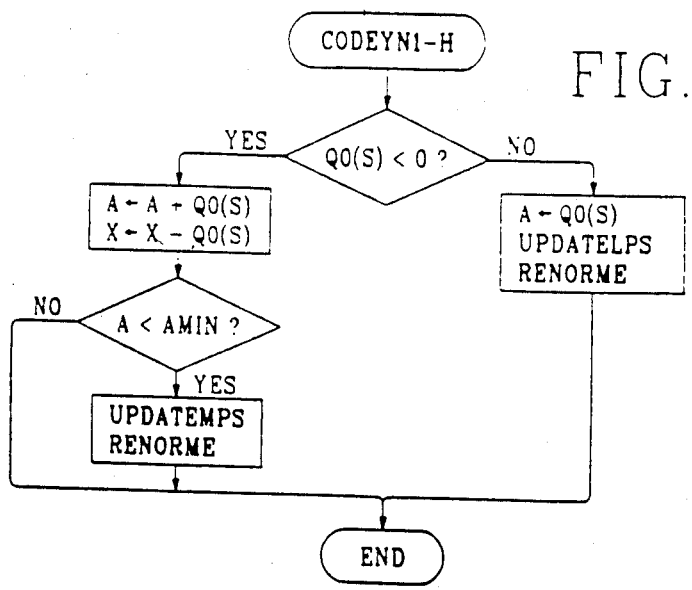
Figure 19:
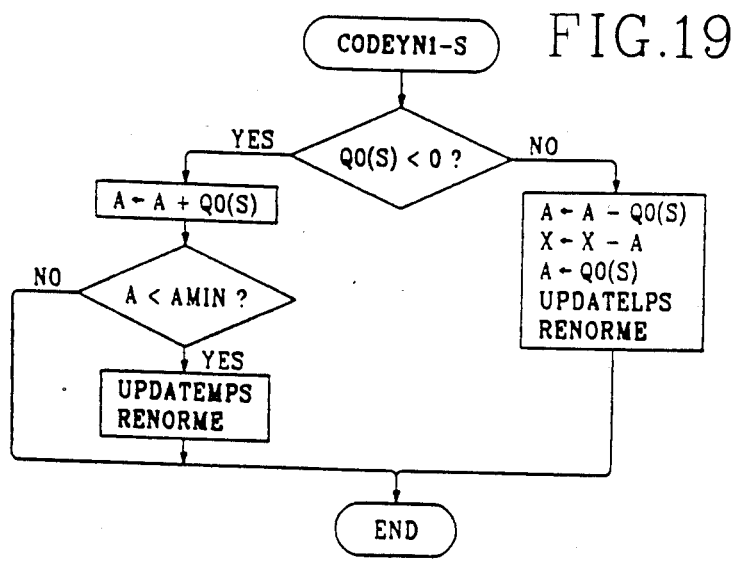
Figure 20:
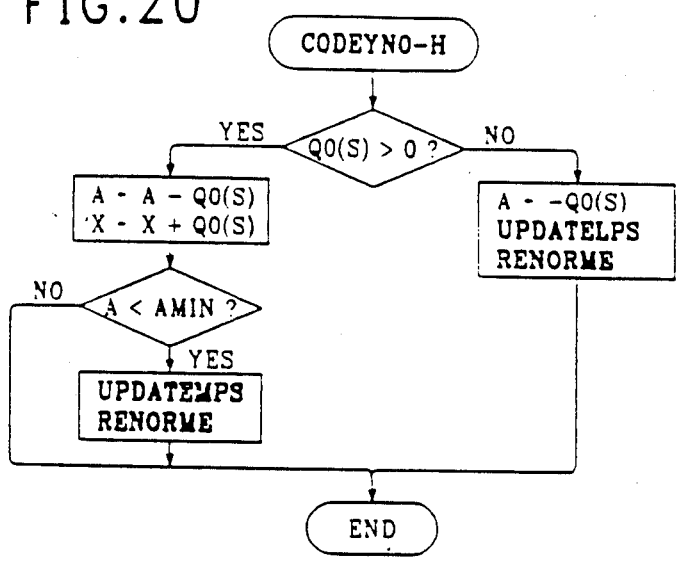
Figure 21:
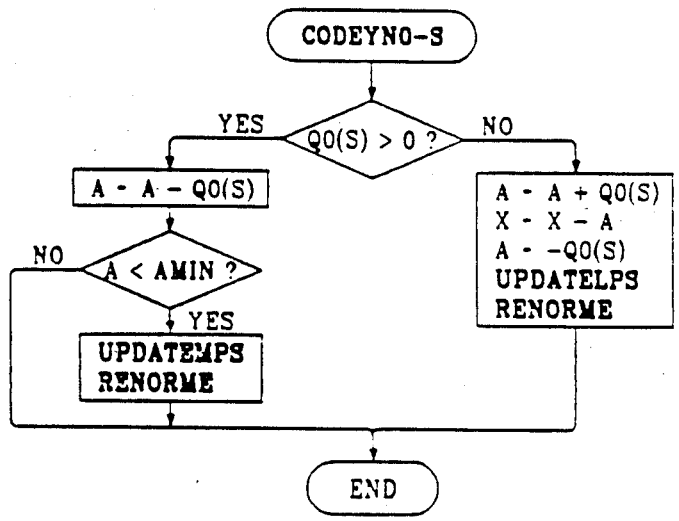

CODEYNO (FIG. 20 and FIG. 21) shows the same operations as FIG. 18 and FIG. 19 for the YN=0 path. In this case, QO is positive for the MPS path and negative for the LPS path.

UPDATEMPS (FIG. 22) does the probability update on the MPS path. The new Qe and index (4 bytes total) are found in the QIMPS table at the old IO(S) location. Table 3 gives an example of a QIMPS table.

UPDATELPS (FIG. 23) does the probability update on the LPS path. The new Qe and index (4 bytes total) are found in the QILPS table at the old IO(S) location. Table 2 gives an example of a QILPS table.

Figure 25:
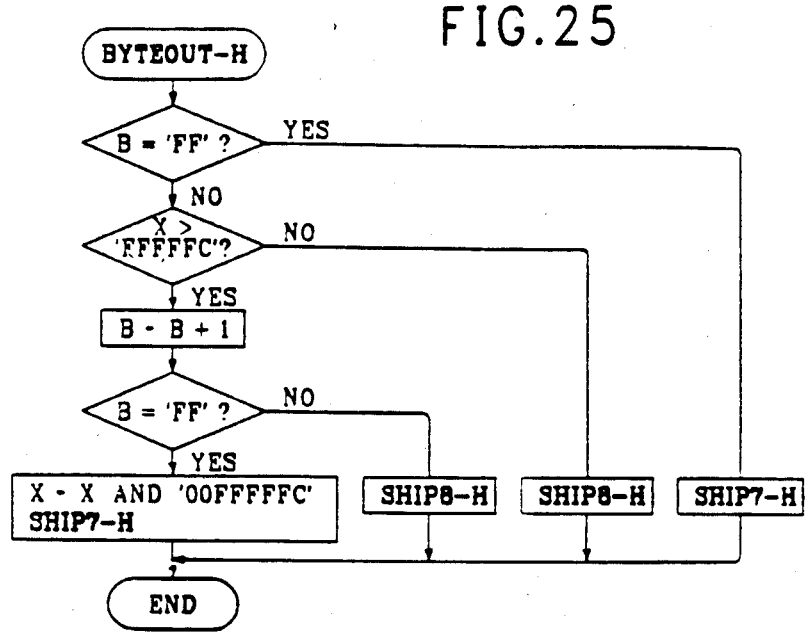
Figure 26:
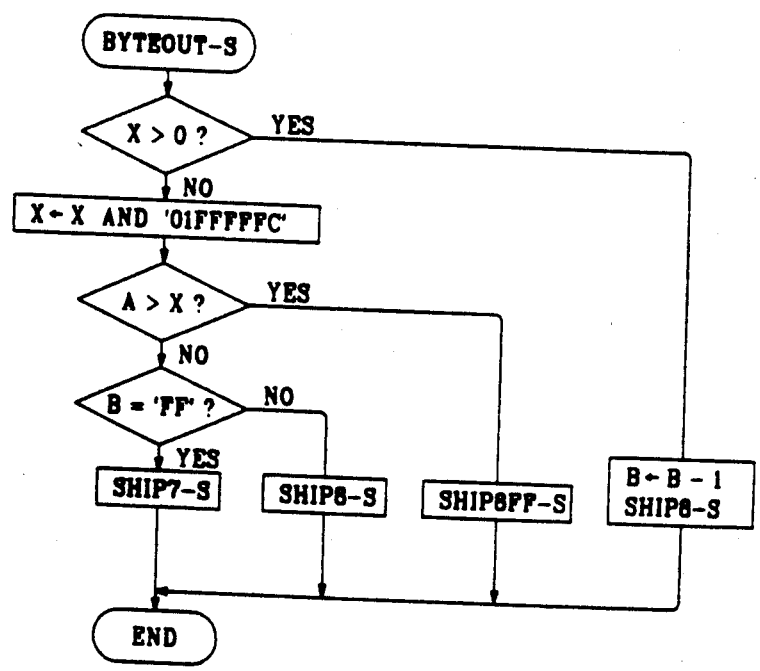

RENORME (FIG. 24) normalizes the A and X values one bit at a time. A is shifted first and then X is tested to see if the most significant bit is set. If so, the next shift of X removes that flag bit and a byte is output by BYTEOUT (FIG. 25 and FIG. 26). Otherwise X is just shifted one bit. This process is continued as long as A is less than AMIN.

In accordance with BYTEOUT (FIG. 25 and FIG. 26), the decoder expects every 'FF' byte to be followed immediately by one leading stuffed bit in the next byte. The leading bit will be the carry bit.

Figure 27:
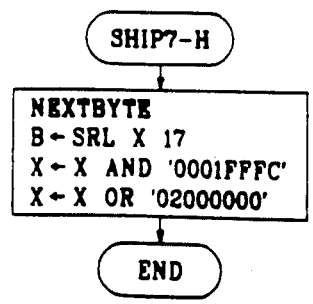
Figure 29:
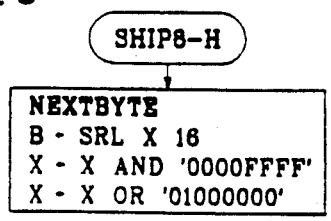

In FIG. 25, the hardware version of BYTEOUT first looks at the last byte B and immediately outputs only 7 data bits in SHIP7-H (FIG. 27) if B is 'FF'. Any carry will appear in the most significant bit of the new byte. If B is less than Hex 'FF', X is tested for a carry and if there is none, 8 bits can be output in SHIP8-H (FIG. 29). If there is a carry, the last byte needs to be incremented by 1 and the result tested to see if it is now Hex 'FF'. If so, then the carry in X which has already been added to B must be cleared before outputting the next 7 bits. Otherwise, 8 bits may be output into the new byte.

Figure 28:
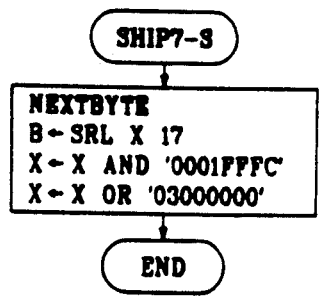
Figure 30:
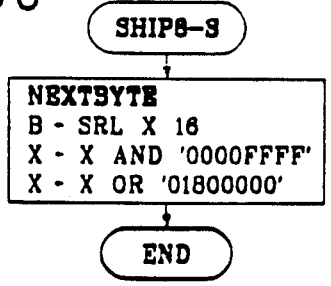
Figure 31:
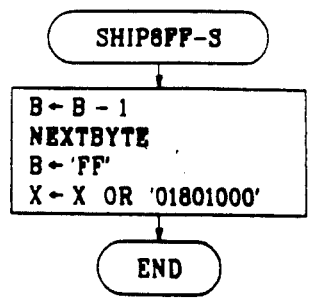

The software version BYTEOUT-S (FIG. 26) tests whether X is positive. If X is positive, the borrow bit was used and B must be decremented by 1 before outputting 8 bits. If the borrow bit was not used, it is cleared from X before A is compared to X. If X is smaller than A, a borrow could be needed in the future that would not be available if the new byte were output as zero. (A is at most '7FFC' so X has only zeros in the 8 output bits). SHIP8FF-S (FIG. 31) does the pre-borrow, converts the new byte to 'FF', and saves the borrowed bit into X. If B is 'FF', then only 7 bits are shipped by SHIP7-S (FIG. 28) instead of the 8 bits by SHIP8-S (FIG. 30).

Figure 32:
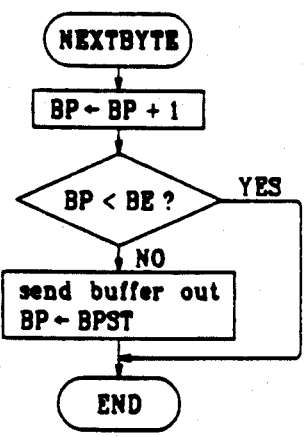

SHIP7-H (FIG. 27) increments the output byte pointer in NEXTBYTE (FIG. 32) and stores in the new B bits 24 to 17 from X. The leading bit contains any carry. Only the trailing 17 bits are left in X before the flag is inserted at the 7th most significant bit. This causes the next byte to be output when 7 new bits are ready because one has been left in X. SHIP7-S (FIG. 26) is the same as SHIP7-H except that the borrow bit is set to immediately follow the flag bit.

SHIP8 (FIG. 29 and FIG. 30) is similar for both versions. After incrementing the pointer to the next output byte B, the 8 bits in X at bits 23 - 16 are stored at B. All but the 16 least significant bits are cleared in X and the flag is inserted at the 8th most significant bit. The software version also inserts a borrow bit after the flag.

The software encoder has to guarantee that B can be decremented if necessary. SHIP8FF-S (FIG. 31) is executed when the next byte to be written is zero and a borrow might be required from it. A borrow is therefore taken immediately, decreasing B by 1 and converting the next byte to Hex 'FF'. The borrow taken from these two bytes is inserted into X where it will be output in the next byte as a carry if it is not needed.

NEXTBYTE (FIG. 32) moves BP to address the next byte in the compressed data buffer. If, after it is incremented, BP is not less than the end of the buffer, the buffer must be transferred and BP reset to the start of the buffer. It is assumed that BPST and BE will be appropriately changed if necessary.

Figure 35:
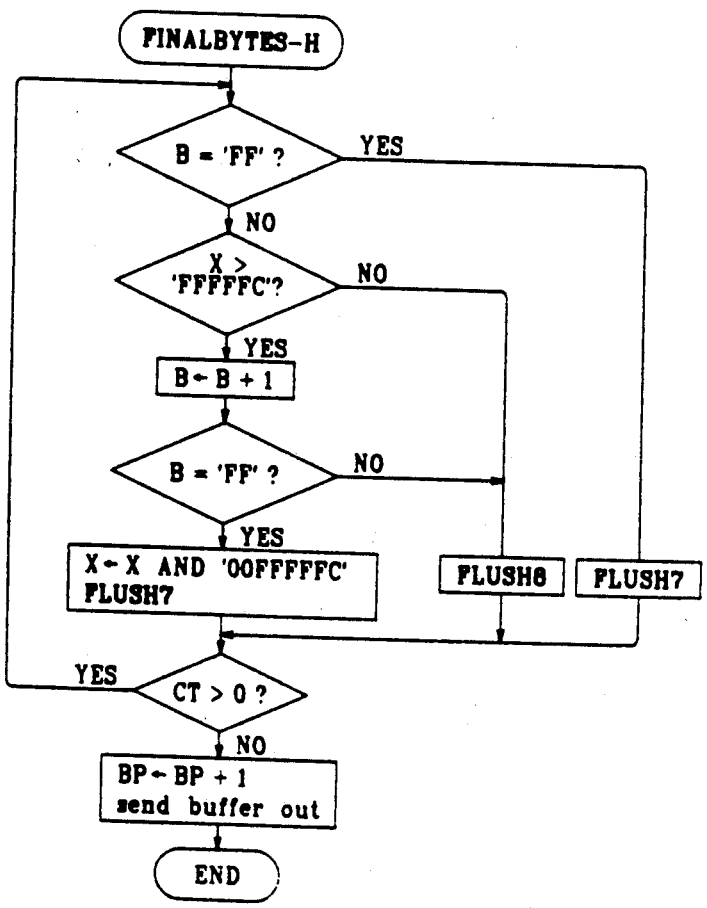

After the final symbol has been coded, the 22 compressed data bits still in X need to be flushed out. In FLUSH-H (FIG. 33) CT is initialized to 22 and decremented for each shift in X until the flag is in the most significant bit. One more shift puts the output bits on a byte boundary. Then FINALBYTES-H (FIG. 35) can output these last bytes.

Figure 36:
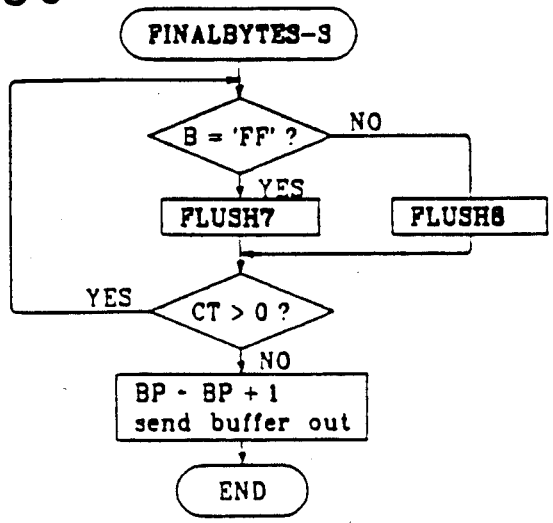

FLUSH-S (FIG. 34) moves X to the bottom of the interval which then positions it precisely to the value generated by the hardware version. After byte aligning the bits, if the borrow has been used, the last byte must be decremented before outputting the final bytes in FINALBYTES-S (FIG. 36).

Figure 37:
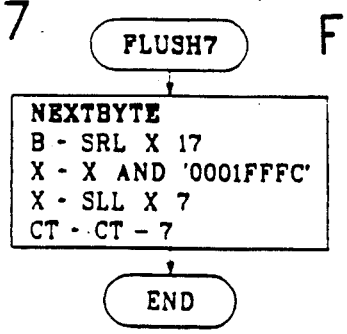
Figure 38:
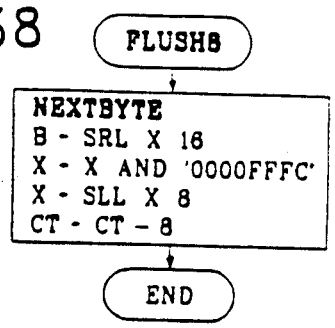

FINALBYTES-H (FIG. 35) goes through the same type of operations as BYTEOUT-H (FIG. 25) within a loop until all bits have been flushed out. The blocks FLUSH7 (FIG. 37) and FLUSH8 (FIG. 38) include an appropriate decrement of CT by 7 or 8 bits. When completed, BP is incremented past the last byte stored and the final buffer can be sent out.

The software version of FINALBYTES-S (FIG. 36) only has to worry about shipping 7 or 8 bits according to whether the preceding byte is 'FF'. The preborrow was already handled in FLUSH-S. Since X was moved to the bottom of the interval, the test with A in BYTEOUT-S is irrelevant.

In FLUSH7 (FIG. 37) 7 bits are output for both the hardware and software versions by pointing to the new byte, storing bits 24-17, saving only the 17 least significant bits of X and decrementing CT by 7.

In FLUSH8 (FIG. 38) 8 bits are output for both the hardware and software versions by pointing to the new byte, storing bits 23-16, saving only the 16 least significant bits of X and decrementing CT by 8.

B. Detailed Dscription of the Decoder Operation.

Figure 49:
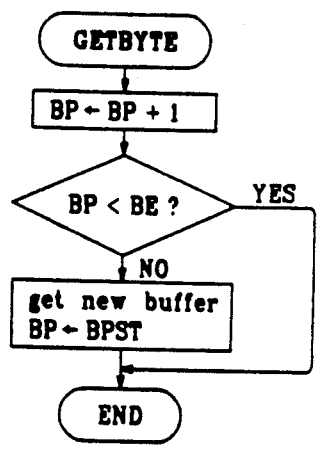

INITDEC (FIG. 39 and FIG. 40) does the initialization for the decoder. Two versions of INITDEC have been implemented according to whether the hardware (-H) movement of the code point for the MPS and LPS symbols shown in FIG. 2 or the software version (-S) shown in FIG. 3 is desired. After the tables are set up, all states are initialized as in the encoder. The initialization of X is from the buffer of compressed data. It is noted, however, that the magnitude of A is initialized to match to the encoder. Both versions start by getting a new buffer of compressed data. This is assumed to initialize BPST and LEN. BE is pointed to the end of the compressed buffer and BP is initialized to the start of the buffer. The differences between the versions appear in the initialization of X, A, and AMIN. For the hardware version the range A is initialized to '4000' and AMIN is initialized to '4000'. For the software version these numbers are negated. For INITDEC-H the first two bytes are positioned in L1 bits 31-16. For convenience in initialization, the two leading bits of the compressed data stream are defined to be 0. This provides a simple byte alignment between the code bytes and the bytes of the X register during initialization. The first byte is shifted into positions 31-24, the pointer BP is incremented in GETBYTE (FIG. 49) and then the second byte added into bits 23-16. The leading byte is guaranteed not to be 'FF' so no testing is needed. The decoding process only looks at the bits in XC, the high two bytes of X (bits 31-16). BYTEIN is used to position a third byte in bits 15-8 (unless the second byte was 'FF' in which case it is added into bits 16-7) BYTEIN sets the flag indicating when a new byte will be needed. The software version INITDEC-S (FIG. 40) starts at 0 minus A which is 'COOO' in XC. The first two bytes are added to this starting point. BYTEIN is used to add in the third byte and set the flag.

DECODE (FIG. 41) shows the two paths taken according to whether MPS is 1 or 0.

DECODEMPS1 (FIG. 42 and FIG. 43) shows two implementations for decoding when MPS=1. In the hardware version, the negative QO(S) is added to XC. If the result is greater than or equal to 0 the MPS path is followed. YN is set to one and A is decreased by adding the negative QQ(S). If a renormalization of A is necessary on the MPS path because A is less than AMIN, then the magnitude of QO(S) will be decreased in UPDATEMPS as well. On the LPS path YN is set to 0, XC restored by subtracting the negative QO(S), and A set to the negation of QO(S). Renormalization is always required on the LPS path, and the magnitude of QO(S) is increased in UPDATELPS. The software version in FIG. 43 decreases A in magnitude by subtracting the negative QO(S) before comparing XC to A. A then contains the negative MPS range. If XC is at least as large as A, the LPS is decoded; otherwise the MPS is decoded. If the LPS is decoded, the software version increases XC by subtracting the negative MPS range A. On the MPS path since both A and AMIN are negative, A greater than AMIN indicates that the magnitude of A is less than the magnitude of AMIN and renormalization is needed.

Figure 42:
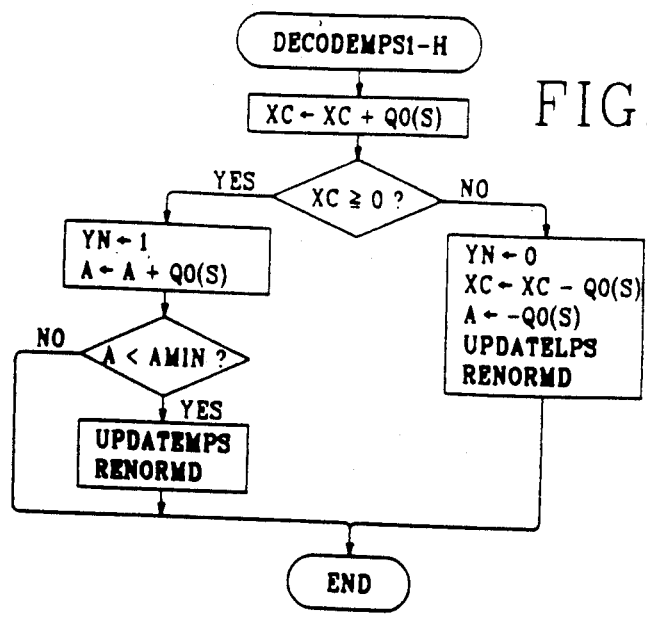
Figure 43:
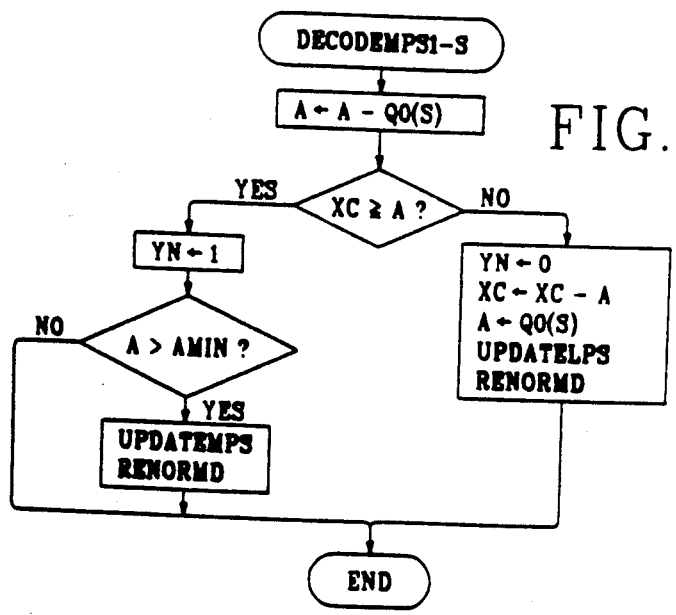
Figure 44:
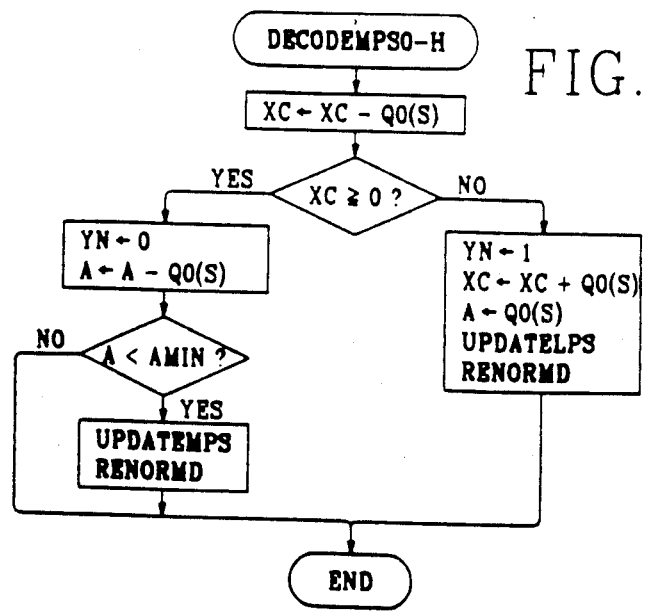
Figure 45:
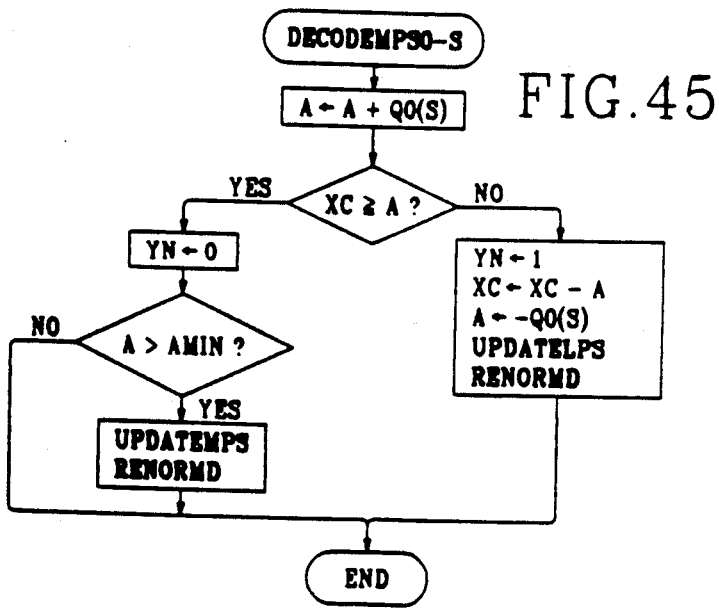

DECODEMPSO (FIG. 44 and FIG. 45) shows the same operations as FIG. 42 and FIG. 43 for the MPS=0 path. In this case, QO is positive.

Figure 46:
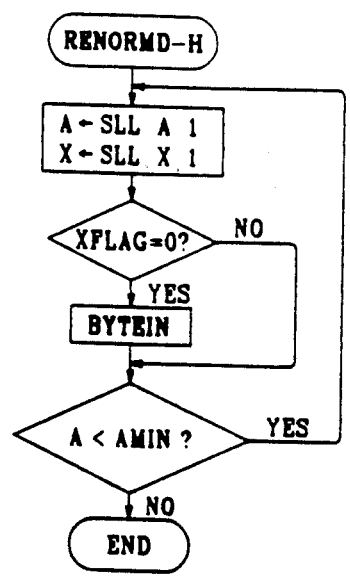
Figure 47:
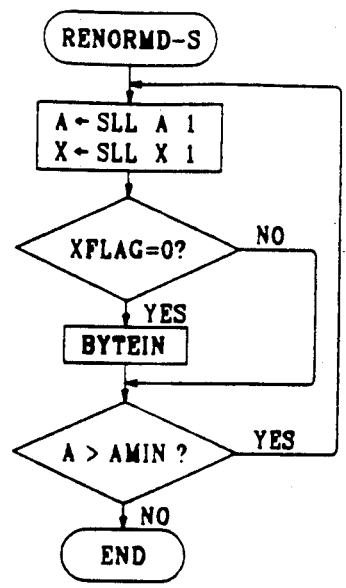

RENORMD (FIG. 46 and FIG. 47) each normalize the A and X values one bit at a time. Both A and X are shifted and then XFLAG, the least significant byte of X is tested to see if any bits are set. If not, it is time to get a new byte. This process is continued as long as A is less than AMIN (for hardware) or is more than AMIN (for software).

Figure 48:
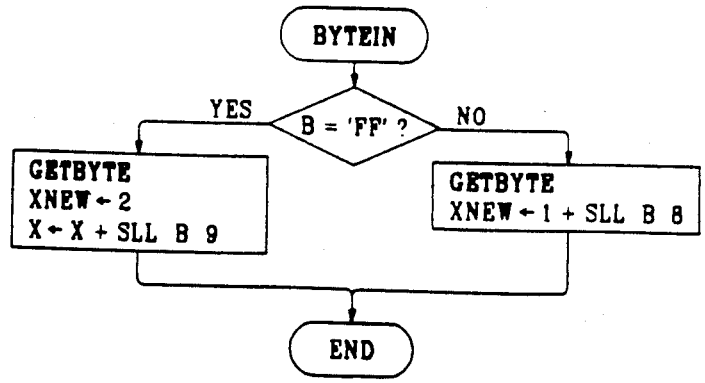

During the process of moving a new byte into X as shown in BYTEIN (FIG. 48) the last byte B is tested to see if it was an 'FF' byte before GETBYTE (FIG. 49) moves to the next byte. The leading bit in every byte following an 'FF' was inserted during encoding and must be appropriately accounted for during decoding. Following an 'FF', BYTEIN sets XNEW, the two least significant bytes of X, to 2 to shift the flag bit in XFLAG by 1. Then the next byte which would normally be placed in the second least significant byte is shifted up an extra bit and added to X. If the last byte B is not 'FF' the least significant bit of XNEW is set and the new byte B is added to the high order byte of XNEW.

GETBYTE (FIG. 49) moves BP to address the next byte in the compressed data buffer. If, after it is incremented, BP is not less than the end of the buffer, a new buffer must be obtained and BP reset to the start of the buffer. It is assumed that BPST and BE will be appropriately changed if necessary.

The above-described procedures for a software encoder are implementable on a conventional mainframe computer, for example an IBM 3370, or in personal computers such as the IBM PC-XT or PC-AT. The procedures can be implemented in high level languages such as PASCAL.

VI. Description of a Hardware Embodiment

Figure 50:
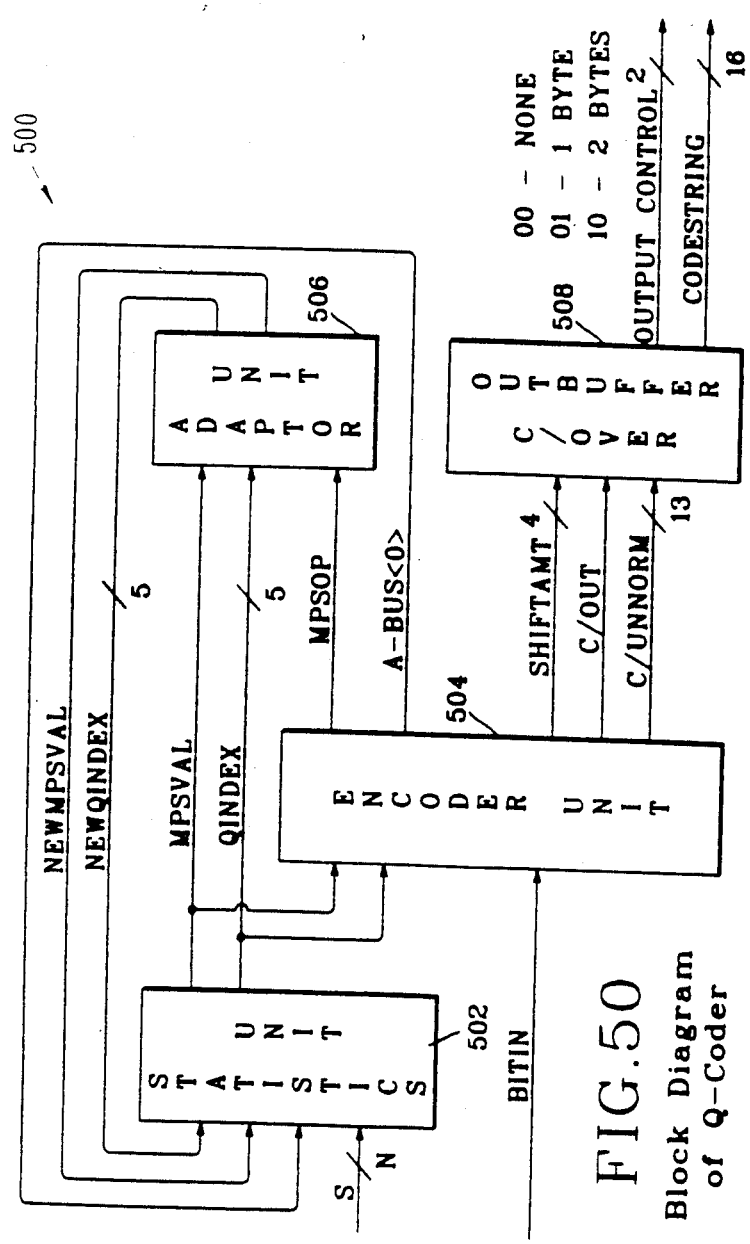
FIG. 50 is a general block diagram showing the major components of a hardware Q-Coder in accordance with the invention.

As shown in FIG. 50 the Q-Coder 500 is supplied an appropriate N bit state S by an encoder state generator model (see FIG. 1) for each binary event BITIN encoded. The output of the Q-Coder 500 is bytes of compressed data which are transmitted and/or stored before becoming input to a Q-Decoder (see FIG. 54). The Q-Decoder determines the boolean value of the binary event BITOUT based on the N bit input state S from the decoder state generator model. This decoded BITOUT value is fed-back to the decoder state generator (not shown).

The Q-Coder/Q-Decoder system performs one major cycle per binary event to be encoded. Timing is determined by edge-triggered flip-flops and a single phase clocked system. The time between clock edges is sufficiently long that worst-case propagation delays and set-up time requirements have been met.

This description discusses what occurs on each major cycle. FIG. 50 gives a block diagram of the Q-Coder 500. For each new cycle, the primary inputs to the Q-Coder 500 are the binary event value BITIN and the state S which specifies where the information about the probability has been stored. At the end of the cycle the OUTPUT CONTROL from a C/OVER outbuffer 508 specifies whether zero, one, or two bytes of compressed data are ready in the 16 bits of the CODESTRING.

One input to the statistics unit 502 is the N bit state S which is used to address the conditioning context storage in order to obtain the most probable symbol value MPSVAL and the QINDEX for the current binary decision BITIN. QINDEX is a sequence of integers and is the index to one of a set of probability estimates for the less probable symbol. In the embodiment, QINDEX ranges from 0 to 29. The statistics unit 502 outputs MPSVAL and QINDEX early in the cycle so that these parameters are available for input to both the encoder unit 504 (FIG. 41) and an adaptor unit 506. Late in the cycle the statistics unit 502 stores the NEWMPSVAL and NEWQINDEX at the location specified by the state S, provided that the input A-BUS<0> (the most significant bit of the A-BUS) was zero for some interval during the cycle. The operation of the statistics unit 502 is the same for both the encoder and the decoder.

The adaptor unit 506 is also the same for the encoder and decoder. The operations in this unit are given in Table 4. The same function can be achieved with discrete logic. The binary event BITIN is input to the encoder unit 504 along with MPSVAL and QINDEX. One output from the encoder unit 504 is the binary (Boolean) signal A-BUS<0>, the most significant bit of the A-BUS. This signals to the statistics unit 502 that it is time to change QINDEX or MPSVAL. The adaptor unit 506 receives the "MPSOP" Boolean signal from the encoder unit 504 which indicates whether the current decision is an MPS operation or not. The output of the adaptor unit 506 is the new values for the two inputs from the statistics unit 502. The statistics unit 502 will only store the new values if A-BUS<0> has been zero.

The C/OVER-outbuffer 508 performs bit stuffing for carries on the same cycle as the encoder unit 504 and adaptor unit 506, or it can operate in a pipelined fashion. As a unit of a pipeline, flip-flops store the encoder output each cycle such that on cycle "n" the system would have the C/OVER-outbuffer 508 functioning on the encoder unit 504 output of cycle "n−1".

There are two types of major cycles: MPS operation and LPS operation, respectively denoted by MPSOP equal 1 and MPSOP equal 0. If the BITIN value and MPSVAL value are the same, the operation is an MPS operation, otherwise it is an LPS operation. The Exclusive-OR gate in FIG. 51 acting on BITIN and MPSVAL determines the type of operation for the Major Cycle.

During a cycle, the encoder unit 504 outputs to the C/OVER-outbuffer 508 the binary carry out value C/OUT, the 13-bit unnormalized code stream C-UNNORM, and the 4-bit control signal SHIFTAMT which indicates how much to shift the code stream. The C/OVER-outbuffer 508 outputs one or two 8-bit byte quantities, and a control signal indicating whether 0, 1, or 2 bytes are to be shipped.

The statistics unit 502 and adaptor unit 506 are identical in both the Q-Coder and Q-Decoder.

Figure 51:
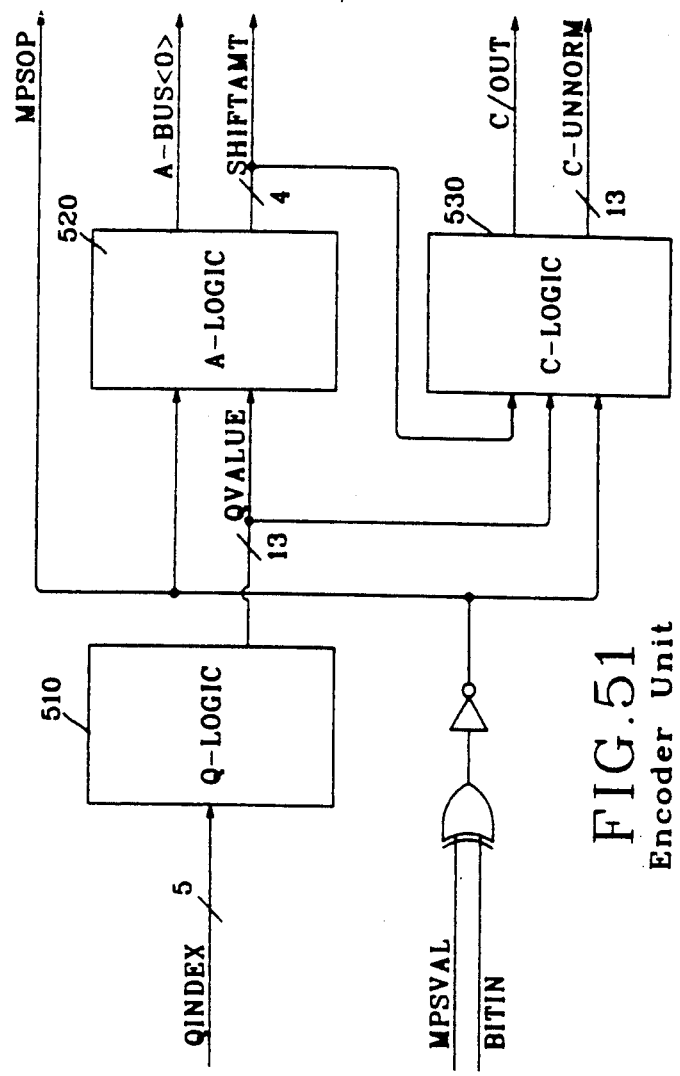
FIG. 51 through FIG. 53 are illustrations showing elements of the Q-Coder in detail.

A more detailed block diagram of the encoder unit 504 is given in FIG. 51. Arithmetic coding of the type discussed here forms the code string by adding and shifting. The quantities that are added are "augends". Input QINDEX is related to the augend. The QVALUE values are in one-to-one correspondence with the QINDEX values, where QVALUE is the augend of the arithmetic coding process for the hardware embodiment of the Q-coder. The encoder unit 504 only requires QVALUE and not QINDEX. In the present embodiment, since QINDEX is a 5-bit quantity and QVALUE is 12 significant bits plus a leading 0, it is less expensive to store QINDEX. Also, it is convenient for the adaptor unit 506 to manipulate QINDEX.

The conversion of QINDEX to QVALUE is performed by Q-LOGIC 510 for both the encoder and decoder. The conversion can be done by Table 5 or by a combinational circuit using the truth table methods appearing in current textbooks. Note that the most significant bit of QVALUE is always zero and the least significant bit is always 1.

The Q-coder uses two registers called the A-Register 528 and the C-Register 534. The C-Register is functionally equivalent to the X-Register used in the software flowcharts. The logic which modifies the contents of the A-Register 528 is shown in the more detailed diagram of the block A-Logic 520 in FIG. 52. Based on the input MPSOP, the A-MUX 522 selects QVALUE for an LPS operation (0) or QVALUE subtracted from A-Register 528 for an MPS operation (1). The Priority Encoder 524 counts the number of leading zeros on the A-BUS and generates the amount of shift SHIFTAMT needed to restore a 1 to the most significant bit of A-BUS. This shift is done in the A-Shifter 526. The least significant bits are filled with zeros as needed. Table 6 shows the values of SHIFTAMT as a function of A-BUS. Dashes indicate "don't care" bits. The A-Register 528 is clocked late in the cycle after all values have stabilized. Its contents are supplied to A-Subtractor 529.

The shifting out of the code stream, specifically via the C-Register 534, is controlled by the A-Register 528 in the following way. When the A-Register 528 must shift left a given number of bit positions, then the C-Register 534 is left-shifted by the same number of bits. At the beginning of each major cycle, the A register must be normalized, i.e. the value in the A register must equal or exceed a lower bound value. If this condition—as discussed above—is not satisfied, A is renormalized (by left shifts). (A is initialized to the lower bound LB.) The A-Register 528 shifts occur during major cycles for which the operation on the A-Register 528 causes it to fall below the lower bound. Falling below the lower bound is detected by the most significant bit of the A-BUS; A-BUS<0> becomes zero.

Figure 52:
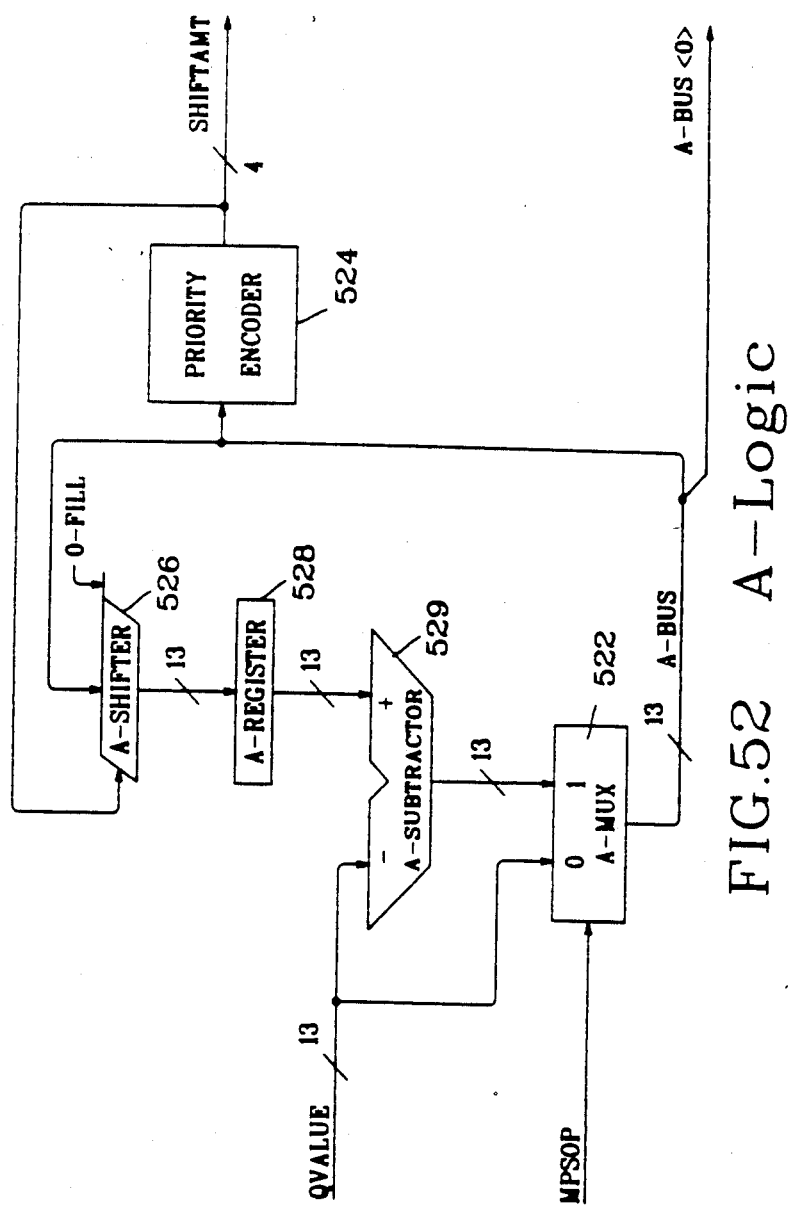

For an MPS operation, QVALUE is subtracted from the A-Register 528, with the difference renormalized if necessary and returned to the A-Register 528. On an LPS operation, the normalized value of QVALUE is placed in the A-Register 528. In FIG. 52, the subtraction of QVALUE from the A-Register 528 for MPSOP is performed in the unit A-Subtractor, whose output passes through a 2-by-1 data selector called A-MUX. For an LPSOP, QVALUE passes through the data selector A-MUX 522, whose output bus is called ABUS. The subtraction can cause the result ABUS to fall below value LB. In the instant embodiment, the value of LB is chosen such that if ABUS<0> is 0, then at least one renormalization shift must occur. In fact, the number of renormalization shifts that ABUS must undergo is the number of leading 0s in the result on ABUS. ABUS is renormalized in unit A-Shifter 526, which is a barrel left-shifter with zero-fill. The number of bit positions shifted out of ABUS depends on the number of leading zeros on ABUS. The A-Shifter control, SHIFTAMT, is a 4-bit number between 0 and 12. When the ABUS needs no renormalization, SHIFTAMT is 0 and ABUS passes straight through. The control signal SHIFTAMT feeding the shifter is determined via Priority Encoder 524 which encodes the number of leading 0s on the ABUS bus. During an MPSOP, A-MUX 522 feeds the A-Register minus QVALUE to the ABUS, and during an LPSOP, data selector A-MUX 522 feeds QVALUE. The value SHIFTAMT also controls the C-Register 534 portion of the encoder, and is a control signal to the C/OVER-outbuffer 508 unit.

For a MPSOP, the C-Register 534 and QVALUE are summed in C-Adder 536 giving the MPS result for the C-BUS. For an LPSOP, the C-MUX 532 feeds the C-Register 534 to the C-BUS. The C/OUT is fed to the C/OVER-outbuffer 508 unit. The summation of QVALUE to C-Register 534 may be performed concurrently (as in this embodiment) with the subtraction of QVALUE from the A-Register 528. The C-BUS must be shifted by the same SHIFTAMT as the ABUS, hence the output of unit Priority Encoder 524, SHIFTAMT, is also fed to the C-Shifter. On MPSOP cycles, the 2-by-1 data selector C-MUX passes C-BUS to the C-Shifter left-shifting barrel shifter unit which is a twin to the A-Shifter unit. The output of the C-Shifter, is sent back to the C-Register 534. The output of C-MUX (unshifted), named C-UNNORM, is sent to the C/OVER-outbuffer 508 unit, as is SHIFTAMT. SHIFTAMT tells the C/OVER-outbuffer 508 unit how many of the leading bits of C-UNNORM to take.

For an LPSOP, the C-Register 534 is not added to, only shifted. On LPSOP cycles, the C-MUX control signal selects the C-Register 534 itself to feed the C-Shifter, where it is left-shifted by SHIFTAMT bits, and then returned to the C-Register 534. As before, SHIFTAMT and C-UNNORM (the output of C-MUX) feeds the C/OVER-outbuffer 508 unit. C/OUT must be 0 at this point in time, because nothing is being added to C.

The purpose of the adaptor unit 506 is to adjust the coding parameters employed for a particular context, based on the relative frequency of the incoming 0s and 1s.

Figure 53:
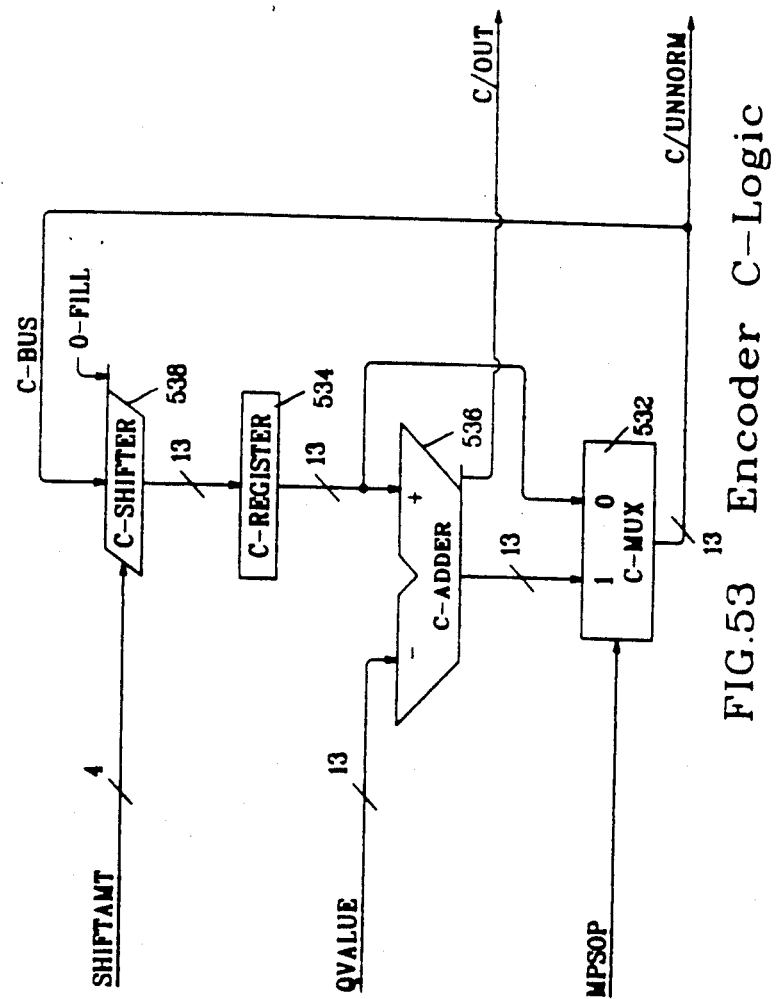

In the code described, the A-Register 528 and C-Register 534 are both 13 bits in length, and we denote the bit positions 0, 1, . . . , 12, where position 0 is the most significant and 12 the least significant. It is convenient to view a radix point between positions 0 and 1 of the A-Register 528, so that with bit A<0> a "1", the A-Register value is between 1.0 and less than 2.0. Value LB is 1.0. The QVALUES are all less than 1.0, but some are close to 0.5, so the range of values for QVALUE has 12 significant bits. Bit position C<0> is never directly added into, since the corresponding bit position in QVALUE is known to be 0. Thus, C<0> can only be changed during an MPSOP cycle by being carried into. By the nature of arithmetic coding, the value of the codestring after any major cycle can never exceed the sum of the current A-Register 528 value and the codestring to include the current C-Register 534 value. Thus, once a carry-out from C<0> occurs, there will never again be another carry to that bit position of the codestring. The encoder C-Logic 530 block is shown in FIG. 53. The input MPSOP with the C-MUX 532 selects the contents of C-Register 534 for an LPS operation (0) or QVALUE added to the content of C-Register 534 for an MPS operation (1) by adder 536. The thirteen bits of output from the C-MUX 532 are output (before renormalization ) as the C/UNNORM signal. The same data on the C-BUS is input to a C-Shifter 538 so that it can be shifted by SHIFTAMT before being clocked into the C-Register 534 late in the cycle. Zeroes are filled into the least significant bits during the shifting process as needed.

Figure 54:
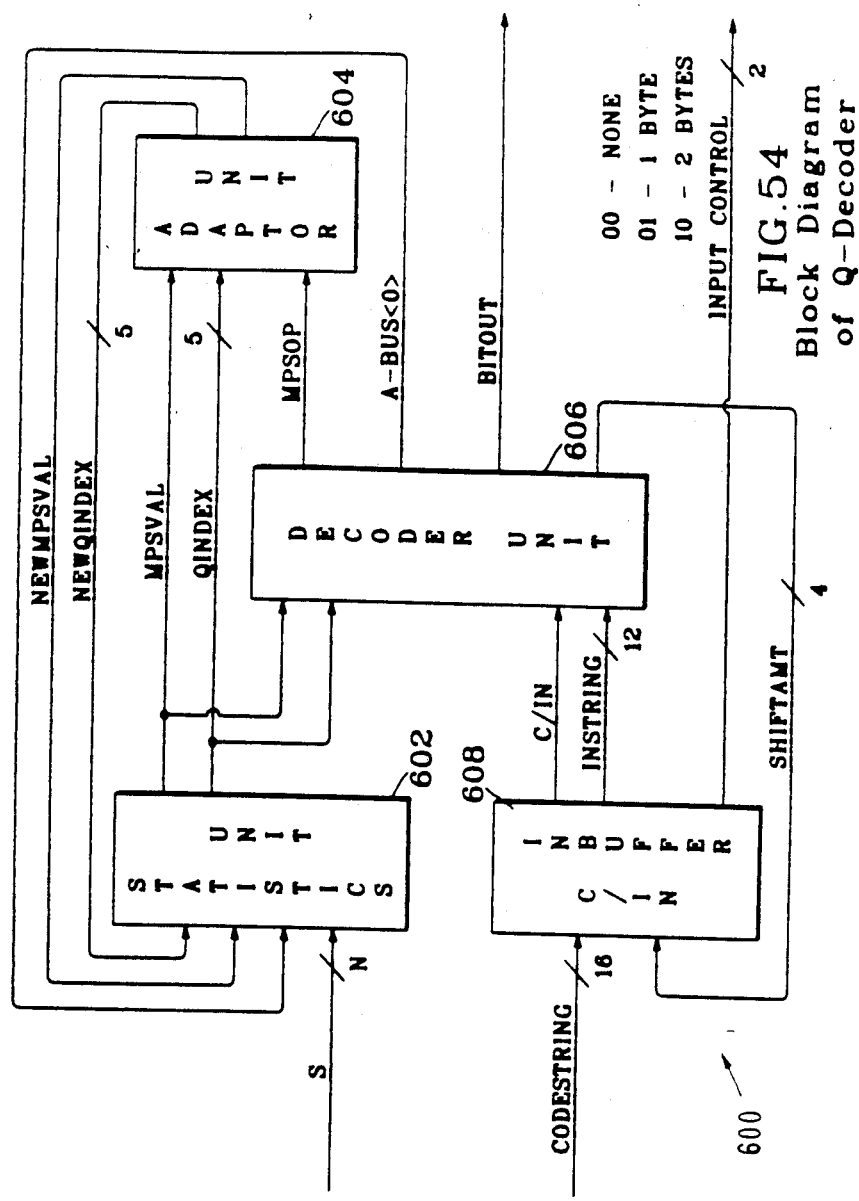
FIG. 54 is a general block diagram showing the major components of a hardware Q-Decoder in accordance with the invention.
Figure 55:
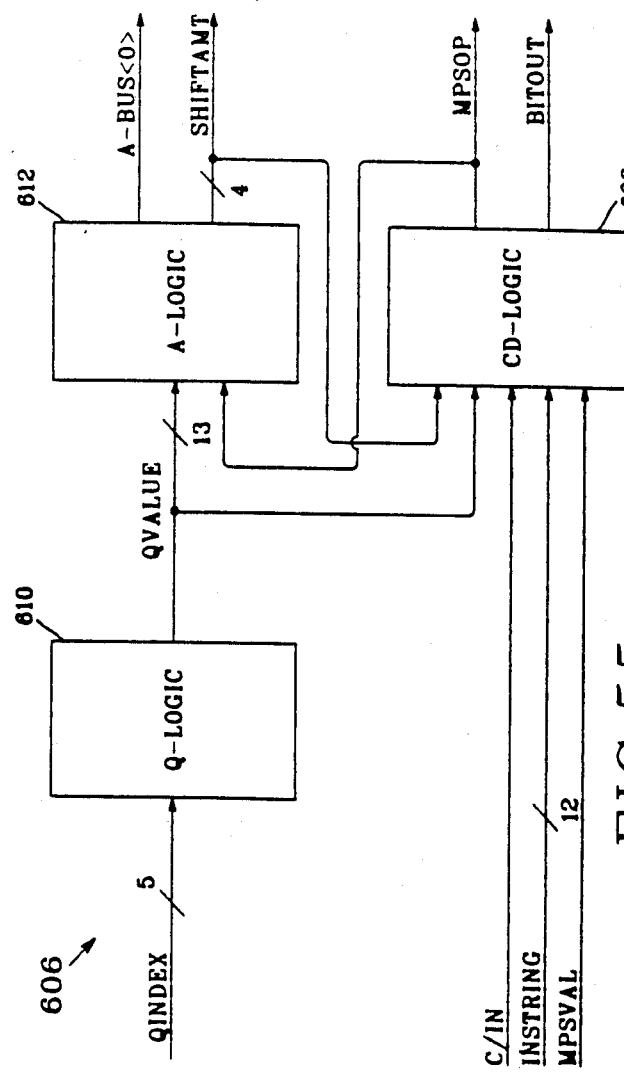
FIG. 55 and FIG. 56 are illustrations showing elements of the Q-Decoder in detail.

The Q-Decoder 600 of FIG. 54 includes a statistics unit 602, adaptor unit 604, decoder unit 606, and C/IN Inbuffer 608 which accounts carries in the code stream. Elements 602 and 604 are identical to the similarly named units in the Q-Coder 500. The decoder unit 606 is shown in detail in FIG. 55. The decoder unit 606 includes CD-logic 608, Q-logic 610, and A-logic 612.

Figure 56:
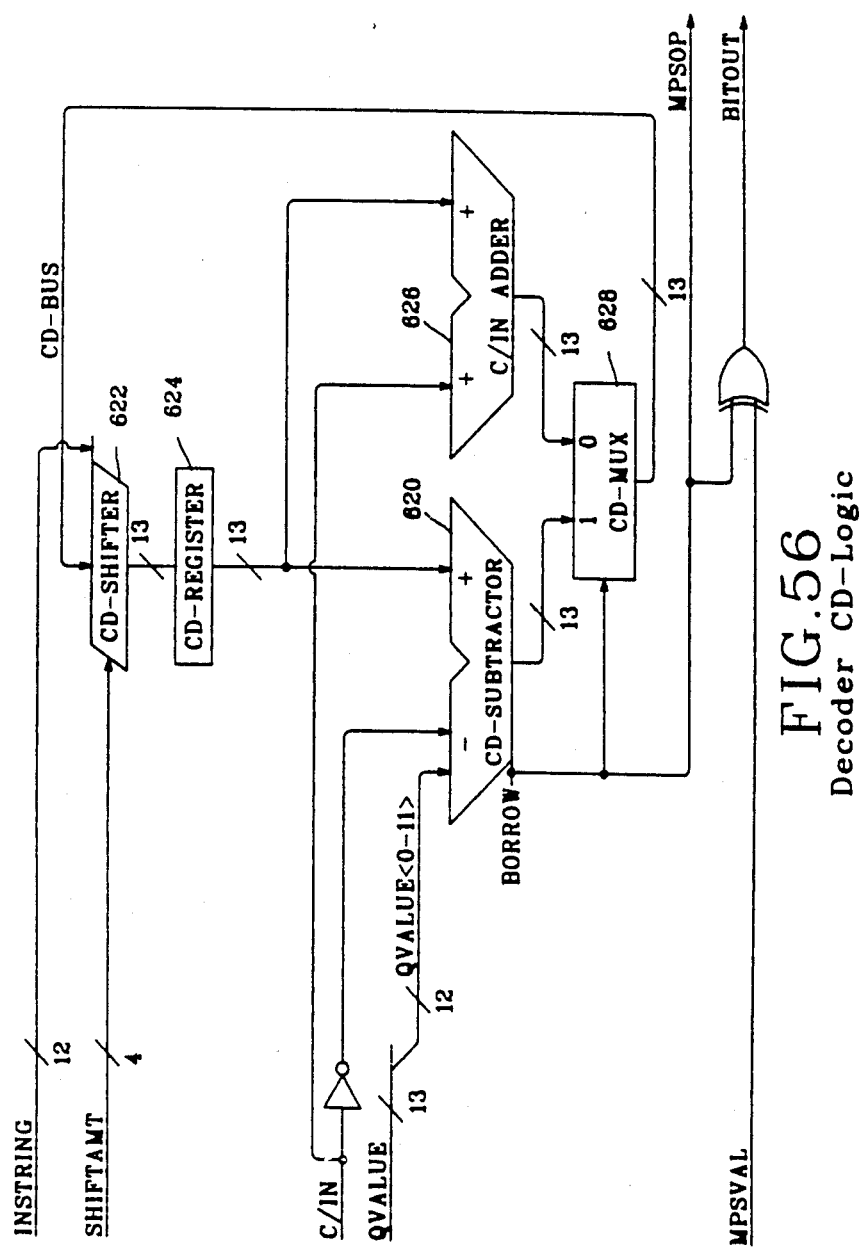

The decoder CD-Logic 608 is shown in FIG. 56. The least significant bit of QVALUE (which is always 1) minus the carry-in C/IN will be 1 if C/IN is 0 and 0 if C/IN is 1. Therefore, QVALUE minus C/IN is obtained by substituting the inverse of C/IN for the least significant bit of QVALUE. If the result of subtracting QVALUE minus C/IN from the contents of the CD-Register 624 in the CD-Subtractor 620 is positive, then an MPS has been decoded and that result will be fed to the CD-Shifter 622 on the CD-BUS. The MPSOP signal is 1. Otherwise an LPS occurred and the contents of the CD-Register 624 plus C/IN output of Adder 626 will be selected by the MPSOP of 0 at CD-MUX 628. The BITOUT value is obtained by Exclusive OR-ing the MPSOP signal with the MPSVAL. The shift amount SHIFTAMT determines how much the CD- BUS value must be shifted before it will be ready to be stored in the CD-Register 624.

The least significant bits are filled with the most significant bits of INSTRING during shifting.

The CD-Register 624 in effect contains the current code value relative to the bottom of the current interval. The high order 12 bits of the 13 bit QVALUE (the most significant bit is zero) are fed to the CD-Subtractor 620. The least significant bit of QVALUE is replaced with a bit derived from C/IN. Since the least significant bit of the QVALUE is always 1, when C/IN is zero (no carry) the value is inverted to become the least significant bit of QVALUE for the CD-Subtractor 620, and is also fed directly without inversion to the C/IN-Adder. The carry is thus in parallel added to the code stream and removed from QVALUE before QVALUE is subtracted from the code value. The BORROW from the CD-Subtractor 620 is the decoded MPS/LPS decision, MPSOP. The value of BITOUT is then obtained by exclusive or of MPSOP and MPSVAL. FIG. 56 also shows the CD-Register 624 data path. Although bit CD-BUS<0> is not directly subtracted from, it must be present because a shifting operation may shift a '1' value into CD-BUS<0>. SHIFTAMT, obtained from the A-Logic circuit, is the control input to the left-shifting CD-Shifter 622. The low-order "fill" bits for the shifter come from bus INSTRING that emanates from the C/IN-Inbuffer unit.

The Decoder Unit 606 (FIG. 55) uses up to 12 bits from INSTRING plus the carry input C/IN signal to decompress the data. The MPSVAL and QINDEX values are also needed as input to decode the output bit BITOUT. The Decoder Unit 606 supplies the statistics unit 602 with the A-BUS<0> signal as in the encoder.

VII. Escaping from the arithmetic code stream

In many coding environments, it is desirable to provide an escape from the code stream that can be detected independent of the arithmetic decoder. Hereinbelow is a discussion of escape based on the allocation of spacer bit positions in the encoder code stream register X. The inclusion of spacer bits, in effect, delays the time at which xxxx . . . bits are shifted into a next byte portion of the X register identified by bit positions bbb . . . . By including the spacer bits, certain bit patterns after a Hex 'FF' byte are illegal and hence suggest an escape from the code stream and the insertion of a control word. (The control word is typically withdrawn by a controller device prior to decoding.) In addition, the use of spacer bits obviates the possibility of getting more than one carry beyond the byte in next byte portion of the code stream register.

The bit pattern of the X register holding the partially completed next byte of the code stream is bit aligned with the with the (augend) register A which contains the value of the current interval. For a 12-bit integer representation of the probabilities, one possible bit assignment in the encoder registers would be:

X = 00000000 0cbbbbbb bbss.xxxx xxxxxxxx

A = 00000000 00000000 000a.aaaa aaaaaaaa where '0' indicates zero bits, c is a carry receiver bit, 'b' labels bits in the positions where the next code byte is generated, 's' indicates spacer bits needed to limit carry propagation, and x represents the binary fraction still being developed in the X register. The 'a' bits represent the single integer bit and the fractional bits in the A register. If the preceding code byte is Hex 'FF', the bit positioning is shifted by 1 bit, such that the carry bit occupies the stuff bit position of the next byte. For that special case, X = 00000000 00cbbbbb bbss.xxxx xxxxxxxx Note that only seven 'b' bits are defined for this special case.

Following the removal of a fully developed code byte, the rules for bit positioning and renormalization dictate an upper bound on the values in the two registers:

X = 00000000 00000000 0011.1111 11111111

A = 00000000 00000000 0001.1111 11111110

Note that as future events are coded the value in the X register can never reach the sum of the current X value and the A value, multiplied by any renormalization factor. Therefore, an upper bound on the code register is

X = SLL (00000000 00000000 0101.1111 11111101) N where N is the renormalization shift count and SLL stands for a 'shift left logical' operation. When the byte is complete, N will be 8 when the previous byte is not 'FF' and 7 when it L is 'FF'. Therefore, following the 'FF', the upper bound on the X register is:

X = 00000000 00101111 1111.1110 10000000

X = 00000000 00cbbbbb bbss.xxxx xxxxxxxx

Therefore, the maximum value of a data byte following a Hex 'FF' is Hex 'BF' if two spacer bits are included. Further it is noted that if only one spacer bit is allowed, the maximum value for the byte after a 'FF' will be 'FF' and if three spacer bits are allowed, it will be '9F'. Thus, with two or more spacer bits, illegal codes following the 'FF' byte provide an escape from the arithmetic code stream.

A two bit shift in the alignment of the A and X registers (as is shown in the flowcharts and Tables 2 and 3) shifts the byte which is to be removed from the code register to a byte boundary of the X registers. This shift does not change the escape code structure.

While the invention has been described with reference to preferred embodiments thereof, it will be understood by those skilled in the art that various changes in form and details may be made without departing from the scope of the invention.

TABLE 1

| Qe | I(dQ) |
|---|---|
| hex 0ac1 | 2 |
| hex 0a81 | 2 |
| hex 0a01 | 2 |
| hex 0901 | 2 |
| hex 0701 | 2 |
| hex 0681 | 2 |
| hex 0601 | 2 |
| hex 0501 | 4 |
| hex 0481 | 4 |
| hex 0441 | 4 |
| hex 0381 | 4 |
| hex 0301 | 4 |
| hex 02c1 | 4 |
| hex 0281 | 4 |

TABLE 1-continued

| Qe | I(dQ) |
|---|---|
| hex 0241 | 4 |
| hex 0181 | 4 |
| hex 0121 | 4 |
| hex 00e1 | 4 |
| hex 00a1 | 4 |
| hex 0071 | 4 |
| hex 0059 | 4 |
| hex 0053 | 4 |
| hex 0027 | 4 |
| hex 0017 | 4 |
| hex 0013 | 6 |
| hex 000b | 4 |
| hex 0007 | 6 |
| hex 0005 | 4 |
| hex 0003 | 6 |
| hex 0001 | 4 |

TABLE 2

| q0 | qi0 / i0 |
|---|---|
| hex d4fc | hex 0078 |
| hex 2b04 | hex 0000 |
| hex 2a04 | hex 0004 |
| hex 2804 | hex 0008 |
| hex 2404 | hex 000c |
| hex 1c04 | hex 0010 |
| hex 1a04 | hex 0014 |
| hex 1a04 | hex 0014 |
| hex 1804 | hex 0018 |
| hex 1404 | hex 001c |
| hex 1204 | hex 0020 |
| hex 1104 | hex 0024 |
| hex 0e04 | hex 0028 |
| hex 0c04 | hex 002c |
| hex 0b04 | hex 0030 |
| hex 0a04 | hex 0034 |
| hex 0904 | hex 0038 |
| hex 0604 | hex 003c |
| hex 0484 | hex 0040 |
| hex 0384 | hex 0044 |
| hex 0284 | hex 0048 |
| hex 01c4 | hex 004c |
| hex 0164 | hex 0050 |
| hex 014c | hex 0054 |
| hex 014c | hex 0054 |
| hex 005c | hex 005c |
| hex 005c | hex 005c |
| hex 002c | hex 0064 |
| hex 002c | hex 0064 |
| hex 0014 | hex 006c |
| hex 2b04 | hex 0000 |
| hex d4fc | hex 0078 |
| hex d5fc | hex 007c |
| hex d7fc | hex 0080 |
| hex dbfc | hex 0084 |
| hex e3fc | hex 0088 |
| hex e5fc | hex 008c |
| hex e5fc | hex 008c |
| hex e7fc | hex 0090 |
| hex ebfc | hex 0094 |
| hex edfc | hex 0098 |
| hex eefc | hex 009c |
| hex f1fc | hex 00a0 |
| hex f3fc | hex 00a4 |
| hex f4fc | hex 00a8 |
| hex f5fc | hex 00ac |
| hex f6fc | hex 00b0 |
| hex f9fc | hex 00b4 |
| hex fb7c | hex 00b8 |
| hex fc7c | hex 00bc |
| hex fd7c | hex 00c0 |
| hex fe3c | hex 00c4 |
| hex fe9c | hex 00c8 |
| hex feb4 | hex 00cc |
| hex feb4 | hex 00cc |
| hex ffa4 | hex 00d4 |
| hex ffa4 | hex 00d4 |
| hex ffd4 | hex 00dc |

TABLE 2-continued

| q0 | qi0 / i0 |
|---|---|
| hex ffd4 | hex 00dc |
| hex ffec | hex 00e4 |

TABLE 3

| q0 | qi0 / i0 |
|---|---|
| hex 2a04 | hex 0004 |
| hex 2804 | hex 0008 |
| hex 2404 | hex 000c |
| hex 1c04 | hex 0010 |
| hex 1a04 | hex 0014 |
| hex 1804 | hex 0018 |
| hex 1404 | hex 001c |
| hex 1204 | hex 0020 |
| hex 1104 | hex 0024 |
| hex 0e04 | hex 0028 |
| hex 0c04 | hex 002c |
| hex 0b04 | hex 0030 |
| hex 0a04 | hex 0034 |
| hex 0904 | hex 0038 |
| hex 0604 | hex 003c |
| hex 0484 | hex 0040 |
| hex 0384 | hex 0044 |
| hex 0284 | hex 0048 |
| hex 01c4 | hex 004c |
| hex 0164 | hex 0050 |
| hex 014c | hex 0054 |
| hex 009c | hex 0058 |
| hex 005c | hex 005c |
| hex 004c | hex 0060 |
| hex 002c | hex 0064 |
| hex 001c | hex 0068 |
| hex 0014 | hex 006c |
| hex 000c | hex 0070 |
| hex 0004 | hex 0074 |
| hex 0004 | hex 0074 |
| hex d5fc | hex 007c |
| hex d7fc | hex 0080 |
| hex dbfc | hex 0084 |
| hex e3fc | hex 0088 |
| hex e5fc | hex 008c |
| hex e7fc | hex 0090 |
| hex ebfc | hex 0094 |
| hex edfc | hex 0098 |
| hex eefc | hex 009c |
| hex f1fc | hex 00a0 |
| hex f3fc | hex 00a4 |
| hex f4fc | hex 00a8 |
| hex f5fc | hex 00ac |
| hex f6fc | hex 00b0 |
| hex f9fc | hex 00b4 |
| hex fb7c | hex 00b8 |
| hex fc7c | hex 00bc |
| hex fd7c | hex 00c0 |
| hex fe3c | hex 00c4 |
| hex fe9c | hex 00c8 |
| hex feb4 | hex 00cc |
| hex ff64 | hex 00d0 |
| hex ffa4 | hex 00d4 |
| hex ffb4 | hex 00d8 |
| hex ffd4 | hex 00dc |
| hex ffe4 | hex 00e0 |
| hex ffec | hex 00e4 |
| hex fff4 | hex 00e8 |
| hex fffc | hex 00ec |
| hex fffc | hex 00ec |

TABLE 4

Operation of the ADAPTER UNIT

| INPUTS | | | OUTPUTS | |
|---|---|---|---|---|
| MPSOP | MPSVAL | QINDEX | NEWMPSVAL | NEWQINDEX |
| 0 | 0 | 0 | 1 | 0 |
| 0 | 0 | 1 | 0 | 0 |
| 0 | 0 | 2 | 0 | 1 |

TABLE 4-continued

Operation of the ADAPTER UNIT

| INPUTS | | | OUTPUTS | |
|---|---|---|---|---|
| MPSOP | MPSVAL | QINDEX | NEWMPSVAL | NEWQINDEX |
| 0 | 0 | 3 | 0 | 2 |
| 0 | 0 | 4 | 0 | 3 |
| 0 | 0 | 5 | 0 | 4 |
| 0 | 0 | 6 | 0 | 5 |
| 0 | 0 | 7 | 0 | 5 |
| 0 | 0 | 8 | 0 | 6 |
| 0 | 0 | 9 | 0 | 7 |
| 0 | 0 | 10 | 0 | 8 |
| 0 | 0 | 11 | 0 | 9 |
| 0 | 0 | 12 | 0 | 10 |
| 0 | 0 | 13 | 0 | 11 |
| 0 | 0 | 14 | 0 | 12 |
| 0 | 0 | 15 | 0 | 13 |
| 0 | 0 | 16 | 0 | 14 |
| 0 | 0 | 17 | 0 | 15 |
| 0 | 0 | 18 | 0 | 16 |
| 0 | 0 | 19 | 0 | 17 |
| 0 | 0 | 20 | 0 | 18 |
| 0 | 0 | 21 | 0 | 19 |
| 0 | 0 | 22 | 0 | 20 |
| 0 | 0 | 23 | 0 | 21 |
| 0 | 0 | 24 | 0 | 21 |
| 0 | 0 | 25 | 0 | 23 |
| 0 | 0 | 26 | 0 | 23 |
| 0 | 0 | 27 | 0 | 25 |
| 0 | 0 | 28 | 0 | 25 |
| 0 | 0 | 29 | 0 | 27 |
| 0 | 1 | 0 | 0 | 0 |
| 0 | 1 | 1 | 1 | 0 |
| 0 | 1 | 2 | 1 | 1 |
| 0 | 1 | 3 | 1 | 2 |
| 0 | 1 | 4 | 1 | 3 |
| 0 | 1 | 5 | 1 | 4 |
| 0 | 1 | 6 | 1 | 5 |
| 0 | 1 | 7 | 1 | 5 |
| 0 | 1 | 8 | 1 | 6 |
| 0 | 1 | 9 | 1 | 7 |
| 0 | 1 | 10 | 1 | 8 |
| 0 | 1 | 11 | 1 | 9 |
| 0 | 1 | 12 | 1 | 10 |
| 0 | 1 | 13 | 1 | 11 |
| 0 | 1 | 14 | 1 | 12 |
| 0 | 1 | 15 | 1 | 13 |
| 0 | 1 | 16 | 1 | 14 |
| 0 | 1 | 17 | 1 | 15 |
| 0 | 1 | 18 | 1 | 16 |
| 0 | 1 | 19 | 1 | 17 |
| 0 | 1 | 20 | 1 | 18 |
| 0 | 1 | 21 | 1 | 19 |
| 0 | 1 | 22 | 1 | 20 |
| 0 | 1 | 23 | 1 | 21 |
| 0 | 1 | 24 | 1 | 21 |
| 0 | 1 | 25 | 1 | 23 |
| 0 | 1 | 26 | 1 | 23 |
| 0 | 1 | 27 | 1 | 25 |
| 0 | 1 | 28 | 1 | 25 |
| 0 | 1 | 29 | 1 | 27 |
| 1 | 0 | 0 | 0 | 1 |
| 1 | 0 | 1 | 0 | 2 |
| 1 | 0 | 2 | 0 | 3 |
| 1 | 0 | 3 | 0 | 4 |
| 1 | 0 | 4 | 0 | 5 |
| 1 | 0 | 5 | 0 | 6 |
| 1 | 0 | 6 | 0 | 7 |
| 1 | 0 | 7 | 0 | 8 |
| 1 | 0 | 8 | 0 | 9 |
| 1 | 0 | 9 | 0 | 10 |
| 1 | 0 | 10 | 0 | 11 |
| 1 | 0 | 11 | 0 | 12 |
| 1 | 0 | 12 | 0 | 13 |
| 1 | 0 | 13 | 0 | 14 |
| 1 | 0 | 14 | 0 | 15 |
| 1 | 0 | 15 | 0 | 16 |
| 1 | 0 | 16 | 0 | 17 |
| 1 | 0 | 17 | 0 | 18 |
| 1 | 0 | 18 | 0 | 19 |
| 1 | 0 | 19 | 0 | 20 |
| 1 | 0 | 20 | 0 | 21 |
| 1 | 0 | 21 | 0 | 22 |
| 1 | 0 | 22 | 0 | 23 |
| 1 | 0 | 23 | 0 | 24 |
| 1 | 0 | 24 | 0 | 25 |
| 1 | 0 | 25 | 0 | 26 |
| 1 | 0 | 26 | 0 | 27 |
| 1 | 0 | 27 | 0 | 28 |
| 1 | 0 | 28 | 0 | 29 |
| 1 | 0 | 29 | 0 | 29 |
| 1 | 1 | 0 | 0 | 1 |
| 1 | 1 | 1 | 0 | 2 |
| 1 | 1 | 2 | 0 | 3 |
| 1 | 1 | 3 | 0 | 4 |
| 1 | 1 | 4 | 0 | 5 |
| 1 | 1 | 5 | 0 | 6 |
| 1 | 1 | 6 | 0 | 7 |
| 1 | 1 | 7 | 0 | 8 |
| 1 | 1 | 8 | 0 | 9 |
| 1 | 1 | 9 | 0 | 10 |
| 1 | 1 | 10 | 0 | 11 |
| 1 | 1 | 11 | 0 | 12 |
| 1 | 1 | 12 | 0 | 13 |
| 1 | 1 | 13 | 0 | 14 |
| 1 | 1 | 14 | 0 | 15 |
| 1 | 1 | 15 | 0 | 16 |
| 1 | 1 | 16 | 0 | 17 |
| 1 | 1 | 17 | 0 | 18 |
| 1 | 1 | 18 | 0 | 19 |
| 1 | 1 | 19 | 0 | 20 |
| 1 | 1 | 20 | 0 | 21 |
| 1 | 1 | 21 | 0 | 22 |
| 1 | 1 | 22 | 0 | 23 |
| 1 | 1 | 23 | 0 | 24 |
| 1 | 1 | 24 | 0 | 25 |
| 1 | 1 | 25 | 0 | 26 |
| 1 | 1 | 26 | 0 | 27 |
| 1 | 1 | 27 | 0 | 28 |
| 1 | 1 | 28 | 0 | 29 |
| 1 | 1 | 29 | 0 | 29 |

TABLE 5

Operation of Q-LOGIC - Lookup TABLE Conversion of QINDEX to QVALUE

| QINDEX | QVALUE |
|---|---|
| 0 | 0101011000001 |
| 1 | 0101010000001 |
| 2 | 0101000000001 |
| 3 | 0100100000001 |
| 4 | 0011100000001 |
| 5 | 0011010000001 |
| 6 | 0011000000001 |
| 7 | 0010100000001 |
| 8 | 0010010000001 |
| 9 | 0010001000001 |
| 10 | 0001110000001 |
| 11 | 0001100000001 |
| 12 | 0001011000001 |
| 13 | 0001010000001 |
| 14 | 0001001000001 |
| 15 | 0000110000001 |
| 16 | 0000100100001 |
| 17 | 0000011100001 |
| 18 | 0000010100001 |
| 19 | 0000001110001 |
| 20 | 0000001011001 |
| 21 | 0000001010011 |
| 22 | 0000000100111 |
| 23 | 0000000010111 |
| 24 | 0000000010011 |
| 25 | 0000000001011 |
| 26 | 0000000000111 |
| 27 | 0000000000101 |
| 28 | 0000000000011 |
| 29 | 0000000000001 |

TABLE 6

| Operation of the PRIORITY ENCODER. | |
|---|---|
| INPUT A-BUS | OUTPUT SHIFTAMT |
| 1----------- | 0 |
| 01---------- | 1 |
| 001--------- | 2 |
| 0001-------- | 3 |
| 00001------- | 4 |
| 000001------ | 5 |
| 0000001----- | 6 |
| 00000001---- | 7 |
| 000000001--- | 8 |
| 0000000001-- | 9 |
| 00000000001- | 10 |
| 000000000001- | 11 |
| 0000000000001 | 12 |

Test Sequence for a small data set.

A test file was generated using a random number generator such that the probability of 0's in the binary sequence was 0.1875. The actual number of zeros in the file was 48, as expected. The Qe value was initialized to '0AC1' which when shifted left by 2 appears as '2b04'. The positive Qe indicates MPS value of 0.

In the following tests, the event counter ec is followed by the Qe value at the end of the cycle and then by the YN symbol. The A, X, and 10 values are given at the end of each cycle after renormalizations. The total number of renormalizations is listed under 'bit'. The "codebytes" are listed as tehy are output. More than one byte in that column list both a changed preceding byte along with the new byte(s).

Test data (in hexadecimal form):

EBB7FAFEBFEFD6C7F7FFF-
DFE7FFBDFF3FDFFFF97F6F5F-
7FEB97BDF76EDD7E7FF

For this file the coded bit count is 208, including the overhead to flush the final data. The actual compressed data stream for both encoders is (in hexadecimal form):

23CA08826F7E20151C267BA0AB606CD63AA2-
6E71C197A80A07C0

TABLE 7

| | | | Hardware encoder: | | | | |
|---|---|---|---|---|---|---|---|
| ec | Q0 | YN | A | x | bits | 10 | codebytes |
| 0 | 2b04 |   | 00004000 | 01000000 | 0 | 0000 | |
| 1 | d4fc | 1 | 00005000 | 02000000 | 1 | 003c | |
| 2 | d5fc | 1 | 00005608 | 04005608 | 2 | 003e | |
| 3 | d7fc | 1 | 00005808 | 08010018 | 3 | 0040 | |
| 4 | d5fc | 0 | 00005008 | 10020030 | 4 | 003e | |
| 5 | d7fc | 1 | 00004c08 | 20045468 | 5 | 0040 | |
| 6 | d5fc | 0 | 00005008 | 4008a8d0 | 6 | 003e | |
| 7 | d7fc | 1 | 00004c08 | 8011a5a8 | 7 | 0040 | |
| 8 | dbfc | 1 | 00004808 | 01009b58 | 8 | 0042 | 23 |
| 9 | e3fc | 1 | 00004808 | 02017eb8 | 9 | 0044 | |
| 10 | dbfc | 0 | 00007010 | 0805fae0 | 11 | 0042 | |
| 11 | dbfc | 1 | 00004c0c | 08061ee4 | 11 | 0042 | |
| 12 | e3fc | 1 | 00005010 | 100c85d0 | 12 | 0044 | |
| 13 | dbfc | 0 | 00007010 | 40321740 | 14 | 0042 | |
| 14 | dbfc | 1 | 00004c0c | 40323b44 | 14 | 0042 | |
| 15 | e3fc | 1 | 00005010 | 8064be90 | 15 | 0044 | |
| 16 | e5fc | 1 | 00006818 | 0100b528 | 16 | 0046 | c9 |
| 17 | e5fc | 1 | 00004e14 | 0100cf2c | 16 | 0046 | |
| 18 | e7fc | 1 | 00006820 | 0201d260 | 17 | 0048 | |
| 19 | e7fc | 1 | 0000501c | 0201ea64 | 17 | 0048 | |
| 20 | ebfc | 1 | 00007030 | 040404d0 | 18 | 004a | |
| 21 | ebfc | 1 | 00005c2c | 040418d4 | 18 | 004a | |
| 22 | e5fc | 0 | 00005010 | 10106350 | 20 | 0046 | |
| 23 | e7fc | 1 | 00006c18 | 2020faa8 | 21 | 0048 | |
| 24 | e5fc | 0 | 00006010 | 8083eaa0 | 23 | 0046 | |
| 25 | e5fc | 1 | 0000460c | 808404a4 | 23 | 0046 | |
| 26 | e7fc | 1 | 00005810 | 01003d50 | 24 | 0048 | ca 08 |
| 27 | e7fc | 1 | 0000400c | 01005554 | 24 | 0048 | |
| 28 | ebfc | 1 | 00005010 | 0200dab0 | 25 | 004a | |
| 29 | edfc | 1 | 00007818 | 0401dd68 | 26 | 004c | |
| 30 | edfc | 1 | 00006614 | 0401ef6c | 26 | 004c | |
| 31 | edfc | 1 | 00005410 | 04020170 | 26 | 004c | |
| 32 | e7fc | 0 | 00004810 | 100805c0 | 28 | 0048 | |
| 33 | ebfc | 1 | 00006018 | 20103b88 | 29 | 004a | |
| 34 | e5fc | 0 | 00005010 | 8040ee20 | 31 | 0046 | |
| 35 | e7fc | 1 | 00006c18 | 01001048 | 32 | 0048 | 82 |
| 36 | e7fc | 1 | 00005414 | 0100284c | 32 | 0048 | |
| 37 | ebfc | 1 | 00007820 | 020080a0 | 33 | 004a | |
| 38 | ebfc | 1 | 0000641c | 020094a4 | 33 | 004a | |
| 39 | ebfc | 1 | 00005018 | 0200a8a8 | 33 | 004a | |
| 40 | edfc | 1 | 00007828 | 04017958 | 34 | 004c | |
| 41 | edfc | 1 | 00006624 | 04018b5c | 34 | 004c | |
| 42 | edfc | 1 | 00005420 | 04019d60 | 34 | 004c | |
| 43 | edfc | 1 | 0000421c | 0401af64 | 34 | 004c | |
| 44 | e7fc | 0 | 00004810 | 1006bd90 | 36 | 0048 | |
| 45 | ebfc | 1 | 00006018 | 200dab28 | 37 | 004a | |
| 46 | ebfc | 1 | 00004c14 | 200dbf2c | 37 | 004a | |
| 47 | edfc | 1 | 00007020 | 401ba660 | 38 | 004c | |
| 48 | edfc | 1 | 00005e1c | 401bb864 | 38 | 004c | |
| 49 | edfc | 1 | 00004c18 | 401bca68 | 38 | 004c | |
| 50 | eefc | 1 | 00007428 | 8037b8d8 | 39 | 004e | |
| 51 | ebfc | 0 | 00004410 | 0200e360 | 41 | 004a | 6f |
| 52 | edfc | 1 | 00006018 | 0401eec8 | 42 | 004c | |
| 53 | e7fc | 0 | 00004810 | 1007bb20 | 44 | 0048 | |
| 54 | ebfc | 1 | 00006018 | 200fa648 | 45 | 004a | |
| 55 | ebfc | 1 | 00004c14 | 200fba4c | 45 | 004a | |
| 56 | e5fc | 0 | 00005010 | 803ee930 | 47 | 0046 | |
| 57 | e7fc | 1 | 00006c18 | 01000668 | 48 | 0048 | 7e |
| 58 | e7fc | 1 | 00005414 | 01001e6c | 48 | 0048 | |
| 59 | e5fc | 0 | 00006010 | 040079b0 | 50 | 0046 | |
| 60 | e3fc | 0 | 00006810 | 1001e6c0 | 52 | 0044 | |
| 61 | dbfc | 0 | 00007010 | 40079b00 | 54 | 0042 | |
| 62 | dbfc | 1 | 00004c0c | 4007bf04 | 54 | 0042 | |
| 63 | e3fc | 1 | 00005010 | 800fc610 | 55 | 0044 | |
| 64 | e5fc | 1 | 00006818 | 0100c428 | 56 | 0046 | 1f |
| 65 | e5fc | 1 | 00004e14 | 0100de2c | 56 | 0046 | |
| 66 | e7fc | 1 | 00006820 | 0201f060 | 57 | 0048 | |
| 67 | e7fc | 1 | 0000501c | 02020864 | 57 | 0048 | |
| 68 | ebfc | 1 | 00007030 | 040440d0 | 58 | 004a | |
| 69 | e5fc | 0 | 00005010 | 10110340 | 60 | 0046 | |
| 70 | e7fc | 1 | 00006c18 | 20223a88 | 61 | 0048 | |
| 71 | e7fc | 1 | 00005414 | 2022528c | 61 | 0048 | |
| 72 | ebfc | 1 | 00007820 | 4044d520 | 62 | 004a | |
| 73 | ebfc | 1 | 0000641c | 4044e924 | 62 | 004a | |
| 74 | ebfc | 1 | 00005018 | 4044fd28 | 62 | 004a | |
| 75 | edfc | 1 | 00007828 | 808a2258 | 63 | 004c | |
| 76 | edfc | 1 | 00006624 | 808a345c | 63 | 004c | |
| 77 | edfc | 1 | 00005420 | 808a4660 | 63 | 004c | |
| 78 | edfc | 1 | 0000421c | 808a5864 | 63 | 004c | |
| 79 | eefc | 1 | 00006030 | 0100d4d0 | 64 | 004e | 20 14 |
| 80 | eefc | 1 | 00004f2c | 0100e5d4 | 64 | 004e | |
| 81 | f1fc | 1 | 00007c50 | 0201edb0 | 65 | 0050 | |
| 82 | f1fc | 1 | 00006e4c | 0201fbb4 | 65 | 0050 | |
| 83 | f1fc | 1 | 00006048 | 020209b8 | 65 | 0050 | |
| 84 | f1fc | 1 | 00005244 | 020217bc | 65 | 0050 | |
| 85 | f1fc | 1 | 00004440 | 020225c0 | 65 | 0050 | |
| 86 | f3fc | 1 | 00006c78 | 04046788 | 66 | 0052 | |
| 87 | eefc | 0 | 00006020 | 20233c40 | 69 | 004e | |
| 88 | eefc | 1 | 00004f1c | 20234d44 | 69 | 004e | |
| 89 | f1fc | 1 | 00007c30 | 4046bc90 | 70 | 0050 | |
| 90 | f1fc | 1 | 00006e2c | 4046ca94 | 70 | 0050 | |
| 91 | f1fc | 1 | 00006028 | 4046d898 | 70 | 0050 | |
| 92 | f1fc | 1 | 00005224 | 4046e69c | 70 | 0050 | |
| 93 | f1fc | 1 | 00004420 | 4046f4a0 | 70 | 0050 | |
| 94 | f3fc | 1 | 00006c38 | 808e0548 | 71 | 0052 | |
| 95 | f3fc | 1 | 00006034 | 808e114c | 71 | 0052 | |
| 96 | eefc | 0 | 00006020 | 04008a60 | 74 | 004e | 15 1c |
| 97 | ebfc | 0 | 00004410 | 10022980 | 76 | 004a | |
| 98 | edfc | 1 | 00006018 | 20047b08 | 77 | 004c | |
| 99 | edfc | 1 | 00004e14 | 20048d0c | 77 | 004c | |
| 100 | eefc | 1 | 00007820 | 04093e20 | 78 | 004e | |
| 101 | eefc | 1 | 0000671c | 40094f24 | 78 | 004e | |
| 102 | eefc | 1 | 00005618 | 40096028 | 78 | 004e | |
| 103 | eefc | 1 | 00004514 | 4009712c | 78 | 004e | |
| 104 | f1fc | 1 | 00006820 | 80130460 | 79 | 0050 | |
| 105 | f1fc | 1 | 00005a1c | 80131264 | 79 | 0050 | |

TABLE 7-continued

| | ec | Q0 | YN | A | x | bits | 10 | codebytes |
|---|---|---|---|---|---|---|---|---|
| 106 | f1fc | | 1 | 00004c18 | 80132068 | 79 | 0050 | |
| 107 | f3fc | | 1 | 00007c28 | 01005cd8 | 80 | 0052 | 26 |
| 108 | f3fc | | 1 | 00007024 | 010068dc | 80 | 0052 | |
| 109 | f3fc | | 1 | 00006420 | 010074e0 | 80 | 0052 | |
| 110 | eefc | | 0 | 00006020 | 0803a700 | 83 | 004e | |
| 111 | eefc | | 1 | 00004f1c | 0803b804 | 83 | 004e | |
| 112 | f1fc | | 1 | 00007c30 | 10079210 | 84 | 0050 | |
| 113 | f1fc | | 1 | 00006e2c | 1007a014 | 84 | 0050 | |
| 114 | f1fc | | 1 | 00006028 | 1007ae18 | 84 | 0050 | |
| 115 | edfc | | 0 | 00007020 | 803d70c0 | 87 | 004c | |
| 116 | edfc | | 1 | 00005e1c | 803d82c4 | 87 | 004c | |
| 117 | edfc | | 1 | 00004c18 | 803d94c8 | 87 | 004c | |
| 118 | eefc | | 1 | 00007428 | 01004d98 | 88 | 004e | 7b |
| 119 | eefc | | 1 | 00006324 | 01005e9c | 88 | 004e | |
| 120 | eefc | | 1 | 00005220 | 01006fa0 | 88 | 004e | |
| 121 | eefc | | 1 | 0000411c | 010080a4 | 88 | 004e | |
| 122 | f1fc | | 1 | 00006030 | 02012350 | 89 | 0050 | |
| 123 | f1fc | | 1 | 0000522c | 02013154 | 89 | 0050 | |
| 124 | f1fc | | 1 | 00004428 | 02013f58 | 89 | 0050 | |
| 125 | edfc | | 0 | 00007020 | 1009fac0 | 92 | 004c | |
| 126 | e7fc | | 0 | 00004810 | 4027eb00 | 94 | 0048 | |
| 127 | ebfc | | 1 | 00006018 | 80500608 | 95 | 004a | |
| 128 | ebfc | | 1 | 00004c14 | 80501a0c | 95 | 004a | |
| 129 | edfc | | 1 | 00007020 | 01005c20 | 96 | 004c | a0 |
| 130 | edfc | | 1 | 00005e1c | 01006e24 | 96 | 004c | |
| 131 | edfc | | 1 | 00004c18 | 01008028 | 96 | 004c | |
| 132 | eefc | | 1 | 00007428 | 02012458 | 97 | 004e | |
| 133 | eefc | | 1 | 00006324 | 0201355c | 97 | 004e | |
| 134 | eefc | | 1 | 00005220 | 02014660 | 97 | 004e | |
| 135 | ebfc | | 0 | 00004410 | 08051980 | 99 | 004a | |
| 136 | edfc | | 1 | 00006018 | 100a5b08 | 100 | 004c | |
| 137 | edfc | | 1 | 00004e14 | 100a6d0c | 100 | 004c | |
| 138 | eefc | | 1 | 00007820 | 2014fe20 | 101 | 004e | |
| 139 | eefc | | 1 | 0000671c | 20150f24 | 101 | 004e | |
| 140 | eefc | | 1 | 00005618 | 20152028 | 101 | 004e | |
| 141 | eefc | | 1 | 00004514 | 2015312c | 101 | 004e | |
| 142 | f1fc | | 1 | 00006820 | 402a8460 | 102 | 0050 | |
| 143 | f1fc | | 1 | 00005a1c | 402a9264 | 102 | 0050 | |
| 144 | f1fc | | 1 | 00004c18 | 402aa068 | 102 | 0050 | |
| 145 | f3fc | | 1 | 00007c28 | 80555cd8 | 103 | 0052 | |
| 146 | f3fc | | 1 | 00007024 | 805568dc | 103 | 0052 | |
| 147 | f3fc | | 1 | 00006420 | 805574e0 | 103 | 0052 | |
| 148 | f3fc | | 1 | 0000581c | 805580e4 | 103 | 0052 | |
| 149 | f3fc | | 1 | 00004c18 | 80558ce8 | 103 | 0052 | |
| 150 | f3fc | | 1 | 00004014 | 805598ec | 103 | 0052 | |
| 151 | f4fc | | 1 | 00006820 | 010049e0 | 104 | 0054 | ab |
| 152 | f4fc | | 1 | 00005d1c | 010054e4 | 104 | 0054 | |
| 153 | f4fc | | 1 | 00005218 | 01005fe8 | 104 | 0054 | |
| 154 | f1fc | | 0 | 00005820 | 0802ff40 | 107 | 0050 | |
| 155 | edfc | | 0 | 00007020 | 4017fa00 | 110 | 004c | |
| 156 | edfc | | 1 | 00005e1c | 40180c04 | 110 | 004c | |
| 157 | e7fc | | 0 | 00004810 | 01003010 | 112 | 0048 | 60 |
| 158 | ebfc | | 1 | 00006018 | 02009028 | 113 | 004a | |
| 159 | ebfc | | 1 | 00004c14 | 0200a42c | 113 | 004a | |
| 160 | edfc | | 1 | 00007020 | 04017060 | 114 | 004c | |
| 161 | edfc | | 1 | 00005e1c | 04018264 | 114 | 004c | |
| 162 | edfc | | 1 | 00004c18 | 04019468 | 114 | 004c | |
| 163 | eefc | | 1 | 00007428 | 08034cd8 | 115 | 004e | |
| 164 | eefc | | 1 | 00006324 | 08035ddc | 115 | 004e | |
| 165 | ebfc | | 0 | 00004410 | 200d7770 | 117 | 004a | |
| 166 | edfc | | 1 | 00006018 | 401b16e8 | 118 | 004c | |
| 167 | edfc | | 1 | 00004e14 | 401b28ec | 118 | 004c | |
| 168 | e7fc | | 0 | 00004810 | 0100a3b0 | 120 | 0048 | 6c |
| 169 | ebfc | | 1 | 00006018 | 02017768 | 121 | 004a | |
| 170 | ebfc | | 1 | 00004c14 | 02018b6c | 121 | 004a | |
| 171 | edfc | | 1 | 00007020 | 04033ee0 | 122 | 004c | |
| 172 | edfc | | 1 | 00005e1c | 040350e4 | 122 | 004c | |
| 173 | e7fc | | 0 | 00004810 | 100d4390 | 124 | 0048 | |
| 174 | ebfc | | 1 | 00006018 | 201ab728 | 125 | 004a | |
| 175 | e5fc | | 0 | 00005010 | 806adca0 | 127 | 0046 | |
| 176 | e7fc | | 1 | 00006c18 | 0100ed48 | 128 | 0048 | d5 |
| 177 | e7fc | | 1 | 00005414 | 0101054c | 128 | 0048 | |
| 178 | ebfc | | 1 | 00007820 | 02023aa0 | 129 | 004a | |
| 179 | ebfc | | 1 | 0000641c | 02024ea4 | 129 | 004a | |
| 180 | ebfc | | 1 | 00005018 | 020262a8 | 129 | 004a | |
| 181 | e5fc | | 0 | 00005010 | 08098aa0 | 131 | 0046 | |
| 182 | e7fc | | 1 | 00006c18 | 10134948 | 132 | 0048 | |
| 183 | e7fc | | 1 | 00005414 | 1013614c | 132 | 0048 | |
| 184 | ebfc | | 1 | 00007820 | 2026f2a0 | 133 | 004a | |
| 185 | ebfc | | 1 | 0000641c | 202706a4 | 133 | 004a | |
| 186 | ebfc | | 1 | 00005018 | 20271aa8 | 133 | 004a | |
| 187 | edfc | | 1 | 00007828 | 404e5d58 | 134 | 004c | |
| 188 | edfc | | 1 | 00006624 | 404e6f5c | 134 | 004c | |
| 189 | edfc | | 1 | 00005420 | 404e8160 | 134 | 004c | |
| 190 | edfc | | 1 | 0000421c | 404e9364 | 134 | 004c | |
| 191 | eefc | | 1 | 00006030 | 809d4ad0 | 135 | 004e | |
| 192 | ebfc | | 0 | 00004410 | 02012b40 | 137 | 004a | d6 3a |
| 193 | edfc | | 1 | 00006018 | 04027e88 | 138 | 004c | |
| 194 | e7fc | | 0 | 00004810 | 1009fa20 | 140 | 0048 | |
| 195 | ebfc | | 1 | 00006018 | 20142448 | 141 | 004a | |
| 196 | ebfc | | 1 | 00004c14 | 2014384c | 141 | 004a | |
| 197 | edfc | | 1 | 00007020 | 402898a0 | 142 | 004c | |
| 198 | e7fc | | 0 | 00004810 | 01006280 | 144 | 0048 | a2 |
| 199 | e5fc | | 0 | 00006010 | 04018a00 | 146 | 0046 | |
| 200 | e5fc | | 1 | 0000460c | 0401a404 | 146 | 0046 | |
| 201 | e3fc | | 0 | 00006810 | 10069010 | 148 | 0044 | |
| 202 | e3fc | | 1 | 00004c0c | 1006ac14 | 148 | 0044 | |
| 203 | e5fc | | 1 | 00006010 | 200d9030 | 149 | 0046 | |
| 204 | e5fc | | 1 | 0000460c | 200daa34 | 149 | 0046 | |
| 205 | e7fc | | 1 | 00005810 | 401b8870 | 150 | 0048 | |
| 206 | e5fc | | 0 | 00006010 | 010021c0 | 152 | 0046 | 6e |
| 207 | e5fc | | 1 | 0000460c | 01003bc4 | 152 | 0046 | |
| 208 | e7fc | | 1 | 00005810 | 0200ab90 | 153 | 0048 | |
| 209 | e7fc | | 1 | 0000400c | 0200c394 | 153 | 0048 | |
| 210 | ebfc | | 1 | 00005010 | 0401b730 | 154 | 004a | |
| 211 | e5fc | | 0 | 00005010 | 1006dcc0 | 156 | 0046 | |
| 212 | e7fc | | 1 | 00006c18 | 200ded88 | 157 | 0048 | |
| 213 | e7fc | | 1 | 00005414 | 200e058c | 157 | 0048 | |
| 214 | ebfc | | 1 | 00007820 | 401c3b20 | 158 | 004a | |
| 215 | ebfc | | 1 | 0000641c | 401c4f24 | 158 | 004a | |
| 216 | ebfc | | 1 | 00005018 | 401c6328 | 158 | 004a | |
| 217 | e5fc | | 0 | 00005010 | 01008ca0 | 160 | 0046 | 71 |
| 218 | e7fc | | 1 | 00006c18 | 02014d48 | 161 | 0048 | |
| 219 | e7fc | | 1 | 00005414 | 0201654c | 161 | 0048 | |
| 220 | ebfc | | 1 | 00007820 | 0402faa0 | 162 | 004a | |
| 221 | e5fc | | 0 | 00005010 | 100bea80 | 164 | 0046 | |
| 222 | e7fc | | 1 | 00006c18 | 20180908 | 165 | 0048 | |
| 223 | e7fc | | 1 | 00005414 | 2018210c | 165 | 0048 | |
| 224 | e5fc | | 0 | 00006010 | 80608430 | 167 | 0046 | |
| 225 | e5fc | | 1 | 0000460c | 80609e34 | 167 | 0046 | |
| 226 | e7fc | | 1 | 00005810 | 01007070 | 168 | 0048 | c1 |
| 227 | e7fc | | 1 | 0000400c | 01008874 | 168 | 0048 | |
| 228 | e5fc | | 0 | 00006010 | 040221d0 | 170 | 0046 | |
| 229 | e5fc | | 1 | 0000460c | 04023bd4 | 170 | 0046 | |
| 230 | e7fc | | 1 | 00005810 | 0804abb0 | 171 | 0048 | |
| 231 | e5fc | | 0 | 00006010 | 2012aec0 | 173 | 0046 | |
| 232 | e5fc | | 1 | 0000460c | 2012c8c4 | 173 | 0046 | |
| 233 | e7fc | | 1 | 00005810 | 4025c590 | 174 | 0048 | |
| 234 | e7fc | | 1 | 0000400c | 4025dd94 | 174 | 0048 | |
| 235 | e5fc | | 0 | 00006010 | 01007650 | 176 | 0046 | 97 |
| 236 | e5fc | | 1 | 0000460c | 01009054 | 176 | 0046 | |
| 237 | e3fc | | 0 | 00006810 | 04024150 | 178 | 0044 | |
| 238 | e3fc | | 1 | 00004c0c | 04025d54 | 178 | 0044 | |
| 239 | e5fc | | 1 | 00006010 | 0804f2b0 | 179 | 0046 | |
| 240 | e5fc | | 1 | 0000460c | 08050cb4 | 179 | 0046 | |
| 241 | e7fc | | 1 | 00005810 | 100a4d70 | 180 | 0048 | |
| 242 | e7fc | | 1 | 0000400c | 100a6574 | 180 | 0048 | |
| 243 | ebfc | | 1 | 00005010 | 2014faf0 | 181 | 004a | |
| 244 | e5fc | | 0 | 00005010 | 8053ebc0 | 183 | 0046 | |
| 245 | e3fc | | 0 | 00006810 | 0201af00 | 185 | 0044 | a7 |
| 246 | e3fc | | 1 | 00004c0c | 0201cb04 | 185 | 0044 | |
| 247 | e5fc | | 1 | 00006010 | 0403ce10 | 186 | 0046 | |
| 248 | e5fc | | 1 | 0000460c | 0403e814 | 186 | 0046 | |
| 249 | e7fc | | 1 | 00005810 | 08080430 | 187 | 0048 | |
| 250 | e7fc | | 1 | 0000400c | 08081c34 | 187 | 0048 | |
| 251 | ebfc | | 1 | 00005010 | 10106870 | 188 | 004a | |
| 252 | edfc | | 1 | 00007818 | 2020f8e8 | 189 | 004c | |
| 253 | edfc | | 1 | 00006614 | 20210aec | 189 | 004c | |
| 254 | edfc | | 1 | 00005410 | 20211cf0 | 189 | 004c | |
| 255 | edfc | | 1 | 0000420c | 20212ef4 | 189 | 004c | |
| 256 | eefc | | 1 | 00006010 | 404281f0 | 190 | 004e | |
| | | | | 00000000 | | | | a8 0a 07 c0 |

Software encoder:

| | ec | Q0 | YN | A | x | bits | 10 | codebytes |
|---|---|---|---|---|---|---|---|---|
| 0 | 2b04 | | | 00004000 | 01804070 | 0 | 0000 | |
| 1 | d4fc | | 1 | 00005608 | 03005608 | 1 | 003c | |
| 2 | d5fc | | 1 | 00005608 | 0600ac10 | 2 | 003e | |
| 3 | d7fc | | 1 | 00005808 | 0c015820 | 3 | 0040 | |
| 4 | d5fc | | 0 | 00005008 | 18025038 | 4 | 003e | |
| 5 | d7fc | | 1 | 00004c08 | 3004a070 | 5 | 0040 | |
| 6 | d5fc | | 0 | 00005008 | 6008f8d8 | 6 | 003e | |
| 7 | d7fc | | 1 | 00004c08 | c011f1b0 | 7 | 0040 | |
| 8 | dbfc | | 1 | 00004808 | 0180e360 | 8 | 0042 | 23 |

TABLE 7-continued

| | | | | | | | |
|---|---|---|---|---|---|---|---|
| 9 | e3fc | 1 | 00004808 | 0301c6c0 | 9 | 0044 | |
| 10 | dbfc | 0 | 00007010 | 0c066af0 | 11 | 0042 | |
| 11 | dbfc | 1 | 00004c0c | 0c066af0 | 11 | 0042 | |
| 12 | e3fc | 1 | 00005010 | 180cd5e0 | 12 | 0044 | |
| 13 | dbfc | 0 | 00007010 | 60328750 | 14 | 0042 | |
| 14 | dbfc | 1 | 00004c0c | 60328750 | 14 | 0042 | |
| 15 | e3fc | 1 | 00005010 | c0650ea0 | 15 | 0044 | |
| 16 | e5fc | 1 | 00006818 | 01801d40 | 16 | 0046 | ca |
| 17 | e5fc | 1 | 00004e14 | 01801d40 | 16 | 0046 | |
| 18 | e7fc | 1 | 00006820 | 03003a80 | 17 | 0048 | |
| 19 | e7fc | 1 | 0000501c | 03003a80 | 17 | 0048 | |
| 20 | ebfc | 1 | 00007030 | 06007500 | 18 | 004a | |
| 21 | ebfc | 1 | 00005c2c | 06007500 | 18 | 004a | |
| 22 | e5fc | 0 | 00005010 | 1800b360 | 20 | 0046 | |
| 23 | e7fc | 1 | 00006c18 | 300166c0 | 21 | 0048 | |
| 24 | e5fc | 0 | 00006010 | c0044ab0 | 23 | 0046 | |
| 25 | e5fc | 1 | 0000460c | c0044ab0 | 23 | 0046 | |
| 26 | e7fc | 1 | 00005810 | 01809560 | 24 | 0048 | 08 |
| 27 | e7fc | 1 | 0000400c | 01809560 | 24 | 0048 | |
| 28 | ebfc | 1 | 00005010 | 03012ac0 | 25 | 004a | |
| 29 | edfc | 1 | 00007818 | 06025580 | 26 | 004c | |
| 30 | edfc | 1 | 00006614 | 06025580 | 26 | 004c | |
| 31 | edfc | 1 | 00005410 | 06025580 | 26 | 004c | |
| 32 | e7fc | 0 | 00004810 | 18084dd0 | 28 | 0048 | |
| 33 | ebfc | 1 | 00006018 | 30109ba0 | 29 | 004a | |
| 34 | e5fc | 0 | 00005010 | c0413e30 | 31 | 0046 | |
| 35 | e7fc | 1 | 00006c18 | 01807c60 | 32 | 0048 | 82 |
| 36 | e7fc | 1 | 00005414 | 01807c60 | 32 | 0048 | |
| 37 | ebfc | 1 | 00007820 | 0300f8c0 | 33 | 004a | |
| 38 | ebfc | 1 | 0000641c | 0300f8c0 | 33 | 004a | |
| 39 | ebfc | 1 | 00005018 | 0300f8c0 | 33 | 004a | |
| 40 | edfc | 1 | 00007828 | 0601f180 | 34 | 004c | |
| 41 | edfc | 1 | 00006624 | 0601f180 | 34 | 004c | |
| 42 | edfc | 1 | 00005420 | 0601f180 | 34 | 004c | |
| 43 | edfc | 1 | 0000421c | 0601f180 | 34 | 004c | |
| 44 | e7fc | 0 | 00004810 | 180705a0 | 36 | 0048 | |
| 45 | ebfc | 1 | 00006018 | 300e0b40 | 37 | 004a | |
| 46 | ebfc | 1 | 00004c14 | 300e0b40 | 37 | 004a | |
| 47 | edfc | 1 | 00007020 | 601c1680 | 38 | 004c | |
| 48 | edfc | 1 | 00005e1c | 601c1680 | 38 | 004c | |
| 49 | edfc | 1 | 00004c18 | 601c1680 | 38 | 004c | |
| 50 | eefc | 1 | 00007428 | c0382d00 | 39 | 004e | |
| 51 | ebfc | 0 | 00004410 | 03012770 | 41 | 004a | 6f |
| 52 | edfc | 1 | 00006018 | 06024ee0 | 42 | 004c | |
| 53 | e7fc | 0 | 00004810 | 18080330 | 44 | 0048 | |
| 54 | ebfc | 1 | 00006018 | 30100660 | 45 | 004a | |
| 55 | ebfc | 1 | 00004c14 | 30100660 | 45 | 004a | |
| 56 | e5fc | 0 | 00005010 | c03f3940 | 47 | 0046 | |
| 57 | e7fc | 1 | 00006c18 | 01807280 | 48 | 0048 | 7e |
| 58 | e7fc | 1 | 00005414 | 01807280 | 48 | 0048 | |
| 59 | e5fc | 0 | 00006010 | 0600d9c0 | 50 | 0046 | |
| 60 | e3fc | 0 | 00006810 | 18024ed0 | 52 | 0044 | |
| 61 | dbfc | 0 | 00007010 | 60080b10 | 54 | 0042 | |
| 62 | dbfc | 1 | 00004c0c | 60080b10 | 54 | 0042 | |
| 63 | e3fc | 1 | 00005010 | c0101620 | 55 | 0044 | |
| 64 | e5fc | 1 | 00006818 | 01802c40 | 56 | 0046 | 20 |
| 65 | e5fc | 1 | 00004e14 | 01802c40 | 56 | 0046 | |
| 66 | e7fc | 1 | 00006820 | 03005880 | 57 | 0048 | |
| 67 | e7fc | 1 | 0000501c | 03005880 | 57 | 0048 | |
| 68 | ebfc | 1 | 00007030 | 0600b100 | 58 | 004a | |
| 69 | e5fc | 0 | 00005010 | 18015350 | 60 | 0046 | |
| 70 | e7fc | 1 | 00006c18 | 3002a6a0 | 61 | 0048 | |
| 71 | e7fc | 1 | 00005414 | 3002a6a0 | 61 | 0048 | |
| 72 | ebfc | 1 | 00007820 | 60054d40 | 62 | 004a | |
| 73 | ebfc | 1 | 0000641c | 60054d40 | 62 | 004a | |
| 74 | ebfc | 1 | 00005018 | 60054d40 | 62 | 004a | |
| 75 | edfc | 1 | 00007828 | c00a9a80 | 63 | 004c | |
| 76 | edfc | 1 | 00006624 | c00a9a80 | 63 | 004c | |
| 77 | edfc | 1 | 00005420 | c00a9a80 | 63 | 004c | |
| 78 | edfc | 1 | 0000421c | c00a9a80 | 63 | 004c | |
| 79 | eefc | 1 | 00006030 | 01803500 | 64 | 004e | 15 |
| 80 | eefc | 1 | 00004f2c | 01803500 | 64 | 004e | |
| 81 | f1fc | 1 | 00007c50 | 03006a00 | 65 | 0050 | |
| 82 | f1fc | 1 | 00006e4c | 03006a00 | 65 | 0050 | |
| 83 | f1fc | 1 | 00006048 | 03006a00 | 65 | 0050 | |
| 84 | f1fc | 1 | 00005244 | 03006a00 | 65 | 0050 | |
| 85 | f1fc | 1 | 00004440 | 03006a00 | 65 | 0050 | |
| 86 | f3fc | 1 | 00006c78 | 0600d400 | 66 | 0052 | |
| 87 | eefc | 0 | 00006020 | 30039c60 | 69 | 004e | |
| 88 | eefc | 1 | 00004f1c | 30039c60 | 69 | 004e | |
| 89 | f1fc | 1 | 00007c30 | 600738c0 | 70 | 0050 | |
| 90 | f1fc | 1 | 00006e2c | 600738c0 | 70 | 0050 | |
| 91 | f1fc | 1 | 00006028 | 600738c0 | 70 | 0050 | |
| 92 | f1fc | 1 | 00005224 | 600738c0 | 70 | 0050 | |
| 93 | f1fc | 1 | 00004420 | 600738c0 | 70 | 0050 | |
| 94 | f3fc | 1 | 00006c38 | c00e7180 | 71 | 0052 | |
| 95 | f3fc | 1 | 00006034 | c00e7180 | 71 | 0052 | |
| 96 | eefc | 0 | 00006020 | 0600ea80 | 74 | 004e | 1c |
| 97 | ebfc | 0 | 00004410 | 18026d90 | 76 | 004a | |
| 98 | edfc | 1 | 00006018 | 3004db20 | 77 | 004c | |
| 99 | edfc | 1 | 00004e14 | 3004db20 | 77 | 004c | |
| 100 | eefc | 1 | 00007820 | 6009b640 | 78 | 004e | |
| 101 | eefc | 1 | 0000671c | 6009b640 | 78 | 004e | |
| 102 | eefc | 1 | 00005618 | 6009b640 | 78 | 004e | |
| 103 | eefc | 1 | 00004514 | 6009b640 | 78 | 004e | |
| 104 | f1fc | 1 | 00006820 | c0136c80 | 79 | 0050 | |
| 105 | f1fc | 1 | 00005a1c | c0136c80 | 79 | 0050 | |
| 106 | f1fc | 1 | 00004c18 | c0136c80 | 79 | 0050 | |
| 107 | f3fc | 1 | 00007c28 | 0180d900 | 80 | 0052 | 26 |
| 108 | f3fc | 1 | 00007024 | 0180d900 | 80 | 0052 | |
| 109 | f3fc | 1 | 00006420 | 0180d900 | 80 | 0052 | |
| 110 | eefc | 0 | 00006020 | 0c040720 | 83 | 004e | |
| 111 | eefc | 1 | 00004f1c | 0c040720 | 83 | 004e | |
| 112 | f1fc | 1 | 00007c30 | 18080e40 | 84 | 0050 | |
| 113 | f1fc | 1 | 00006e2c | 18080e40 | 84 | 0050 | |
| 114 | f1fc | 1 | 00006028 | 18080e40 | 84 | 0050 | |
| 115 | edfc | 0 | 00007020 | c03de0e0 | 87 | 004c | |
| 116 | edfc | 1 | 00005e1c | c03de0e0 | 87 | 004c | |
| 117 | edfc | 1 | 00004c18 | c03de0e0 | 87 | 004c | |
| 118 | eefc | 1 | 00007428 | 0180c1c0 | 88 | 004e | 7b |
| 119 | eefc | 1 | 00006324 | 0180c1c0 | 88 | 004e | |
| 120 | eefc | 1 | 00005220 | 0180c1c0 | 88 | 004e | |
| 121 | eefc | 1 | 0000411c | 0180c1c0 | 88 | 004e | |
| 122 | f1fc | 1 | 00006030 | 03018380 | 89 | 0050 | |
| 123 | f1fc | 1 | 0000522c | 03018380 | 89 | 0050 | |
| 124 | f1fc | 1 | 00004428 | 03018380 | 89 | 0050 | |
| 125 | edfc | 0 | 00007020 | 180a6ae0 | 92 | 004c | |
| 126 | e7fc | 0 | 00004810 | 60283310 | 94 | 0048 | |
| 127 | ebfc | 1 | 00006018 | c0506620 | 95 | 004a | |
| 128 | ebfc | 1 | 00004c14 | c0506620 | 95 | 004a | |
| 129 | edfc | 1 | 00007020 | 0180cc40 | 96 | 004c | a0 |
| 130 | edfc | 1 | 00005e1c | 0180cc40 | 96 | 004c | |
| 131 | edfc | 1 | 00004c18 | 0180cc40 | 96 | 004c | |
| 132 | eefc | 1 | 00007428 | 03019880 | 97 | 004e | |
| 133 | eefc | 1 | 00006324 | 03019880 | 97 | 004e | |
| 134 | eefc | 1 | 00005220 | 03019880 | 97 | 004e | |
| 135 | ebfc | 0 | 00004410 | 0c055d90 | 99 | 004a | |
| 136 | edfc | 1 | 00006018 | 180abb20 | 100 | 004c | |
| 137 | edfc | 1 | 00004e14 | 180abb20 | 100 | 004c | |
| 138 | eefc | 1 | 00007820 | 30157640 | 101 | 004e | |
| 139 | eefc | 1 | 0000671c | 30157640 | 101 | 004e | |
| 140 | eefc | 1 | 00005618 | 30157640 | 101 | 004e | |
| 141 | eefc | 1 | 00004514 | 30157640 | 101 | 004e | |
| 142 | f1fc | 1 | 00006820 | 602aec80 | 102 | 0050 | |
| 143 | f1fc | 1 | 00005a1c | 602aec80 | 102 | 0050 | |
| 144 | f1fc | 1 | 00004c18 | 602aec80 | 102 | 0050 | |
| 145 | f3fc | 1 | 00007c28 | c055d900 | 103 | 0052 | |
| 146 | f3fc | 1 | 00007024 | c055d900 | 103 | 0052 | |
| 147 | f3fc | 1 | 00006420 | c055d900 | 103 | 0052 | |
| 148 | f3fc | 1 | 0000581c | c055d900 | 103 | 0052 | |
| 149 | f3fc | 1 | 00004c18 | c055d900 | 103 | 0052 | |
| 150 | f3fc | 1 | 00004014 | c055d900 | 103 | 0052 | |
| 151 | f4fc | 1 | 00006820 | 0180b200 | 104 | 0054 | ab |
| 152 | f4fc | 1 | 00005d1c | 0180b200 | 104 | 0054 | |
| 153 | f4fc | 1 | 00005218 | 0180b200 | 104 | 0054 | |
| 154 | f1fc | 0 | 00005820 | 0c035760 | 107 | 0050 | |
| 155 | edfc | 0 | 00007020 | 60186a20 | 110 | 004c | |
| 156 | edfc | 1 | 00005e1c | 60186a20 | 110 | 004c | |
| 157 | e7fc | 0 | 00004810 | 01807820 | 112 | 0048 | 60 |
| 158 | ebfc | 1 | 00006018 | 0300f040 | 113 | 004a | |
| 159 | ebfc | 1 | 00004c14 | 0300f040 | 113 | 004a | |
| 160 | edfc | 1 | 00007020 | 0601e080 | 114 | 004c | |
| 161 | edfc | 1 | 00005e1c | 0601e080 | 114 | 004c | |
| 162 | edfc | 1 | 00004c18 | 0601e080 | 114 | 004c | |
| 163 | eefc | 1 | 00007428 | 0c03c100 | 115 | 004e | |
| 164 | eefc | 1 | 00006324 | 0c03c100 | 115 | 004e | |
| 165 | ebfc | 0 | 00004410 | 300dbb80 | 117 | 004a | |
| 166 | edfc | 1 | 00006018 | 601b7700 | 118 | 004c | |
| 167 | edfc | 1 | 00004e14 | 601b7700 | 118 | 004c | |
| 168 | e7fc | 0 | 00004810 | 0180ebc0 | 120 | 0048 | 6c |
| 169 | ebfc | 1 | 00006018 | 0301d780 | 121 | 004a | |
| 170 | ebfc | 1 | 00004c14 | 0301d780 | 121 | 004a | |
| 171 | edfc | 1 | 00007020 | 0603af00 | 122 | 004c | |
| 172 | edfc | 1 | 00005e1c | 0603af00 | 122 | 004c | |

TABLE 7-continued

| | | | | | | | |
|---|---|---|---|---|---|---|---|
| 173 | e7fc | 0 | 00004810 | 180d8ba0 | 124 | 0048 | |
| 174 | ebfc | 1 | 00006018 | 301b1740 | 125 | 004a | |
| 175 | e5fc | 0 | 00005010 | c06b2cb0 | 127 | 0046 | |
| 176 | e7fc | 1 | 00006c18 | 01805960 | 128 | 0048 | d6 |
| 177 | e7fc | 1 | 00005414 | 01805960 | 128 | 0048 | |
| 178 | ebfc | 1 | 00007820 | 0300b2c0 | 129 | 004a | |
| 179 | ebfc | 1 | 0000641c | 0300b2c0 | 129 | 004a | |
| 180 | ebfc | 1 | 00005018 | 0300b2c0 | 129 | 004a | |
| 181 | e5fc | 0 | 00005010 | 0c01dab0 | 131 | 0046 | |
| 182 | e7fc | 1 | 00006c18 | 1803b560 | 132 | 0048 | |
| 183 | e7fc | 1 | 00005414 | 1803b560 | 132 | 0048 | |
| 184 | ebfc | 1 | 00007820 | 30076ac0 | 133 | 004a | |
| 185 | ebfc | 1 | 0000641c | 30076ac0 | 133 | 004a | |
| 186 | ebfc | 1 | 00005018 | 30076ac0 | 133 | 004a | |
| 187 | edfc | 1 | 00007828 | 600ed580 | 134 | 004c | |
| 188 | edfc | 1 | 00006624 | 600ed580 | 134 | 004c | |
| 189 | edfc | 1 | 00005420 | 600ed580 | 134 | 004c | |
| 190 | edfc | 1 | 0000421c | 600ed580 | 134 | 004c | |
| 191 | eefc | 1 | 00006030 | c01dab00 | 135 | 004e | |
| 192 | ebfc | 0 | 00004410 | 03016f50 | 137 | 004a | 3a |
| 193 | edfc | 1 | 00006018 | 0602dea0 | 138 | 004c | |
| 194 | e7fc | 0 | 00004810 | 180a4230 | 140 | 0048 | |
| 195 | ebfc | 1 | 00006018 | 30148460 | 141 | 004a | |
| 196 | ebfc | 1 | 00004c14 | 30148460 | 141 | 004a | |
| 197 | edfc | 1 | 00007020 | 602908c0 | 142 | 004c | |
| 198 | e7fc | 0 | 00004810 | 0180aa90 | 144 | 0048 | a2 |
| 199 | e5fc | 0 | 00006010 | 0601ea10 | 146 | 0046 | |
| 200 | e5fc | 1 | 0000460c | 0601ea10 | 146 | 0046 | |
| 201 | e3fc | 0 | 00006810 | 1806f820 | 148 | 0044 | |
| 202 | e3fc | 1 | 00004c0c | 1806f820 | 148 | 0044 | |
| 203 | e5fc | 1 | 00006010 | 300df040 | 149 | 0046 | |
| 204 | e5fc | 1 | 0000460c | 300df040 | 149 | 0046 | |
| 205 | e7fc | 1 | 00005810 | 601be080 | 150 | 0048 | |
| 206 | e5fc | 0 | 00006010 | 018081d0 | 152 | 0046 | 6e |
| 207 | e5fc | 1 | 0000460c | 018081d0 | 152 | 0046 | |
| 208 | e7fc | 1 | 00005810 | 030103a0 | 153 | 0048 | |
| 209 | e7fc | 1 | 0000400c | 030103a0 | 153 | 0048 | |
| 210 | ebfc | 1 | 00005010 | 06020740 | 154 | 004a | |
| 211 | e5fc | 0 | 00005010 | 18072cd0 | 156 | 0046 | |
| 212 | e7fc | 1 | 00006c18 | 300e59a0 | 157 | 0048 | |
| 213 | e7fc | 1 | 00005414 | 300e59a0 | 157 | 0048 | |
| 214 | ebfc | 1 | 00007820 | 601cb340 | 158 | 004a | |
| 215 | ebfc | 1 | 0000641c | 601cb340 | 158 | 004a | |
| 216 | ebfc | 1 | 00005018 | 601cb340 | 158 | 004a | |
| 217 | e5fc | 0 | 00005010 | 0180dcb0 | 160 | 0046 | 71 |
| 218 | e7fc | 1 | 00006c18 | 0301b960 | 161 | 0048 | |
| 219 | e7fc | 1 | 00005414 | 0301b960 | 161 | 0048 | |
| 220 | ebfc | 1 | 00007820 | 060372c0 | 162 | 004a | |
| 221 | e5fc | 0 | 00005010 | 180c3a90 | 164 | 0046 | |
| 222 | e7fc | 1 | 00006c18 | 30187520 | 165 | 0048 | |
| 223 | e7fc | 1 | 00005414 | 30187520 | 165 | 0048 | |
| 224 | e5fc | 0 | 00006010 | c060e440 | 167 | 0046 | |
| 225 | e5fc | 1 | 0000460c | c060e440 | 167 | 0046 | |
| 226 | e7fc | 1 | 00005810 | 0180c880 | 168 | 0048 | c1 |
| 227 | e7fc | 1 | 0000400c | 0180c880 | 168 | 0048 | |
| 228 | e5fc | 0 | 00006010 | 060281e0 | 170 | 0046 | |
| 229 | e5fc | 1 | 0000460c | 060281e0 | 170 | 0046 | |
| 230 | e7fc | 1 | 00005810 | 0c0503c0 | 171 | 0048 | |
| 231 | e5fc | 0 | 00006010 | 30130ed0 | 173 | 0046 | |
| 232 | e5fc | 1 | 0000460c | 30130ed0 | 173 | 0046 | |
| 233 | e7fc | 1 | 00005810 | 60261da0 | 174 | 0048 | |
| 234 | e7fc | 1 | 0000400c | 60261da0 | 174 | 0048 | |
| 235 | e5fc | 0 | 00006010 | 0180d660 | 176 | 0046 | 97 |
| 236 | e5fc | 1 | 0000460c | 0180d660 | 176 | 0046 | |
| 237 | e3fc | 0 | 00006810 | 0602a960 | 178 | 0044 | |
| 238 | e3fc | 1 | 00004c0c | 0602a960 | 178 | 0044 | |
| 239 | e5fc | 1 | 00006010 | 0c0552c0 | 179 | 0046 | |
| 240 | e5fc | 1 | 0000460c | 0c0552c0 | 179 | 0046 | |
| 241 | e7fc | 1 | 00005810 | 180aa580 | 180 | 0048 | |
| 242 | e7fc | 1 | 0000400c | 180aa580 | 180 | 0048 | |
| 243 | ebfc | 1 | 00005010 | 30154b00 | 181 | 004a | |
| 244 | e5fc | 0 | 00005010 | c0543bd0 | 183 | 0046 | |
| 245 | e3fc | 0 | 00006810 | 03001710 | 185 | 0044 | a8 |
| 246 | e3fc | 1 | 00004c0c | 03001710 | 185 | 0044 | |
| 247 | e5fc | 1 | 00006010 | 06002e20 | 186 | 0046 | |
| 248 | e5fc | 1 | 0000460c | 06002e20 | 186 | 0046 | |
| 249 | e7fc | 1 | 00005810 | 0c005c40 | 187 | 0048 | |
| 250 | e7fc | 1 | 0000400c | 0c005c40 | 187 | 0048 | |
| 251 | ebfc | 1 | 00005010 | 1800b880 | 188 | 004a | |
| 252 | edfc | 1 | 00007818 | 30017100 | 189 | 004c | |
| 253 | edfc | 1 | 00006614 | 30017100 | 189 | 004c | |
| 254 | edfc | 1 | 00005410 | 30017100 | 189 | 004c | |
| 255 | edfc | 1 | 0000420c | 30017100 | 189 | 004c | |
| 256 | eefc | 1 | 00006010 | 6002e200 | 190 | 004e | |
| x-a | | | | 600281f0 | | | |
| | | | | 00000000 | | | 0a 07 c0 |

Hardware decoder:

| ec | Q0 | YN | A | x | bits | 10 | codebytes |
|---|---|---|---|---|---|---|---|
| 0 | 2b04 | | 00004000 | 23ca0801 | 0 | 0000 | |
| 1 | d4fc | 1 | 00005608 | 47941002 | 1 | 003c | |
| 2 | d5fc | 1 | 00005608 | 39202004 | 2 | 003e | |
| 3 | d7fc | 1 | 00005808 | 1e384008 | 3 | 0040 | |
| 4 | d5fc | 0 | 00005008 | 3c708010 | 4 | 003e | |
| 5 | d7fc | 1 | 00004c08 | 24d90020 | 5 | 0040 | |
| 6 | d5fc | 0 | 00005008 | 49b20040 | 6 | 003e | |
| 7 | d7fc | 1 | 00004c08 | 3f5c0080 | 7 | 0040 | |
| 8 | dbfc | 1 | 00004808 | 2eb08201 | 8 | 0042 | 82 |
| 9 | e3fc | 1 | 00004808 | 15590402 | 9 | 0044 | |
| 10 | dbfc | 0 | 00007010 | 55641008 | 11 | 0042 | |
| 11 | dbfc | 1 | 00004c0c | 31601008 | 11 | 0042 | |
| 12 | e3fc | 1 | 00005010 | 1ab82010 | 12 | 0044 | |
| 13 | dbfc | 0 | 00007010 | 6ae08040 | 14 | 0042 | |
| 14 | dbfc | 1 | 00004c0c | 46dc8040 | 14 | 0042 | |
| 15 | e3fc | 1 | 00005010 | 45b10080 | 15 | 0044 | |
| 16 | e5fc | 1 | 00006818 | 535a6f01 | 16 | 0046 | 6f |
| 17 | e5fc | 1 | 00004e14 | 39566f01 | 16 | 0046 | |
| 18 | e7fc | 1 | 00006820 | 3ea4de02 | 17 | 0048 | |
| 19 | e7fc | 1 | 0000501c | 26a0de02 | 17 | 0048 | |
| 20 | ebfc | 1 | 00007030 | 1d39bc04 | 18 | 004a | |
| 21 | ebfc | 1 | 00005c2c | 0935bc04 | 18 | 004a | |
| 22 | e5fc | 0 | 00005010 | 24d6f010 | 20 | 0046 | |
| 23 | e7fc | 1 | 00006c18 | 15a5e020 | 21 | 0048 | |
| 24 | e5fc | 0 | 00006010 | 56978080 | 23 | 0046 | |
| 25 | e5fc | 1 | 0000460c | 3c938080 | 23 | 0046 | |
| 26 | e7fc | 1 | 00005810 | 451f7e01 | 24 | 0048 | 7e |
| 27 | e7fc | 1 | 0000400c | 2d1b7e01 | 24 | 0048 | |
| 28 | ebfc | 1 | 00005010 | 2a2efc02 | 25 | 004a | |
| 29 | edfc | 1 | 00007818 | 2c55f804 | 26 | 004c | |
| 30 | edfc | 1 | 00006614 | 1a51f804 | 26 | 004c | |
| 31 | edfc | 1 | 00005410 | 084df804 | 26 | 004c | |
| 32 | e7fc | 0 | 00004810 | 2137e010 | 28 | 0048 | |
| 33 | ebfc | 1 | 00006018 | 1267c020 | 29 | 004a | |
| 34 | e5fc | 0 | 00005010 | 499f0080 | 31 | 0046 | |
| 35 | e7fc | 1 | 00006c18 | 5f362001 | 32 | 0048 | 20 |
| 36 | e7fc | 1 | 00005414 | 47322001 | 32 | 0048 | |
| 37 | ebfc | 1 | 00007820 | 5e5c4002 | 33 | 004a | |
| 38 | ebfc | 1 | 0000641c | 4a584002 | 33 | 004a | |
| 39 | ebfc | 1 | 00005018 | 36544002 | 33 | 004a | |
| 40 | edfc | 1 | 00007828 | 44a08004 | 34 | 004c | |
| 41 | edfc | 1 | 00006624 | 329c8004 | 34 | 004c | |
| 42 | edfc | 1 | 00005420 | 20988004 | 34 | 004c | |
| 43 | edfc | 1 | 0000421c | 0e948004 | 34 | 004c | |
| 44 | e7fc | 0 | 00004810 | 3a520010 | 36 | 0048 | |
| 45 | ebfc | 1 | 00006018 | 449c0020 | 37 | 004a | |
| 46 | ebfc | 1 | 00004c14 | 30980020 | 37 | 004a | |
| 47 | edfc | 1 | 00007020 | 39280040 | 38 | 004c | |
| 48 | edfc | 1 | 00005e1c | 27240040 | 38 | 004c | |
| 49 | edfc | 1 | 00004c18 | 15200040 | 38 | 004c | |
| 50 | eefc | 1 | 00007428 | 06380080 | 39 | 004e | |
| 51 | ebfc | 0 | 00004410 | 18e02a02 | 41 | 004a | 15 |
| 52 | edfc | 1 | 00006018 | 09b85404 | 42 | 004c | |
| 53 | e7fc | 0 | 00004810 | 26e15010 | 44 | 0048 | |
| 54 | ebfc | 1 | 00006018 | 1dbaa020 | 45 | 004a | |
| 55 | ebfc | 1 | 00004c14 | 09b6a020 | 45 | 004a | |
| 56 | e5fc | 0 | 00005010 | 26da8080 | 47 | 0046 | |
| 57 | e7fc | 1 | 00006c18 | 19ad1c01 | 48 | 0048 | 1c |
| 58 | e7fc | 1 | 00005414 | 01a91c01 | 48 | 0048 | |
| 59 | e5fc | 0 | 00006010 | 06a47004 | 50 | 0046 | |
| 60 | e3fc | 0 | 00006810 | 1a91c010 | 52 | 0044 | |
| 61 | dbfc | 0 | 00007010 | 6a470040 | 54 | 0042 | |
| 62 | dbfc | 1 | 00004c0c | 46430040 | 54 | 0042 | |
| 63 | e3fc | 1 | 00005010 | 447e0080 | 55 | 0044 | |
| 64 | e5fc | 1 | 00006818 | 50f42601 | 56 | 0046 | 26 |
| 65 | e5fc | 1 | 00004e14 | 36f02601 | 56 | 0046 | |
| 66 | e7fc | 1 | 00006820 | 39d84c02 | 57 | 0048 | |
| 67 | e7fc | 1 | 0000501c | 21d44c02 | 57 | 0048 | |
| 68 | ebfc | 1 | 00007030 | 13a09804 | 58 | 004a | |
| 69 | e5fc | 0 | 00005010 | 4e826010 | 60 | 0046 | |
| 70 | e7fc | 1 | 00006c18 | 68fcc020 | 61 | 0048 | |
| 71 | e7fc | 1 | 00005414 | 50f8c020 | 61 | 0048 | |
| 72 | ebfc | 1 | 00007820 | 71e98040 | 62 | 004a | |
| 73 | ebfc | 1 | 0000641c | 5de58040 | 62 | 004a | |
| 74 | ebfc | 1 | 00005018 | 49e18040 | 62 | 004a | |

TABLE 7-continued

| | | | | | | | |
|---|---|---|---|---|---|---|---|
| 75 | edfc | 1 | 00007828 | 6bbb0080 | 63 | 004c | |
| 76 | edfc | 1 | 00006624 | 59b70080 | 63 | 004c | |
| 77 | edfc | 1 | 00005420 | 47b30080 | 63 | 004c | |
| 78 | edfc | 1 | 0000421c | 35af0080 | 63 | 004c | |
| 79 | eefc | 1 | 00006030 | 47567b01 | 64 | 004e | 7b |
| 80 | eefc | 1 | 00004f2c | 36527b01 | 64 | 004e | |
| 81 | f1fc | 1 | 00007c50 | 4a9cf602 | 65 | 0050 | |
| 82 | f1fc | 1 | 00006e4c | 3c98f602 | 65 | 0050 | |
| 83 | f1fc | 1 | 00006048 | 2e94f602 | 65 | 0050 | |
| 84 | f1fc | 1 | 00005244 | 2090f602 | 65 | 0050 | |
| 85 | f1fc | 1 | 00004440 | 128cf602 | 65 | 0050 | |
| 86 | f3fc | 1 | 00006c78 | 0911ec04 | 66 | 0052 | |
| 87 | eefc | 0 | 00006028 | 488f6020 | 69 | 004e | |
| 88 | eefc | 1 | 00004f1c | 378b6020 | 69 | 004e | |
| 89 | f1fc | 1 | 00007c30 | 4d0ec040 | 70 | 0050 | |
| 90 | f1fc | 1 | 00006e2c | 3f0ac040 | 70 | 0050 | |
| 91 | f1fc | 1 | 00006028 | 3106c040 | 70 | 0050 | |
| 92 | f1fc | 1 | 00005224 | 2302c040 | 70 | 0050 | |
| 93 | f1fc | 1 | 00004420 | 14fec040 | 70 | 0050 | |
| 94 | f3fc | 1 | 00006c38 | 0df58080 | 71 | 0052 | |
| 95 | f3fc | 1 | 00006034 | 01f18080 | 71 | 0052 | |
| 96 | eefc | 0 | 00006020 | 0f8e8004 | 74 | 004e | a0 |
| 97 | ebfc | 0 | 00004410 | 3e3a0010 | 76 | 004a | |
| 98 | edfc | 1 | 00006018 | 546c0020 | 77 | 004c | |
| 99 | edfc | 1 | 00004e14 | 42680020 | 77 | 004c | |
| 100 | eefc | 1 | 00007820 | 60c80040 | 78 | 004e | |
| 101 | eefc | 1 | 0000671c | 4fc40040 | 78 | 004e | |
| 102 | eefc | 1 | 00005618 | 3ec00040 | 78 | 004e | |
| 103 | eefc | 1 | 00004514 | 2dbc0040 | 78 | 004e | |
| 104 | f1fc | 1 | 00006820 | 39700080 | 79 | 0050 | |
| 105 | f1fc | 1 | 00005a1c | 2b6c0080 | 79 | 0050 | |
| 106 | f1fc | 1 | 00004c18 | 1d680080 | 79 | 0050 | |
| 107 | f3fc | 1 | 00007c28 | 1ec8ab01 | 80 | 0052 | ab |
| 108 | f3fc | 1 | 00007024 | 12c4ab01 | 80 | 0052 | |
| 109 | f3fc | 1 | 00006420 | 06c0ab01 | 80 | 0052 | |
| 110 | eefc | 0 | 00006020 | 36055808 | 83 | 004e | |
| 111 | eefc | 1 | 00004f1c | 25015808 | 83 | 004e | |
| 112 | f1fc | 1 | 00007c30 | 27fab010 | 84 | 0050 | |
| 113 | f1fc | 1 | 00006e2c | 19f6b010 | 84 | 0050 | |
| 114 | f1fc | 1 | 00006028 | 0bf2b010 | 84 | 0050 | |
| 115 | edfc | 0 | 00007020 | 5f958080 | 87 | 004c | |
| 116 | edfc | 1 | 00005e1c | 4d918080 | 87 | 004c | |
| 117 | edfc | 1 | 00004c18 | 3b8d8080 | 87 | 004c | |
| 118 | eefc | 1 | 00007428 | 53136001 | 88 | 004e | 60 |
| 119 | eefc | 1 | 00006324 | 420f6001 | 88 | 004e | |
| 120 | eefc | 1 | 00005220 | 310b6001 | 88 | 004e | |
| 121 | eefc | 1 | 0000411c | 20076001 | 88 | 004e | |
| 122 | f1fc | 1 | 00006030 | 1e06c002 | 89 | 0050 | |
| 123 | f1fc | 1 | 0000522c | 1002c002 | 89 | 0050 | |
| 124 | f1fc | 1 | 00004428 | 01fec002 | 89 | 0050 | |
| 125 | edfc | 0 | 00007020 | 0ff60010 | 92 | 004c | |
| 126 | e7fc | 0 | 00004810 | 3fd80040 | 94 | 0048 | |
| 127 | ebfc | 1 | 00006018 | 4fa80080 | 95 | 004a | |
| 128 | ebfc | 1 | 00004c14 | 3ba40080 | 95 | 004a | |
| 129 | edfc | 1 | 00007020 | 4f406c01 | 96 | 004c | 6c |
| 130 | edfc | 1 | 00004e1c | 3d3c6c01 | 96 | 004c | |
| 131 | edfc | 1 | 00005c18 | 2b386c01 | 96 | 004c | |
| 132 | eefc | 1 | 00007428 | 3268d802 | 97 | 004e | |
| 133 | eefc | 1 | 00006324 | 2164d802 | 97 | 004e | |
| 134 | eefc | 1 | 00005220 | 1060d802 | 97 | 004e | |
| 135 | ebfc | 0 | 00004410 | 41836008 | 99 | 004a | |
| 136 | edfc | 1 | 00006018 | 5afec010 | 100 | 004c | |
| 137 | edfc | 1 | 00004e14 | 48fac010 | 100 | 004c | |
| 138 | eefc | 1 | 00007820 | 6ded8020 | 101 | 004e | |
| 139 | eefc | 1 | 0000671c | 5ce98020 | 101 | 004e | |
| 140 | eefc | 1 | 00005618 | 4be58020 | 101 | 004e | |
| 141 | eefc | 1 | 00004514 | 3ae18020 | 101 | 004e | |
| 142 | f1fc | 1 | 00006820 | 53bb0040 | 102 | 0050 | |
| 143 | f1fc | 1 | 00005a1c | 45b70040 | 102 | 0050 | |
| 144 | f1fc | 1 | 00004c18 | 37b30040 | 102 | 0050 | |
| 145 | f3fc | 1 | 00007c28 | 535e0080 | 103 | 0052 | |
| 146 | f3fc | 1 | 00007024 | 475a0080 | 103 | 0052 | |
| 147 | f3fc | 1 | 00006420 | 3b560080 | 103 | 0052 | |
| 148 | f3fc | 1 | 0000581c | 2f520080 | 103 | 0052 | |
| 149 | f3fc | 1 | 00004c18 | 234e0080 | 103 | 0052 | |
| 150 | f3fc | 1 | 00004014 | 174a0080 | 103 | 0052 | |
| 151 | f4fc | 1 | 00006820 | 168cd601 | 104 | 0054 | d6 |
| 152 | f4fc | 1 | 00005d1c | 0b88d601 | 104 | 0054 | |
| 153 | f4fc | 1 | 00005218 | 0084d601 | 104 | 0054 | |
| 154 | f1fc | 0 | 00005820 | 0426b008 | 107 | 0050 | |
| 155 | edfc | 0 | 00007020 | 21358040 | 110 | 004c | |
| 156 | edfc | 1 | 00005e1c | 0f318040 | 110 | 004c | |
| 157 | e7fc | 0 | 00004810 | 3cc63a01 | 112 | 0048 | 3a |
| 158 | ebfc | 1 | 00006018 | 49847402 | 113 | 004a | |
| 159 | ebfc | 1 | 00004c14 | 35807402 | 113 | 004a | |
| 160 | edfc | 1 | 00007020 | 42f8e804 | 114 | 004c | |
| 161 | edfc | 1 | 00005e1c | 30f4e804 | 114 | 004c | |
| 162 | edfc | 1 | 00004c18 | 1ef0e804 | 114 | 004c | |
| 163 | eefc | 1 | 00007428 | 19d9d008 | 115 | 004e | |
| 164 | eefc | 1 | 00006324 | 08d5d008 | 115 | 004e | |
| 165 | ebfc | 0 | 00004410 | 23574020 | 117 | 004a | |
| 166 | edfc | 1 | 00006018 | 1ea68040 | 118 | 004c | |
| 167 | edfc | 1 | 00004e14 | 0ca28040 | 118 | 004c | |
| 168 | e7fc | 0 | 00004810 | 328aa201 | 120 | 0048 | a2 |
| 169 | ebfc | 1 | 00006018 | 350d4402 | 121 | 004a | |
| 170 | ebfc | 1 | 00004c14 | 21094402 | 121 | 004a | |
| 171 | edfc | 1 | 00007020 | 1a0a8804 | 122 | 004c | |
| 172 | edfc | 1 | 00005e1c | 08068804 | 122 | 004c | |
| 173 | e7fc | 0 | 00004810 | 201a2010 | 124 | 0048 | |
| 174 | ebfc | 1 | 00006018 | 102c4020 | 125 | 004a | |
| 175 | e5fc | 0 | 00005010 | 40b10080 | 127 | 0046 | |
| 176 | e7fc | 1 | 00006c18 | 4d5a6e01 | 128 | 0048 | 6e |
| 177 | e7fc | 1 | 00005414 | 35566e01 | 128 | 0048 | |
| 178 | ebfc | 1 | 00007820 | 3aa4dc02 | 129 | 004a | |
| 179 | ebfc | 1 | 0000641c | 26a0dc02 | 129 | 004a | |
| 180 | ebfc | 1 | 00005018 | 129cdc02 | 129 | 004a | |
| 181 | e5fc | 0 | 00005010 | 4a737008 | 131 | 0046 | |
| 182 | e7fc | 1 | 00006c18 | 60dee010 | 132 | 0048 | |
| 183 | e7fc | 1 | 00005414 | 48dae010 | 132 | 0048 | |
| 184 | ebfc | 1 | 00007820 | 61adc020 | 133 | 004a | |
| 185 | ebfc | 1 | 0000641c | 4da9c020 | 133 | 004a | |
| 186 | ebfc | 1 | 00005018 | 39a5c020 | 133 | 004a | |
| 187 | edfc | 1 | 00007828 | 4b438040 | 134 | 004c | |
| 188 | edfc | 1 | 00006624 | 393f8040 | 134 | 004c | |
| 189 | edfc | 1 | 00005420 | 273b8040 | 134 | 004c | |
| 190 | edfc | 1 | 0000421c | 15378040 | 134 | 004c | |
| 191 | eefc | 1 | 00006030 | 06670080 | 135 | 004e | |
| 192 | ebfc | 0 | 00004410 | 199ce202 | 137 | 004a | 71 |
| 193 | edfc | 1 | 00006018 | 0b31c404 | 138 | 004c | |
| 194 | e7fc | 0 | 00004810 | 2cc71010 | 140 | 0048 | |
| 195 | ebfc | 1 | 00006018 | 29862020 | 141 | 004a | |
| 196 | ebfc | 1 | 00004c14 | 15822020 | 141 | 004a | |
| 197 | edfc | 1 | 00007020 | 02fc4040 | 142 | 004c | |
| 198 | e7fc | 0 | 00004810 | 0bf1c101 | 144 | 0048 | c1 |
| 199 | e5fc | 0 | 00006010 | 2fc70404 | 146 | 0046 | |
| 200 | e5fc | 1 | 0000460c | 15c30404 | 146 | 0046 | |
| 201 | e3fc | 0 | 00006810 | 570c1010 | 148 | 0044 | |
| 202 | e3fc | 1 | 00004c0c | 3b081010 | 148 | 0044 | |
| 203 | e5fc | 1 | 00006010 | 3e082020 | 149 | 0046 | |
| 204 | e5fc | 1 | 0000460c | 24042020 | 149 | 0046 | |
| 205 | e7fc | 1 | 00005810 | 14004040 | 150 | 0048 | |
| 206 | e5fc | 0 | 00006010 | 50019701 | 152 | 0046 | 97 |
| 207 | e5fc | 1 | 0000460c | 35fd9701 | 152 | 0046 | |
| 208 | e7fc | 1 | 00005810 | 37f32e02 | 153 | 0048 | |
| 209 | e7fc | 1 | 0000400c | 1fef2e02 | 153 | 0048 | |
| 210 | ebfc | 1 | 00005010 | 0fd65c04 | 154 | 004a | |
| 211 | e5fc | 0 | 00005010 | 3f597010 | 156 | 0046 | |
| 212 | e7fc | 1 | 00006c18 | 4aaae020 | 157 | 0048 | |
| 213 | e7fc | 1 | 00005414 | 32a6e020 | 157 | 0048 | |
| 214 | ebfc | 1 | 00007820 | 3545c040 | 158 | 004a | |
| 215 | ebfc | 1 | 0000641c | 2141c040 | 158 | 004a | |
| 216 | ebfc | 1 | 00005018 | 0d3dc040 | 158 | 004a | |
| 217 | e5fc | 0 | 00005010 | 34f7a801 | 160 | 0046 | a8 |
| 218 | e7fc | 1 | 00006c18 | 35e75002 | 161 | 0048 | |
| 219 | e7fc | 1 | 00005414 | 1de35002 | 161 | 0048 | |
| 220 | ebfc | 1 | 00007820 | 0bbea004 | 162 | 004a | |
| 221 | e5fc | 0 | 00005010 | 2efa8010 | 164 | 0046 | |
| 222 | e7fc | 1 | 00006c18 | 29ed0020 | 165 | 0048 | |
| 223 | e7fc | 1 | 00005414 | 11e90020 | 165 | 0048 | |
| 224 | e5fc | 0 | 00006010 | 47a40080 | 167 | 0046 | |
| 225 | e5fc | 1 | 0000460c | 2da00080 | 167 | 0046 | |
| 226 | e7fc | 1 | 00005810 | 27380a01 | 168 | 0048 | 0a |
| 227 | e7fc | 1 | 0000400c | 0f340a01 | 168 | 0048 | |
| 228 | e5fc | 0 | 00006010 | 3cd02804 | 170 | 0046 | |
| 229 | e5fc | 1 | 0000460c | 22cc2804 | 170 | 0046 | |
| 230 | e7fc | 1 | 00005810 | 11905008 | 171 | 0048 | |
| 231 | e5fc | 0 | 00006010 | 46414020 | 173 | 0046 | |
| 232 | e5fc | 1 | 0000460c | 2c3d4020 | 173 | 0046 | |
| 233 | e7fc | 1 | 00005810 | 24728040 | 174 | 0048 | |
| 234 | e7fc | 1 | 0000400c | 0c6e8040 | 174 | 0048 | |
| 235 | e5fc | 0 | 00006010 | 31ba0701 | 176 | 0046 | 07 |
| 236 | e5fc | 1 | 0000460c | 17b60701 | 176 | 0046 | |
| 237 | e3fc | 0 | 00006810 | 5ed81c04 | 178 | 0044 | |
| 238 | e3fc | 1 | 00004c0c | 42d41d04 | 178 | 0044 | |

TABLE 7-continued

| | | | | | | | |
|---|---|---|---|---|---|---|---|
| 239 | e5fc | 1 | 00006010 | 4da03808 | 179 | 0046 | |
| 240 | e5fc | 1 | 0000460c | 339c3808 | 179 | 0046 | |
| 241 | e7fc | 1 | 00005810 | 33307010 | 180 | 0048 | |
| 242 | e7fc | 1 | 0000400c | 1b2c7010 | 180 | 0048 | |
| 243 | ebfc | 1 | 00005010 | 0650e020 | 181 | 004a | |
| 244 | e5fc | 0 | 00005010 | 19438080 | 183 | 0046 | |
| 245 | e3fc | 1 | 00006810 | 650f8002 | 185 | 0044 | c0 |
| 246 | e3fc | 1 | 00004c0c | 490b8002 | 185 | 0044 | |
| 247 | e5fc | 1 | 00006010 | 5a0f0004 | 186 | 0046 | |
| 248 | e5fc | 1 | 0000460c | 400b0004 | 186 | 0046 | |
| 249 | e7fc | 1 | 00005810 | 4c0e0008 | 187 | 0048 | |
| 250 | e7fc | 1 | 0000400c | 340a0008 | 187 | 0048 | |
| 251 | ebfc | 1 | 00005010 | 380c0010 | 188 | 004a | |
| 252 | edfc | 1 | 00007818 | 48100020 | 189 | 004c | |
| 253 | edfc | 1 | 00006614 | 360c0020 | 189 | 004c | |
| 254 | edfc | 1 | 00005410 | 24080020 | 189 | 004c | |
| 255 | edfc | 1 | 0000420c | 12040020 | 189 | 004c | |
| 256 | eefc | 1 | 00006010 | 00000040 | 190 | 004e | |

Software decoder:

| ec | Q0 | YN | A | x | bits | 10 | codebytes |
|---|---|---|---|---|---|---|---|
| 0 | 2b04 | | 0000c000 | e3ca0801 | 0 | 0000 | |
| 1 | d4fc | 1 | 0000a9f8 | f18c1002 | 1 | 003c | |
| 2 | d5fc | 1 | 0000a9f8 | e3182004 | 2 | 003e | |
| 3 | d7fc | 1 | 0000a7f8 | c6304008 | 3 | 0040 | |
| 4 | d5fc | 0 | 0000aff8 | ec688010 | 4 | 003e | |
| 5 | d7fc | 1 | 0000b3f8 | d8d10020 | 5 | 0040 | |
| 6 | d5fc | 0 | 0000aff8 | f9aa0040 | 6 | 003e | |
| 7 | d7fc | 1 | 0000b3f8 | f3540080 | 7 | 0040 | |
| 8 | dbfc | 1 | 0000b7f8 | e6a88201 | 8 | 0042 | 82 |
| 9 | e3fc | 1 | 0000b7f8 | cd510402 | 9 | 0044 | |
| 10 | dbfc | 0 | 00008ff0 | e5541008 | 11 | 0042 | |
| 11 | dbfc | 1 | 0000b3f4 | e5541008 | 11 | 0042 | |
| 12 | e3fc | 1 | 0000aff0 | caa82010 | 12 | 0044 | |
| 13 | dbfc | 0 | 00008ff0 | fad08040 | 14 | 0042 | |
| 14 | dbfc | 1 | 0000b3f4 | fad08040 | 14 | 0042 | |
| 15 | e3fc | 1 | 0000aff0 | f5a10080 | 15 | 0044 | |
| 16 | e5fc | 1 | 000097e8 | eb426f01 | 16 | 0046 | 6f |
| 17 | e5fc | 1 | 0000b1ec | eb426f01 | 16 | 0046 | |
| 18 | e7fc | 1 | 000097e0 | d684de02 | 17 | 0048 | |
| 19 | e7fc | 1 | 0000afe4 | d684de02 | 17 | 0048 | |
| 20 | ebfc | 1 | 00008fd0 | ad09bc04 | 18 | 004a | |
| 21 | ebfc | 1 | 0000a3d4 | ad09bc04 | 18 | 004a | |
| 22 | e5fc | 0 | 0000aff0 | d4c6f010 | 20 | 0046 | |
| 23 | e7fc | 1 | 000093e8 | a98de020 | 21 | 0048 | |
| 24 | e5fc | 0 | 00009ff0 | f6878080 | 23 | 0046 | |
| 25 | e5fc | 1 | 0000b9f4 | f6878080 | 23 | 0046 | |
| 26 | e7fc | 1 | 0000a7f0 | ed0f7e01 | 24 | 0048 | 7e |
| 27 | e7fc | 1 | 0000bff4 | ed0f7e01 | 24 | 0048 | |
| 28 | ebfc | 1 | 0000aff0 | da1efc02 | 25 | 004a | |
| 29 | edfc | 1 | 000087e8 | b43df804 | 26 | 004c | |
| 30 | edfc | 1 | 000099ec | b43df804 | 26 | 004c | |
| 31 | edfc | 1 | 0000abf0 | b43df804 | 26 | 004c | |
| 32 | e7fc | 0 | 0000b7f0 | d927e010 | 28 | 0048 | |
| 33 | ebfc | 1 | 00009fe8 | b24fc020 | 29 | 004a | |
| 34 | e5fc | 0 | 0000aff0 | f98f0080 | 31 | 0046 | |
| 35 | e7fc | 1 | 000093e8 | f31e2001 | 32 | 0048 | 20 |
| 36 | e7fc | 1 | 0000abec | f31e2001 | 32 | 0048 | |
| 37 | ebfc | 1 | 000087e0 | e63c4002 | 33 | 004a | |
| 38 | ebfc | 1 | 00009be4 | e63c4002 | 33 | 004a | |
| 39 | ebfc | 1 | 0000afe8 | e63c4002 | 33 | 004a | |
| 40 | edfc | 1 | 000087d8 | cc788004 | 34 | 004c | |
| 41 | edfc | 1 | 000099dc | cc788004 | 34 | 004c | |
| 42 | edfc | 1 | 0000abe0 | cc788004 | 34 | 004c | |
| 43 | edfc | 1 | 0000bde4 | cc788004 | 34 | 004c | |
| 44 | e7fc | 0 | 0000b7f0 | f2420010 | 36 | 0048 | |
| 45 | ebfc | 1 | 00009fe8 | e4840020 | 37 | 004a | |
| 46 | ebfc | 1 | 0000b3ec | e4840020 | 37 | 004a | |
| 47 | edfc | 1 | 000087e0 | c9080040 | 38 | 004c | |
| 48 | edfc | 1 | 0000a1e4 | c9080040 | 38 | 004c | |
| 49 | edfc | 1 | 0000b3e8 | c9080040 | 38 | 004c | |
| 50 | eefc | 1 | 00008bd8 | 92100080 | 39 | 004e | |
| 51 | ebfc | 0 | 0000bbf0 | d4d02a02 | 41 | 004a | 15 |
| 52 | ebfc | 1 | 00009fe8 | a9a05404 | 42 | 004c | |
| 53 | e7fc | 0 | 0000b7f0 | ded15010 | 44 | 0048 | |
| 54 | ebfc | 1 | 00009fe8 | bda2a020 | 45 | 004a | |
| 55 | ebfc | 1 | 0000b3ec | bda2a020 | 45 | 004a | |
| 56 | e5fc | 0 | 0000aff0 | d6ca8080 | 44 | 0046 | |
| 57 | e7fc | 1 | 000093e8 | ad951c01 | 48 | 0048 | 1c |
| 58 | e7fc | 1 | 0000abec | ad951c01 | 48 | 0048 | |
| 59 | e5fc | 0 | 00009ff0 | a6947004 | 50 | 0046 | |
| 60 | e3fc | 0 | 000097f0 | b281c010 | 52 | 0044 | |
| 61 | dbfc | 0 | 00008ff0 | fa370040 | 54 | 0042 | |
| 62 | dbfc | 1 | 0000b3f4 | fa370040 | 54 | 0042 | |
| 63 | e3fc | 1 | 0000aff0 | f46e0080 | 55 | 0044 | |
| 64 | e5fc | 1 | 000097e8 | e8dc2601 | 56 | 0046 | 26 |
| 65 | e5fc | 1 | 0000b1ec | e8dc2601 | 56 | 0046 | |
| 66 | e7fc | 1 | 000097e0 | d1b84c02 | 57 | 0048 | |
| 67 | e7fc | 1 | 0000afe4 | d1b84c02 | 57 | 0048 | |
| 68 | ebfc | 1 | 00008fd0 | a3709804 | 58 | 004a | |
| 69 | e5fc | 0 | 0000aff0 | fe726010 | 60 | 0046 | |
| 70 | e7fc | 1 | 000093e8 | fce4c020 | 61 | 0048 | |
| 71 | e7fc | 1 | 0000abec | fce4c020 | 61 | 0048 | |
| 72 | ebfc | 1 | 000087e0 | f9c98040 | 62 | 004a | |
| 73 | ebfc | 1 | 00009be4 | f9c98040 | 62 | 004a | |
| 74 | ebfc | 1 | 0000afe8 | f9c98040 | 62 | 004a | |
| 75 | edfc | 1 | 000087d8 | f3930080 | 63 | 004c | |
| 76 | edfc | 1 | 000099dc | f3930080 | 63 | 004c | |
| 77 | edfc | 1 | 0000abe0 | f3930080 | 63 | 004c | |
| 78 | edfc | 1 | 0000bde4 | f3930080 | 63 | 004c | |
| 79 | eefc | 1 | 00009fd0 | e7267b01 | 64 | 004e | 7b |
| 80 | eefc | 1 | 0000b0d4 | e7267b01 | 64 | 004e | |
| 81 | f1fc | 1 | 000083b0 | ce4cf602 | 65 | 0050 | |
| 82 | f1fc | 1 | 000091b4 | ce4cf602 | 65 | 0050 | |
| 83 | f1fc | 1 | 00009fb8 | ce4cf602 | 65 | 0050 | |
| 84 | f1fc | 1 | 0000adbc | ce4cf602 | 65 | 0050 | |
| 85 | f1fc | 1 | 0000bbc0 | ce4cf602 | 65 | 0050 | |
| 86 | f3fc | 1 | 00009388 | 9c99ec04 | 66 | 0052 | |
| 87 | eefc | 0 | 00009fe8 | e86f6020 | 69 | 004e | |
| 88 | eefc | 1 | 0000b0e4 | e86f6020 | 69 | 004e | |
| 89 | f1fc | 1 | 000083d0 | d0dec040 | 70 | 0050 | |
| 90 | f1fc | 1 | 000091d4 | d0dec040 | 70 | 0050 | |
| 91 | f1fc | 1 | 00009fd8 | d0dec040 | 70 | 0050 | |
| 92 | f1fc | 1 | 0000addc | d0dec040 | 70 | 0050 | |
| 93 | f1fc | 1 | 0000bbe0 | d0dec040 | 70 | 0050 | |
| 94 | f3fc | 1 | 000093c8 | a1bd8080 | 71 | 0052 | |
| 95 | f3fc | 1 | 00009fcc | a1bd8080 | 71 | 0052 | |
| 96 | eefc | 0 | 00009fe0 | af6e8004 | 74 | 004e | a0 |
| 97 | ebfc | 0 | 0000bbf0 | fa2a0010 | 76 | 004a | |
| 98 | edfc | 1 | 00009fe8 | f4540020 | 77 | 004c | |
| 99 | edfc | 1 | 0000b1ec | f4540020 | 77 | 004c | |
| 100 | eefc | 1 | 000087e0 | e8a80040 | 78 | 004e | |
| 101 | eefc | 1 | 000098e4 | e8a80040 | 78 | 004e | |
| 102 | eefc | 1 | 0000a9e8 | e8a80040 | 78 | 004e | |
| 103 | eefc | 1 | 0000baec | e8a80040 | 78 | 004e | |
| 104 | f1fc | 1 | 000097e0 | d1500080 | 79 | 0050 | |
| 105 | f1fc | 1 | 0000a5e4 | d1500080 | 79 | 0050 | |
| 106 | f1fc | 1 | 0000b3e8 | d1500080 | 79 | 0050 | |
| 107 | f3fc | 1 | 000083d8 | a2a0ab01 | 80 | 0052 | ab |
| 108 | f3fc | 1 | 00008fdc | a2a0ab01 | 80 | 0052 | |
| 109 | f3fc | 1 | 00009be0 | a2a0ab01 | 80 | 0052 | |
| 110 | eefc | 0 | 00009fe0 | d5e55808 | 83 | 004e | |
| 111 | eefc | 1 | 0000b0e4 | d5e55808 | 83 | 004e | |
| 112 | f1fc | 1 | 000083d0 | abcab010 | 84 | 0050 | |
| 113 | f1fc | 1 | 000091d4 | abcab010 | 84 | 0050 | |
| 114 | f1fc | 1 | 00009fd8 | abcab010 | 84 | 0050 | |
| 115 | edfc | 0 | 00008fe0 | ef758080 | 87 | 004c | |
| 116 | edfc | 1 | 0000a1e4 | ef758080 | 87 | 004c | |
| 117 | edfc | 1 | 0000b3e8 | ef758080 | 87 | 004c | |
| 118 | eefc | 1 | 00008bd8 | deeb6001 | 88 | 004e | 60 |
| 119 | eefc | 1 | 00009cdc | deeb6001 | 88 | 004e | |
| 120 | eefc | 1 | 0000ade0 | deeb6001 | 88 | 004e | |
| 121 | eefc | 1 | 0000bee4 | deeb6001 | 88 | 004e | |
| 122 | f1fc | 1 | 00009fd8 | bdd6c002 | 89 | 0050 | |
| 123 | f1fc | 1 | 0000add4 | bdd6c002 | 89 | 0050 | |
| 124 | f1fc | 1 | 0000bbd8 | bdd6c002 | 89 | 0050 | |
| 125 | edfc | 0 | 00008fe0 | 9fd60010 | 92 | 004c | |
| 126 | e7fc | 1 | 0000b7f0 | f7c80040 | 94 | 0048 | |
| 127 | ebfc | 1 | 00009fe8 | ef900080 | 95 | 004a | |
| 128 | ebfc | 1 | 0000b3ec | ef900080 | 95 | 004a | |
| 129 | edfc | 1 | 00008fe0 | df206c01 | 96 | 004c | 6c |
| 130 | edfc | 1 | 0000a1e4 | df206c01 | 96 | 004c | |
| 131 | edfc | 1 | 0000b3e8 | df206c01 | 96 | 004c | |
| 132 | eefc | 1 | 00008bd8 | be40d802 | 97 | 004e | |
| 133 | eefc | 1 | 00009cdc | be40d802 | 97 | 004e | |
| 134 | eefc | 1 | 0000ade0 | be40d802 | 97 | 004e | |
| 135 | ebfc | 0 | 0000bbf0 | fd736008 | 99 | 004a | |
| 136 | edfc | 1 | 00009fe8 | fae6c010 | 100 | 004c | |
| 137 | edfc | 1 | 0000b1ec | fae6c010 | 100 | 004c | |
| 138 | eefc | 1 | 000087e0 | f5cd8020 | 101 | 004e | |
| 139 | eefc | 1 | 000098e4 | f5cd8020 | 101 | 004e | |
| 140 | eefc | 1 | 0000a9e8 | f5cd8020 | 101 | 004e | |
| 141 | eefc | 1 | 0000baec | f5cd8020 | 101 | 004e | |
| 142 | f1fc | 1 | 000097e0 | eb9b0040 | 102 | 0050 | |

TABLE 7-continued

| | | | | | | | |
|---|---|---|---|---|---|---|---|
| 143 | f1fc | 1 | 0000a5e4 | eb9b0040 | 102 | 0050 | |
| 144 | f1fc | 1 | 0000b3e8 | eb9b0040 | 102 | 0050 | |
| 145 | f3fc | 1 | 000083d8 | d7360080 | 103 | 0052 | |
| 146 | f3fc | 1 | 00008fdc | d7360080 | 103 | 0052 | |
| 147 | f3fc | 1 | 00009be0 | d7360080 | 103 | 0052 | |
| 148 | f3fc | 1 | 0000a7e4 | d7360080 | 103 | 0052 | |
| 149 | f3fc | 1 | 0000b3e8 | d7360080 | 103 | 0052 | |
| 150 | f3fc | 1 | 0000bfec | d7360080 | 103 | 0052 | |
| 151 | f4fc | 1 | 000097e0 | ae6cd601 | 104 | 0054 | d6 |
| 152 | f4fc | 1 | 0000a2e4 | ae6cd601 | 104 | 0054 | |
| 153 | f4fc | 1 | 0000ade8 | ae6cd601 | 104 | 0054 | |
| 154 | f1fc | 0 | 0000a7e0 | ac06b008 | 107 | 0050 | |
| 155 | edfc | 0 | 00008fe0 | b1158040 | 110 | 004c | |
| 156 | edfc | 1 | 0000a1e4 | b1158040 | 110 | 004c | |
| 157 | e7fc | 0 | 0000b7f0 | f4b63a01 | 112 | 0048 | 3a |
| 158 | ebfc | 1 | 00009fe8 | e96c7402 | 113 | 004a | |
| 159 | ebfc | 1 | 0000b3ec | e96c7402 | 113 | 004a | |
| 160 | edfc | 1 | 00008fe0 | d2d8e804 | 114 | 004c | |
| 161 | edfc | 1 | 0000a1e4 | d2d8e804 | 114 | 004c | |
| 162 | edfc | 1 | 0000b3e8 | d2d8e804 | 114 | 004c | |
| 163 | eefc | 1 | 00008bd8 | a5b1d008 | 115 | 004e | |
| 164 | eefc | 1 | 00009cdc | a5b1d008 | 115 | 004e | |
| 165 | ebfc | 0 | 0000bbf0 | df474020 | 117 | 004a | |
| 166 | edfc | 1 | 00009fe8 | be8e8040 | 118 | 004c | |
| 167 | edfc | 1 | 0000b1ec | be8e8040 | 118 | 004c | |
| 168 | e7fc | 0 | 0000b7f0 | ea7aa201 | 120 | 0048 | a2 |
| 169 | ebfc | 1 | 00009fe8 | d4f54402 | 121 | 004a | |
| 170 | ebfc | 1 | 0000b3ec | d4f54402 | 121 | 004a | |
| 171 | edfc | 1 | 00008fe0 | a9ea8804 | 122 | 004c | |
| 172 | edfc | 1 | 0000a1e4 | a9ea8804 | 122 | 004c | |
| 173 | e7fc | 0 | 0000b7f0 | d80a2010 | 124 | 0048 | |
| 174 | ebfc | 1 | 00009fe8 | b0144020 | 125 | 004a | |
| 175 | e5fc | 0 | 0000aff0 | f0a10080 | 127 | 0046 | |
| 176 | e7fc | 1 | 000093e8 | e1426e01 | 128 | 0048 | 6e |
| 177 | e7fc | 1 | 0000abec | e1426e01 | 128 | 0048 | |
| 178 | ebfc | 1 | 000087e0 | c284dc02 | 129 | 004a | |
| 179 | ebfc | 1 | 00009be4 | c284dc02 | 129 | 004a | |
| 180 | ebfc | 1 | 0000afe8 | c284dc02 | 129 | 004a | |
| 181 | e5fc | 0 | 0000aff0 | fa637008 | 131 | 0046 | |
| 182 | e7fc | 1 | 000093e8 | f4c6e010 | 132 | 0048 | |
| 183 | e7fc | 1 | 0000abec | f4c6e010 | 132 | 0048 | |
| 184 | ebfc | 1 | 000087e0 | e98dc020 | 133 | 004a | |
| 185 | ebfc | 1 | 00009be4 | e98dc020 | 133 | 004a | |
| 186 | ebfc | 1 | 0000afe8 | e98dc020 | 133 | 004a | |
| 187 | edfc | 1 | 000087d8 | d31b8040 | 134 | 004c | |
| 188 | edfc | 1 | 000099dc | d31b8040 | 134 | 004c | |
| 189 | edfc | 1 | 0000abe0 | d31b8040 | 134 | 004c | |
| 190 | edfc | 1 | 0000bde4 | d31b8040 | 134 | 004c | |
| 191 | eefc | 1 | 00009fd0 | a6370080 | 135 | 004e | |
| 192 | ebfc | 0 | 0000bbf0 | d58ce202 | 137 | 004a | 71 |
| 193 | edfc | 1 | 00009fe8 | ab19c404 | 138 | 004c | |
| 194 | e7fc | 0 | 0000b7f0 | e4b71010 | 140 | 0048 | |
| 195 | ebfc | 1 | 00009fe8 | c96e2020 | 141 | 004a | |
| 196 | ebfc | 1 | 0000b3ec | c96e2020 | 141 | 004a | |
| 197 | edfc | 1 | 00008fe0 | 92dc4040 | 142 | 004c | |
| 198 | e7fc | 0 | 0000b7f0 | c3e1c101 | 144 | 0048 | c1 |
| 199 | e5fc | 0 | 00009ff0 | cfb70404 | 146 | 0046 | |
| 200 | e5fc | 1 | 0000b9f4 | cfb70404 | 146 | 0046 | |
| 201 | e3fc | 0 | 000097f0 | eefc1010 | 148 | 0044 | |
| 202 | e3fc | 1 | 0000b3f4 | eefc1010 | 148 | 0044 | |
| 203 | e5fc | 0 | 00009ff0 | ddf82020 | 149 | 0046 | |
| 204 | e5fc | 1 | 0000b9f4 | ddf82020 | 149 | 0046 | |
| 205 | e7fc | 1 | 0000a7f0 | bbf04040 | 150 | 0048 | |
| 206 | e5fc | 0 | 00009ff0 | eff19701 | 152 | 0046 | 97 |
| 207 | e5fc | 1 | 0000b9f4 | eff19701 | 152 | 0046 | |
| 208 | e7fc | 1 | 0000a7f0 | dfe32e02 | 153 | 0048 | |
| 209 | e7fc | 1 | 0000bff4 | dfe32e02 | 153 | 0048 | |
| 210 | ebfc | 1 | 0000aff0 | bfc65c04 | 154 | 004a | |
| 211 | e5fc | 0 | 0000aff0 | ef497010 | 156 | 0046 | |
| 212 | e7fc | 1 | 000093e8 | de92e020 | 157 | 0048 | |
| 213 | e7fc | 1 | 0000abec | de92e020 | 157 | 0048 | |
| 214 | ebfc | 1 | 000087e0 | bd25c040 | 158 | 004a | |
| 215 | ebfc | 1 | 00009be4 | bd25c040 | 158 | 004a | |
| 216 | ebfc | 1 | 0000afe8 | bd25c040 | 158 | 004a | |
| 217 | e5fc | 0 | 0000aff0 | e4e7a801 | 160 | 0046 | a8 |
| 218 | e7fc | 1 | 000093e8 | c9cf5002 | 161 | 0048 | |
| 219 | e7fc | 1 | 0000abec | c9cf5002 | 161 | 0048 | |
| 220 | ebfc | 1 | 000087e0 | 939ea004 | 162 | 004a | |
| 221 | e5fc | 0 | 0000aff0 | deea8010 | 164 | 0046 | |
| 222 | e7fc | 1 | 000093e8 | bdd50020 | 165 | 0048 | |
| 223 | e7fc | 1 | 0000abec | bdd50020 | 165 | 0048 | |
| 224 | e5fc | 0 | 00009ff0 | e7940080 | 167 | 0046 | |
| 225 | e5fc | 1 | 0000b9f4 | e7940080 | 167 | 0046 | |
| 226 | e7fc | 1 | 0000a7f0 | cf280a01 | 168 | 0048 | 0a |
| 227 | e7fc | 1 | 0000bff4 | cf280a01 | 168 | 0048 | |
| 228 | e5fc | 0 | 00009ff0 | dcc02804 | 170 | 0046 | |
| 229 | e5fc | 1 | 0000b9f4 | dcc02804 | 170 | 0046 | |
| 230 | e7fc | 1 | 0000a7f0 | b9805008 | 171 | 0048 | |
| 231 | e5fc | 0 | 00009ff0 | e6314020 | 173 | 0046 | |
| 232 | e5fc | 1 | 0000b9f4 | e6314020 | 173 | 0046 | |
| 233 | e7fc | 1 | 0000a7f0 | cc628040 | 174 | 0048 | |
| 234 | e7fc | 1 | 0000bff4 | cc628040 | 174 | 0048 | |
| 235 | e5fc | 0 | 00009ff0 | d1aa0701 | 176 | 0046 | 07 |
| 236 | e5fc | 1 | 0000b9f4 | d1aa0701 | 176 | 0046 | |
| 237 | e3fc | 0 | 000097f0 | f6c81c04 | 178 | 0044 | |
| 238 | e3fc | 1 | 0000b3f4 | f6c81c04 | 178 | 0044 | |
| 239 | e5fc | 0 | 00009ff0 | ed903808 | 179 | 0046 | |
| 240 | e5fc | 1 | 0000b9f4 | ed903808 | 179 | 0046 | |
| 241 | e7fc | 1 | 0000a7f0 | db207010 | 180 | 0048 | |
| 242 | e7fc | 1 | 0000bff4 | db207010 | 180 | 0048 | |
| 243 | ebfc | 1 | 0000aff0 | b640e020 | 181 | 004a | |
| 244 | e5fc | 0 | 0000aff0 | c9338080 | 183 | 0046 | |
| 245 | e3fc | 0 | 000097f0 | fcff8002 | 185 | 0044 | c0 |
| 246 | e3fc | 1 | 0000b3f4 | fcff8002 | 185 | 0044 | |
| 247 | e5fc | 0 | 00009ff0 | f9ff0004 | 186 | 0046 | |
| 248 | e5fc | 1 | 0000b9f4 | f9ff0004 | 186 | 0046 | |
| 249 | e7fc | 1 | 0000a7f0 | f3fe0008 | 187 | 0048 | |
| 250 | e7fc | 1 | 0000bff4 | f3fe0008 | 187 | 0048 | |
| 251 | ebfc | 1 | 0000aff0 | e7fc0010 | 188 | 004a | |
| 252 | edfc | 1 | 000087e8 | cff80020 | 189 | 004c | |
| 253 | edfc | 1 | 000099ec | cff80020 | 189 | 004c | |
| 254 | edfc | 1 | 0000abf0 | cff80020 | 189 | 004c | |
| 255 | edfc | 1 | 0000bdf4 | cff80020 | 189 | 004c | |
| 256 | eefc | 1 | 00009ff0 | 9ff00040 | 190 | 004e | |

We claim:

1. In a binary arithmetic coding data compression system in which interval an augend A is reduced in value as successive binary decision events are encoded and in which, when A drops in value to less than a prescribed minimum AMIN, A is renormalized to exceed or equal AMIN, a computer-implemented method of adapting an estimated value Qe of one of the two possible binary decision events as successive decision events are encoded comprising the steps of:
   storing A in the computer as a word having at least n bits where n is a positive integer;
   selecting and storing in computer memory a plurality of permitted Qe values;
   pointing to one of the stored Qe values as a current Qe value;
   upon each successive binary decision event, changing the value of A to correspond to a current Qe value or current (A−Qe) value;
   selecting a value for AMIN;
   changing and storing in the computer the selected value for AMIN by a scale factor to represent AMIN by a 1 bit followed by (n−1) 0 bits;
   scaling, with a processor in the computer, the selected Qe values by the scale factor; and
   renormalizing A and up-dating a current scaled Qe value to another scaled Qe value in a processor of the computer in response to the nth bit of A changing from 1 to 0.

2. The method of claim 1 wherein said AMIN selecting step includes the step of representing AMIN as Hex '1000'.

3. The method of claim 1 wherein said Qe value selecting step includes:
   choosing Qe values which are twelve bits in length wherein the least significant bit of each Qe value is set.

4. The method of claim 1 wherein said Qe value selecting step further includes:

choosing Qe values in which, for each Qe value, no more than five of the twelve bits are set.

5. The method of claim 1 wherein said Qe up-dating includes the steps of:
revising Qe to a higher scaled value when A is renormalized after a Qe event;
revising Qe to a lower scaled value when A is renormalized after a non-Qe event;
wherein each Qe value approximately equal to AMIN/($2^m$) (where m is a positive integer) is characterized as a bad Qe value and wherein revising a given bad Qe value after a Qe event renormalization includes the step of augmenting the given bad value to a higher value which, after a non-Qe event renormalization, takes on a value other than the given bad Qe value.

6. The method of claim 1 wherein the Qe probability corresponds to the probability of the less probable binary event and wherein the selecting of Qe values includes the step of:
representing Qe as a positive value when the more probable binary event corresponds to a first type of binary decision outcome; and
representing Qe as a negative value when the more probable binary event corresponds to the other type of binary decision outcome.

7. The method of claim 1 comprising the further step of:
forming a six-bit coding parameter for a decision to be encoded in which one bit indicates which decision event is the more probable decision event and in which the five remaining bits identify a corresponding Qe value.

8. The method of claim 1 comprising the further step of:
storing the scaled values in a table;
wherein said Qe up-dating step includes retrieving a value from the table of scaled Qe vales.

9. In a binary arithmetic coding system, an encoder comprising:
means for storing encoded data bytes;
a code stream register having (a) a binary fraction portion for containing code stream data which is adjusted by a current interval value when a first type of binary decision is encoded and remains unadjusted by the current interval value when the other binary event is encoded, (b) a next byte portion for containing code stream data which is to be shipped next to said storing means, and (c) at least one spacer bit interposed between said binary fraction portion and said next byte portion;
means for shifting code stream data through the shift register in response to the encoding of decision events;
means for shipping out one byte of data at a time from the code stream register to the storing means; and
means for identifying a current number line interval with a first code stream value that points to a first bound of the interval, wherein said identifying means excludes the other bound from the current interval;
where another encoder identifies said current number line interval with a second code stream value which points as close to said other bound of the current number line interval as possible without including said other bound.

10. An encoder as in claim 9 wherein said other encoder (A) decrements the value of the code stream therefor when a non-Qe event is encoded and (B) maintains the code stream value when a Qe event is encoded, the encoder of claim 9 further comprising:
means for maintaining the first code stream value when a Qe event is encoded and for incrementing the first code stream value when a Qe event is encoded.

11. In a binary arithmetic coding data compression system in which an augend A is reduced in value as successive decisions events are encoded and in which, when A drops in value to less than a prescribed minimum AMIN, A is renormalized to exceed AMIN, a method of adapting an estimated probability value Qe of one of the decision events as successive decision events are encoded cmprising the steps of:
selecting and storing in computer memory a plurality of permitted Qe values;
selecting and storing a value for AMIN;
depending on the outcome of a decision event, changing A to a value based on (i) only a current scaled value of Qe or (ii) a scaled current value of Qe and a current A;
renormalizing A and up-dating a current scaled Qe value to another scaled Qe value in a processor of the computer in response to A becoming less than AMIN;
wherein said Qe up-dating includes the steps of:
revising Qe to a higher scaled value when A is renormalized after a Qe event; and
revising Qe to a lower scaled value when A is renormalized after a non-Qe event;
wherein each Qe value approximately equal to AMIN/($2^m$) (where m is a positive integer) is characterized as a bad Qe value and wherein revising a given bad Qe value after a Qe renormalization includes the step of augmenting the given bad value to a higher value which, after a non-Qe renormalization, is reduced to a value other than the given bad Qe value.

12. The method of claim 11 wherein each decision is a binary decision, the method comprising the further steps of:
representing Qe as a positive value when the more probable binary event corresponds to a first type of binary decision outcome; and
representing Qe as a negative value when the more probable binary event corresponds to the second type of binary decision outcome.

13. In an arithmetic coding system, computer-implemented apparatus for adapting a decision event probability Qe based on successive decision event inputs, the apparatus comprising:
a plurality of selectable Qe value output lines;
a distinct q-index corresponding to each Qe value output;
circuit means, having a q-index as input, for generating a Qe value output in response to the q-index input;
wherein the density of q-indexes is proportionately greater at higher Qe value outputs and less at lower Qe value outputs relative to the distribution of Qe values in a power-of-two set of estimated probability values.

14. Apparatus as in claim 13 wherein said circuit means includes a gating circuit; and wherein each q-index includes input wires to said gating circuit having a distinct pattern of binary signals thereon; and wherein each Qe value output includes output wires from said gating circuit having a corresponding pattern of binary signals generated by the gating circuit in response to the q-index corresponding thereto being input.

15. In a binary arithmetic coding system in which each decision has a less probable event symbol LPS and a more probable event symbol MPS and in which an augend value is renormalized in response to at least some LPS events and at least some MPS events, computer apparatus for adapting an estimated probability Qe of one of the decision events based on successive decision event inputs, the apparatus comprising:

memory means for storing a plurality of selectable Qe values in a memory table;

means for indexing said stored Qe values in decreasing order of value, each Qe value having a corresponding index position in the order;

means for accessing one of the selectable Qe values; and table entry pointer means for moving from one index position to another in a first direction along the non-decreasing order in response to LPS renormalization and for moving from one index position to another in the opposite direction along the non-decreasing order to response to MPS renormalization;

wherein said table entry pointer means includes:

means for adjusting the table entry pointer means by a comparable number of index positions in said first direction for a predefined number $\alpha$ (where $\alpha$ is a positive integer) of LPS renormalizations than in said other direction for $\alpha$ MPS renormalizations, at higher probability index positions; and means for adjusting by more index positions in said first direction for a predefined number $\beta$ (where $\beta$ is a positive integer) of LPS renormalizations than in said other direction for $\beta$ MPS renormalizations, at lower probability index positions.

* * * * *

UNITED STATES PATENT AND TRADEMARK OFFICE
CERTIFICATE OF CORRECTION

PATENT NO. : 4,905,297

DATED : February 27, 1990

INVENTOR(S) : Langdon, Jr. et al.

It is certified that error appears in the above-identified patent and that said Letters Patent is hereby corrected as shown below:

Title page:

After "[22] Filed: Nov. 18, 1988" insert:

--Related U.S. Application Data
[63] Continuation of Ser. No. 06/907,714, Sept. 15, 1986, abandoned.--.

Signed and Sealed this

Sixteenth Day of April, 1991

Attest:

HARRY F. MANBECK, JR.

*Attesting Officer*

*Commissioner of Patents and Trademarks*